US008969936B2

(12) United States Patent
Lee et al.

(10) Patent No.: US 8,969,936 B2
(45) Date of Patent: Mar. 3, 2015

(54) SEMICONDUCTOR DEVICES HAVING INCREASED CONTACT AREAS BETWEEN CONTACTS AND ACTIVE REGIONS AND METHODS OF FABRICATING THE SAME

(71) Applicants: Wonchul Lee, Seongnam-si (KR); Eun A Kim, Seoul (KR); Ja Young Lee, Hwaseong-si (KR)

(72) Inventors: Wonchul Lee, Seongnam-si (KR); Eun A Kim, Seoul (KR); Ja Young Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/732,344

(22) Filed: Dec. 31, 2012

(65) Prior Publication Data
US 2013/0256828 A1  Oct. 3, 2013

(30) Foreign Application Priority Data

Mar. 30, 2012  (KR) .................. 10-2012-0033079

(51) Int. Cl.
*H01L 27/108* (2006.01)
*H01L 27/04* (2006.01)
*H01L 27/02* (2006.01)

(52) U.S. Cl.
CPC ............ *H01L 27/04* (2013.01); *H01L 27/0207* (2013.01); *H01L 27/10882* (2013.01); *H01L 27/10885* (2013.01); *H01L 27/10891* (2013.01)
USPC ............ 257/296; 257/E27.085; 257/E21.649; 257/E21.658

(58) Field of Classification Search
None
See application file for complete search history.

(56) References Cited

U.S. PATENT DOCUMENTS

| 7,777,265 | B2 | 8/2010 | Hong et al. | |
| 2010/0327346 | A1* | 12/2010 | Jeong et al. | 257/332 |
| 2011/0003459 | A1 | 1/2011 | Shin et al. | |
| 2012/0132971 | A1* | 5/2012 | Mikasa | 257/296 |

FOREIGN PATENT DOCUMENTS

| KR | 1020050089294 A | 9/2005 |
| KR | 1020090009392 A | 1/2009 |
| KR | 1020110003040 A | 1/2011 |
| KR | 1020110026757 A | 3/2011 |
| KR | 1020110029672 A | 3/2011 |
| KR | 1020110101678 A | 9/2011 |

* cited by examiner

*Primary Examiner* — William F Kraig
*Assistant Examiner* — Khaja Ahmad
(74) *Attorney, Agent, or Firm* — Renaissance IP Law Group LLP

(57) ABSTRACT

Provided are a semiconductor device and a method of fabricating the same. The semiconductor device may include a substrate including first and second junction regions, a word line buried in the substrate, a bit line provided over the word line to cross the word line, a first contact provided between the substrate and the bit line and electrically connected to the first junction region, and a second contact provided between the bit lines and electrically connected to the second junction region. An overlapping area of a lower portion of the second contact may be greater than an overlapping area of an upper portion of the second contact with respect to the second junction region.

34 Claims, 85 Drawing Sheets

US 8,969,936 B2

SEMICONDUCTOR DEVICES HAVING INCREASED CONTACT AREAS BETWEEN CONTACTS AND ACTIVE REGIONS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0033079, filed on Mar. 30, 2012, in the Korean Intellectual Property Office, the entire contents of which are hereby incorporated by reference.

BACKGROUND

Embodiments of the inventive concepts relate to a semiconductor device and a method of fabricating the same.

Semiconductor devices are regarded as important elements in the electronic industry because of their multifunctional, small and low-cost characteristics. Higher integration of semiconductor memory devices is required to satisfy consumer demands for superior performance and inexpensive prices. In the case of semiconductor memory devices, increased integration is especially desirable, because the degree of integration is an important factor in determining the price of the final product. However, the extremely expensive process equipment needed to increase an integration density sets a practical limitation on increasing integration for semiconductor memory devices. To overcome such a limitation, a variety of studies have been made on developing new semiconductor manufacturing technologies for increasing integration density of the semiconductor memory device.

SUMMARY

In one embodiment, a semiconductor device includes a device isolation layer formed in a semiconductor substrate. The device isolation layer defines active regions each including a first junction region and a second junction region. The device additionally includes at least two adjacent word lines buried in the semiconductor substrate, the at least two adjacent word lines each having a word line capping layer formed thereon and extending above the active regions; a plurality of bit lines extending across the at least two adjacent word lines; first contacts electrically interconnecting the first junction region and a corresponding one of the plurality of bit lines; second contacts, at least one of which is electrically coupled to the corresponding second junction region, a separation wall extending between the at least two adjacent word line capping layers, the separation wall located between adjacent two of the second contacts. A portion of at least one of the second contacts may be disposed between sidewalls of adjacent ones of word line capping layers.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 15A are plan views exemplarily illustrating a method of fabricating a semiconductor device according to example embodiments of the inventive concept.

FIGS. 1B through 15B are cross-sectional views taken along lines A-A of FIGS. 1A through 15A, respectively.

FIGS. 1C through 15C are cross-sectional views taken along lines B-B of FIGS. 1A through 15A, respectively.

FIGS. 16A through 20A are plan views exemplarily illustrating a method of fabricating a semiconductor device according to other example embodiments of the inventive concept.

FIGS. 16B through 20B are cross-sectional views taken along lines A-A of FIGS. 16A through 20A, respectively.

FIGS. 16C through 20C are cross-sectional views taken along lines B-B of FIGS. 16A through 20A, respectively.

FIGS. 30A through 39A illustrate a method of fabricating a semiconductor device according to still further example embodiments of the inventive concept and are cross-sectional views taken along the line A-A of FIG. 15A.

FIGS. 30B through 39B are cross-sectional views taken along the line B-B of FIG. 15A.

Figure 1A:
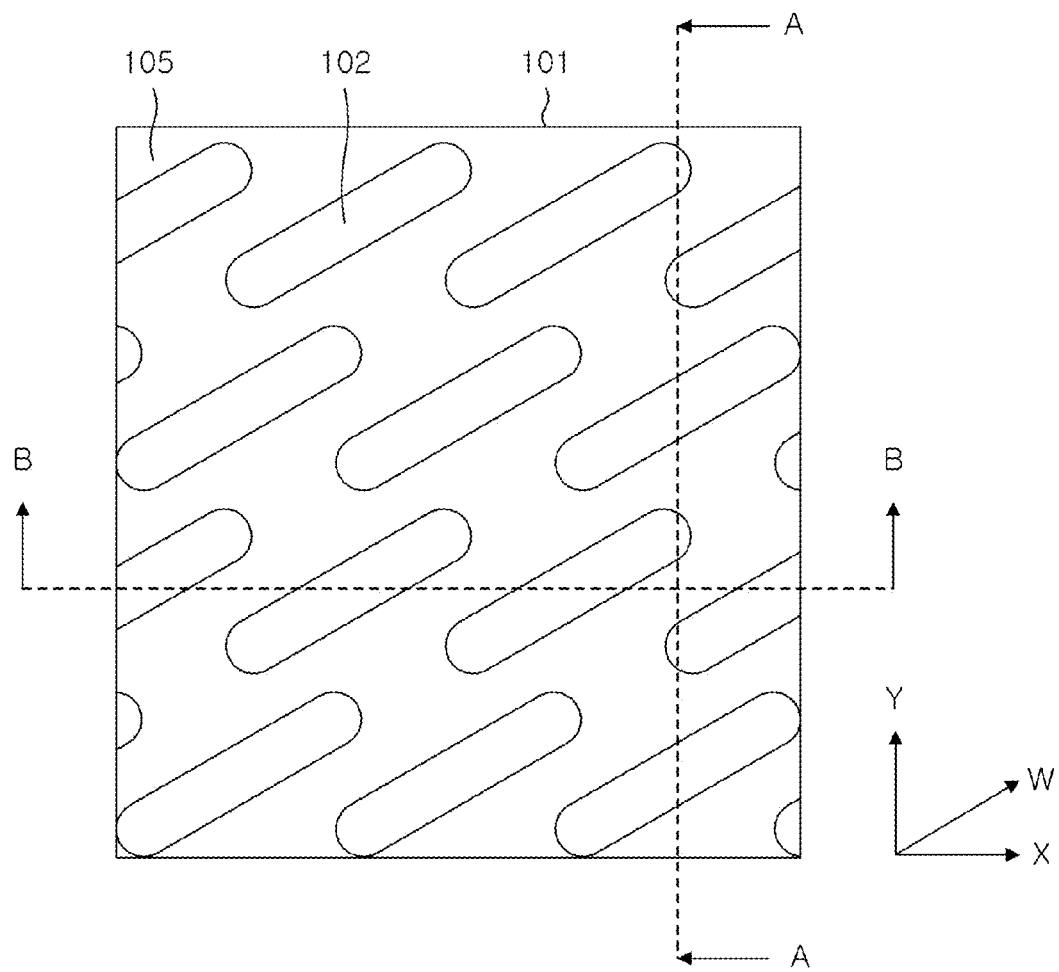

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Example Embodiments]

FIGS. 1A through 15A are plan views exemplarily illustrating a method of fabricating a semiconductor device according to example embodiments of the inventive concept. FIGS. 1B through 15B are cross-sectional views taken along lines A-A of FIGS. 1A through 15A, respectively. FIGS. 1C through 15C are cross-sectional views taken along lines B-B of FIGS. 1A through 15A, respectively. FIG. 5D is a cross-sectional view taken along line C-C of FIG. 5A. FIG. 6D is a cross-sectional view taken along line C-C of FIG. 6A.

Figure 1B:
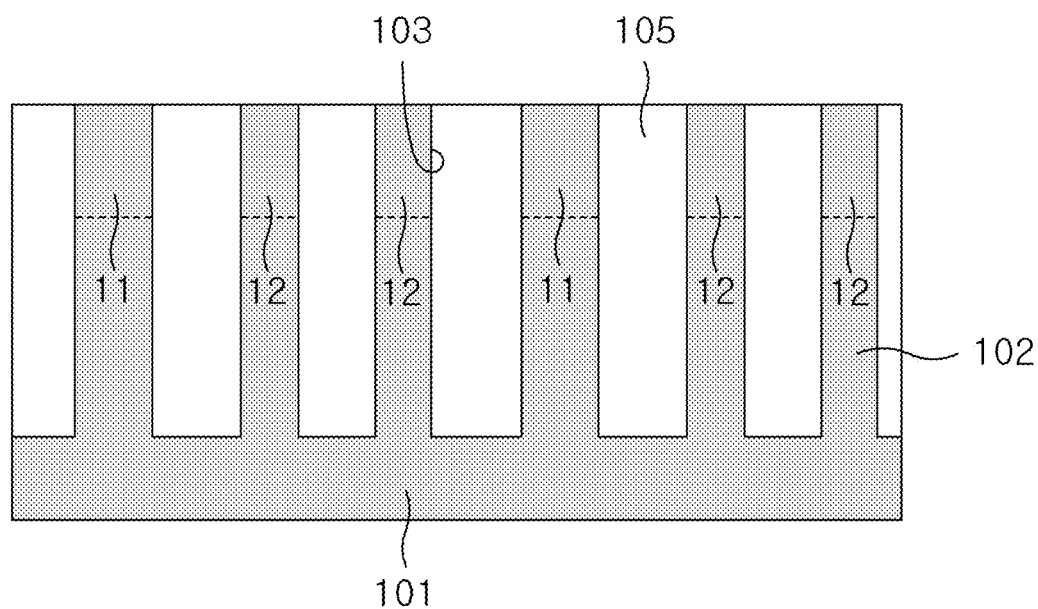
Figure 1C:
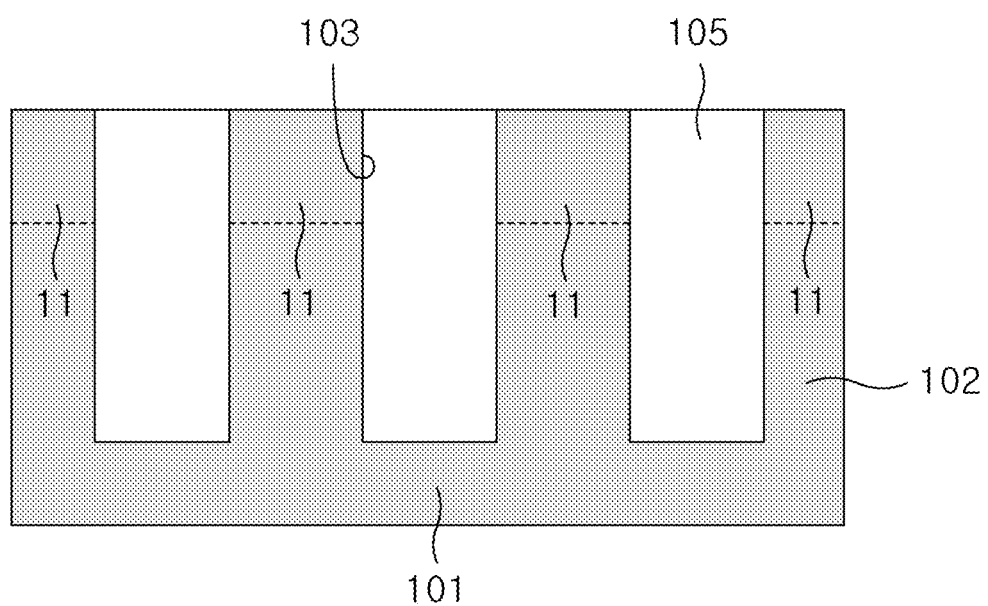

Referring to FIGS. 1A, 1B and 1C, active regions 102 may be defined in a substrate 101. For example, the active regions 102 may be formed by etching the substrate 101 (e.g., a silicon wafer) to form a trench 103, and then, filling the trench 103 with an insulating material, such as oxides (e.g., of $SiO_x$) or nitrides (e.g., $SiN_x$ or SiON), to form a device isolation layer 105. The device isolation layer 105 may be formed in such a way that each active region 102 may have an elongated island shape. For example, the active region 102 may elongate in a diagonal direction (e.g., W-direction). Each of the active regions 102 may have a substantially vertical pillar shape. Impurities may be injected into the substrate 101 to form first and second junction regions 11 and 12 as shown in FIGS. 1B-1C. The first and second junction regions 11 and 12 may be formed in upper portions of the active regions 102 in a self-aligned manner. Each of the active regions 102 may include the first junction region 11 at a central region thereof and second junction regions 12 at end regions thereof. The substrate 101 may have a different conductivity type from the first and second junction regions 11 and 12. For example, the substrate 101 may be a p-type and the first and second junction regions 11 and 12 may be an n-type, or vice versa.

Figure 2A:
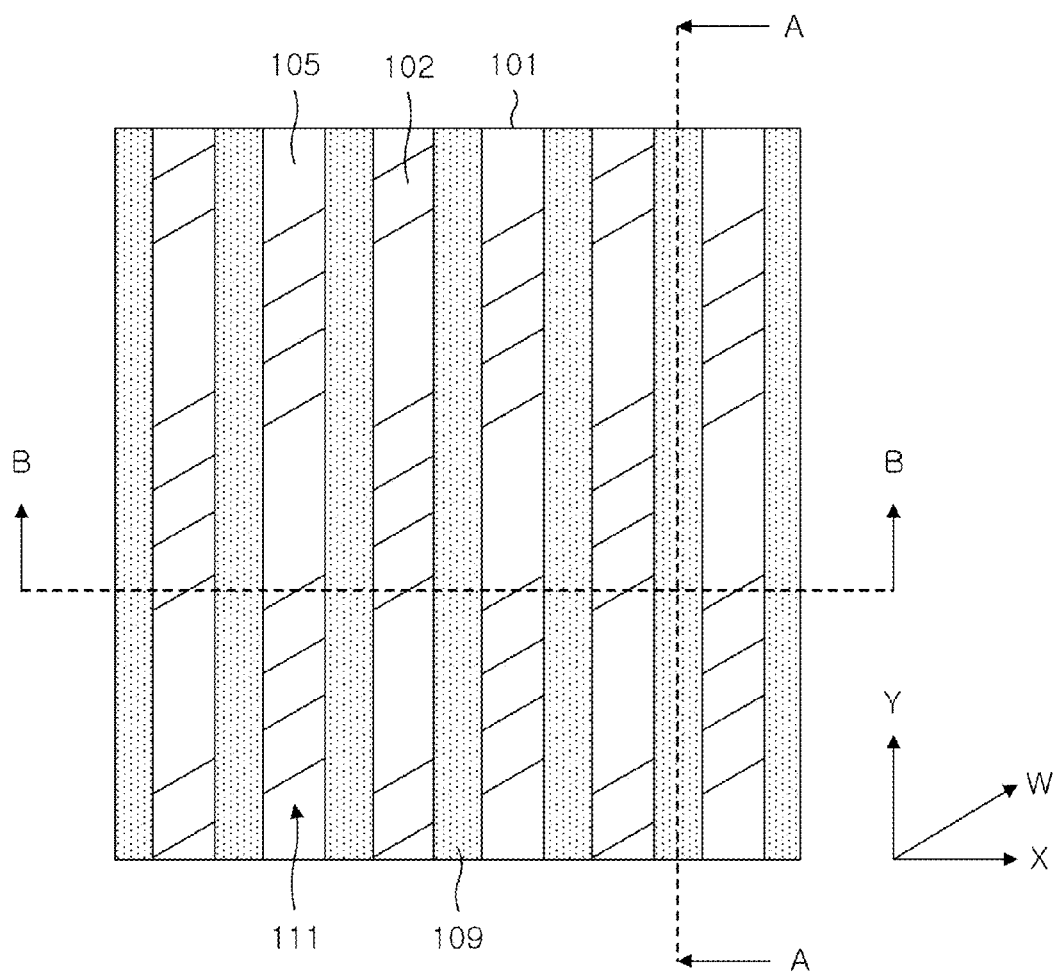
Figure 2B:
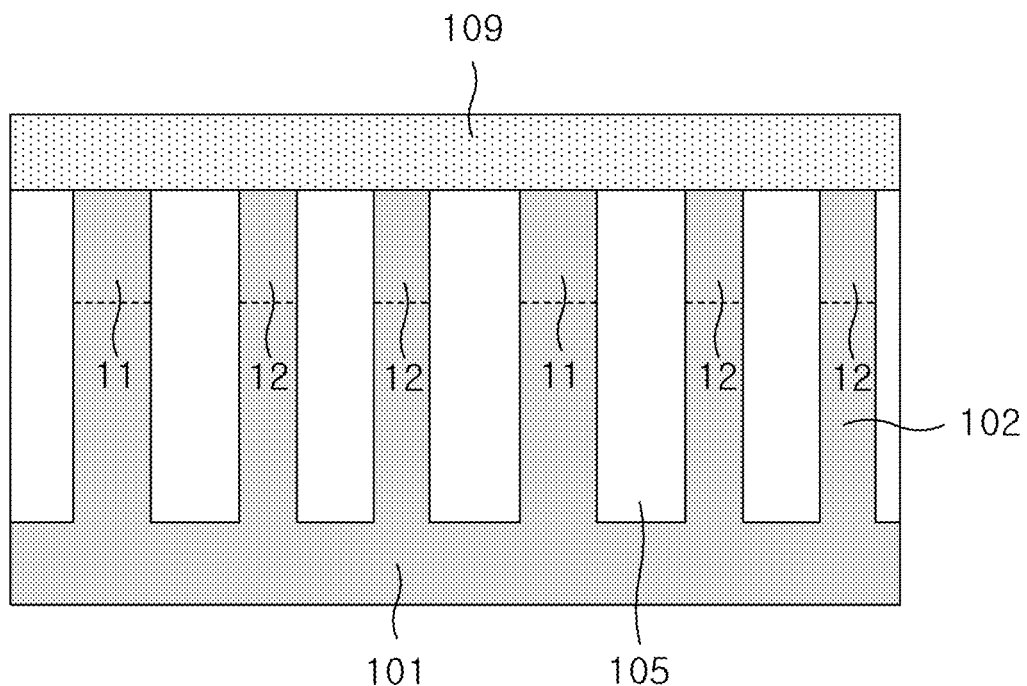
Figure 2C:
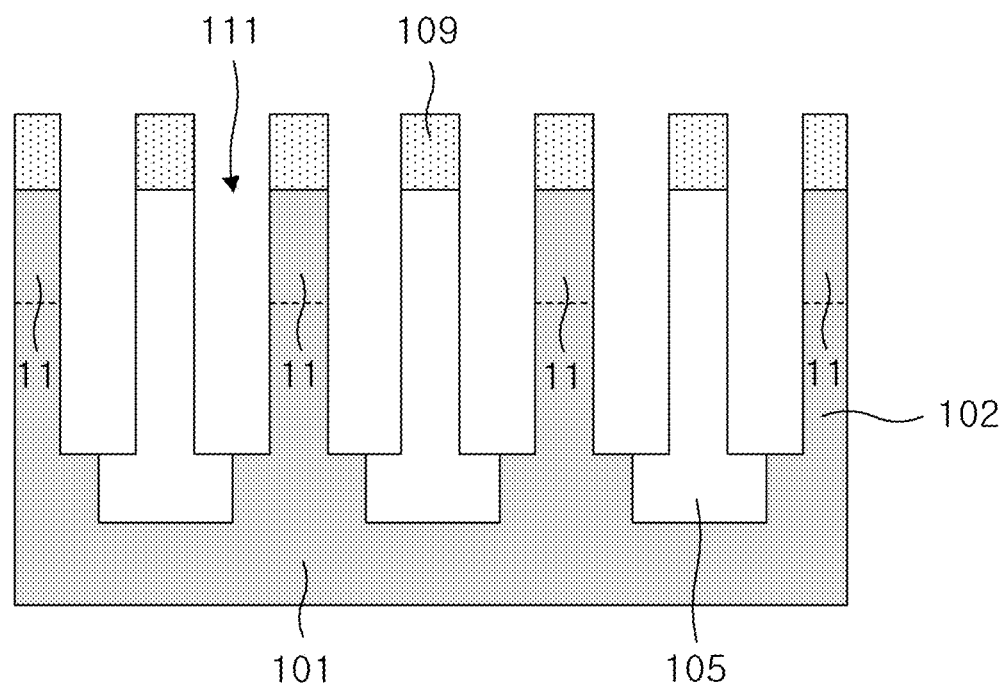

Referring to FIGS. 2A, 2B and 2C, mask patterns 109 may be formed on the substrate 101 to cross the active regions 102 and the device isolation layer 105. The mask patterns 109 may be substantially parallel to a first horizontal direction (e.g., Y-direction) and be spaced apart from each other in a second horizontal direction (e.g., X-direction). The mask patterns 109 may be formed by depositing and patterning a dielectric material layer such as a silicon oxide layer or a silicon nitride layer. In example embodiments, the mask pattern 109 may have a height of about 50-100 Å, but example embodiments of the inventive concepts may not be limited thereto. The active region 102 and the device isolation layer 105 may be patterned by using the mask pattern 109 as an etch mask to form first grooves 111. The first grooves 111 may extend along the Y-direction parallel to the mask patterns 109. Adjacent ones of the first grooves 111 may be spaced apart from each other in the X-direction. The first grooves 111 may be formed to have a bottom surface higher than that of the device isolation layer 105. The first grooves 111 may be formed using a timed etch process. The X- and Y-directions may be substantially orthogonal to each other, and the W-direction may be not parallel to both of the X- and Y-directions.

Figure 3A:
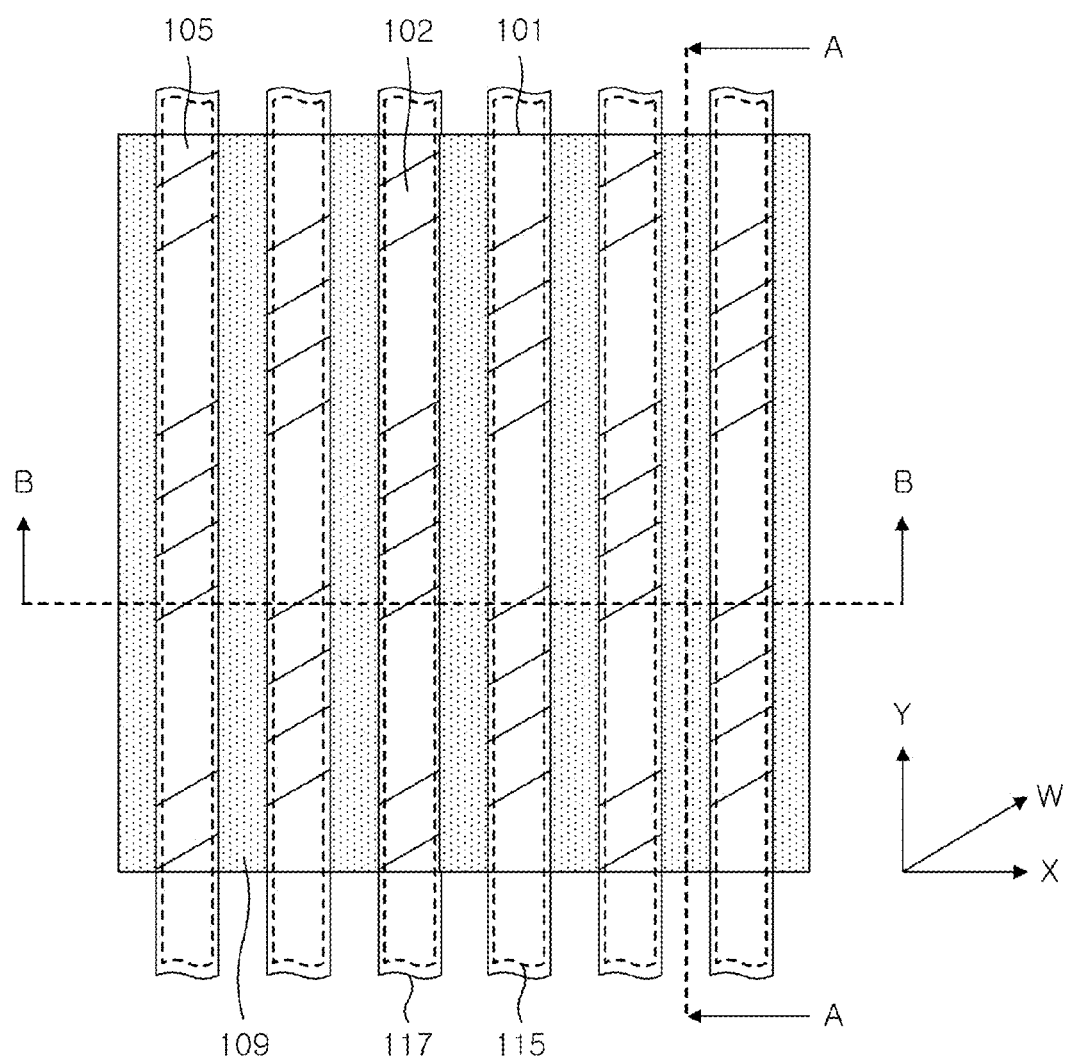
Figure 3B:
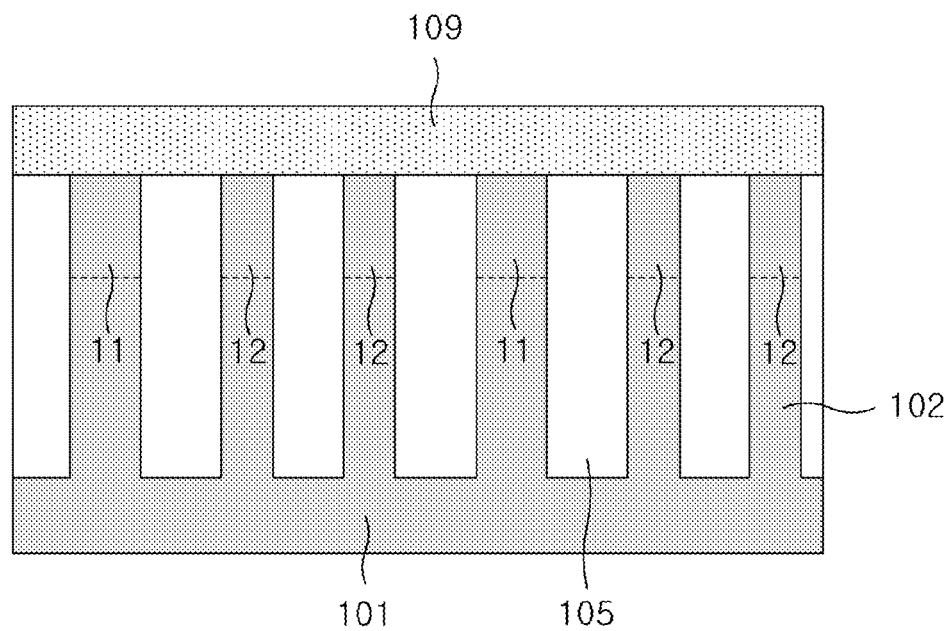
Figure 3C:
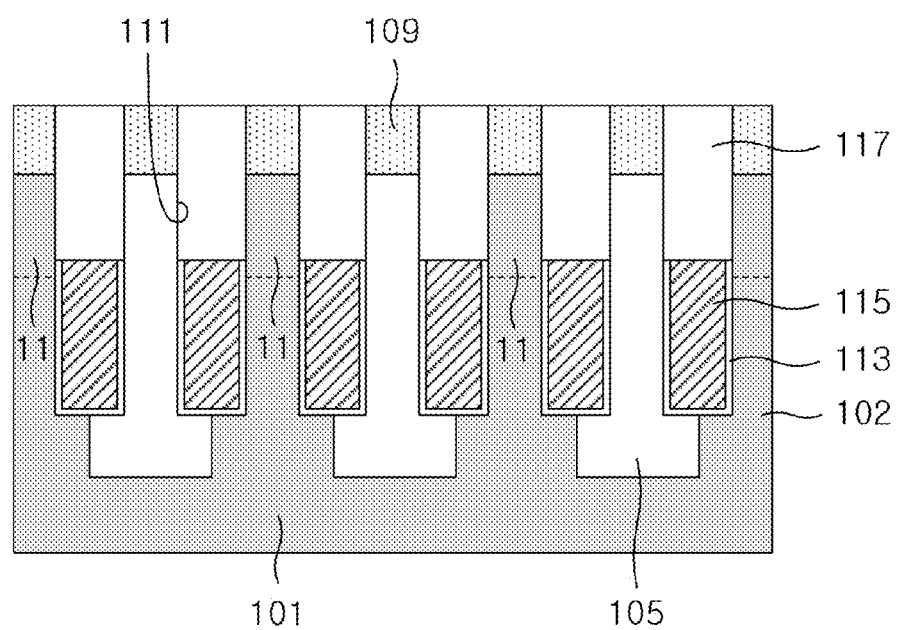

Referring to FIGS. 3A, 3B and 3C, word lines 115 may be formed in the first grooves 111 to extend along the Y-direction. In example embodiments, the word lines 115 may be formed by forming a gate insulating layer 113 on the active regions 102 exposed by the first grooves 111, forming a conductive layer to fill the first grooves 111 provided with the gate insulating layer 113, and then recessing or planarizing the conductive layer to form gate electrodes serving as the word lines 115. The gate insulating layer 113 may be formed by thermally oxidizing an exposed surface of the active region 102 or depositing a dielectric layer such as a silicon oxide layer or a high-k dielectric layer. The gate insulating layer 113 may be formed to have a shape covering bottom and side surfaces of the word line 115. The word lines 115 may be formed of, for example, polysilicon, metal, metal silicide, and so forth. Adjacent ones of the word lines 115 may be spaced apart from each other in the X-direction. A word line capping layer 117 may be formed on the word line 115 to fill remaining portions of the first grooves 111. Since the word line 115 is formed in the first groove 111, a channel region of a transistor may have a bent or non-linear structure buried in the active region 102. Due to the bent structure, a channel length according to example embodiments of the inventive concept can be increased compared to that of a linear channel region, and thus, it is possible to suppress a short channel effect. The word line capping layer 117 may be formed in a self-aligned manner by depositing and planarizing an insulating material (e.g., a silicon nitride layer). The word line capping layer 117 may protrude upward from a top surface of the active region 102 and have a top surface substantially coplanar with that of the mask pattern 109.

Figure 4A:
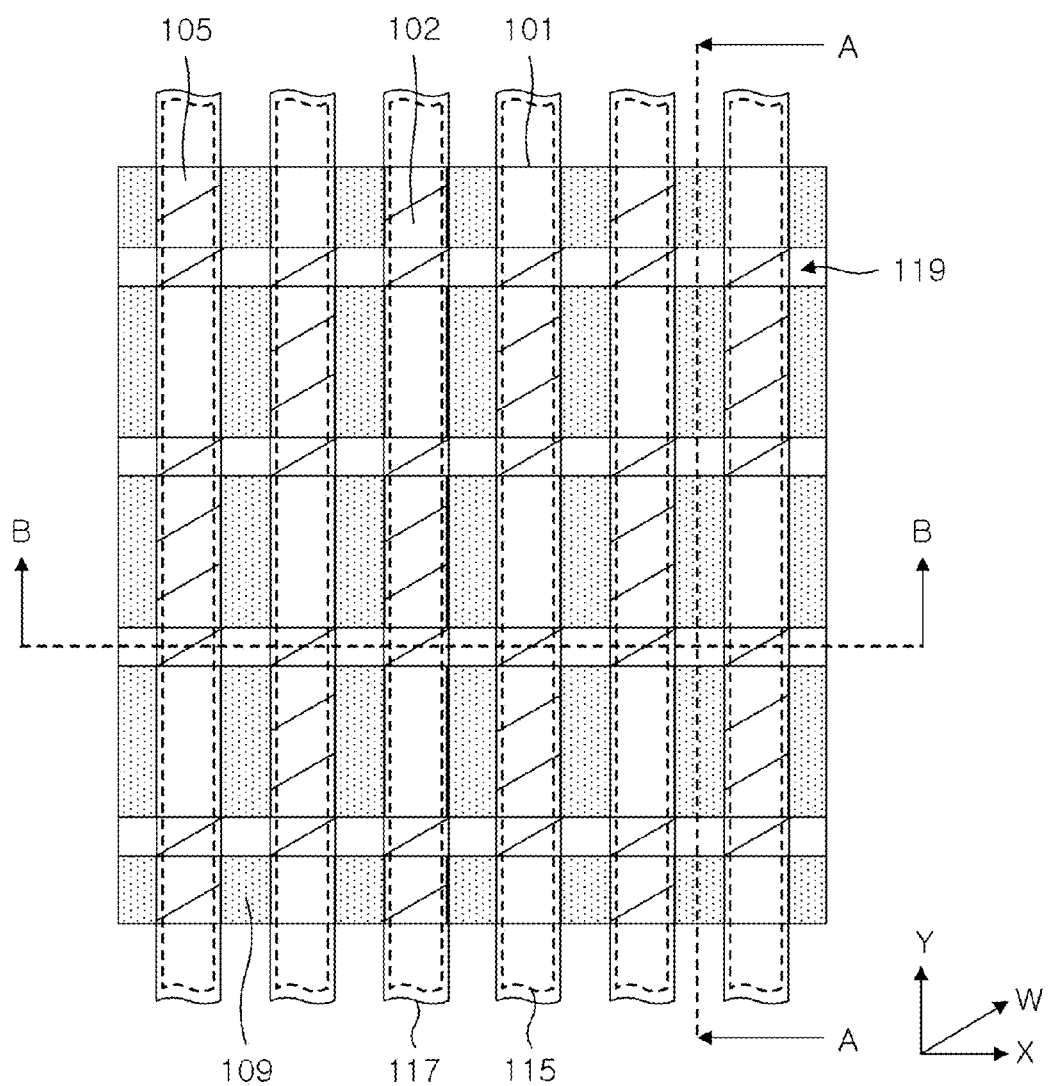
Figure 4B:
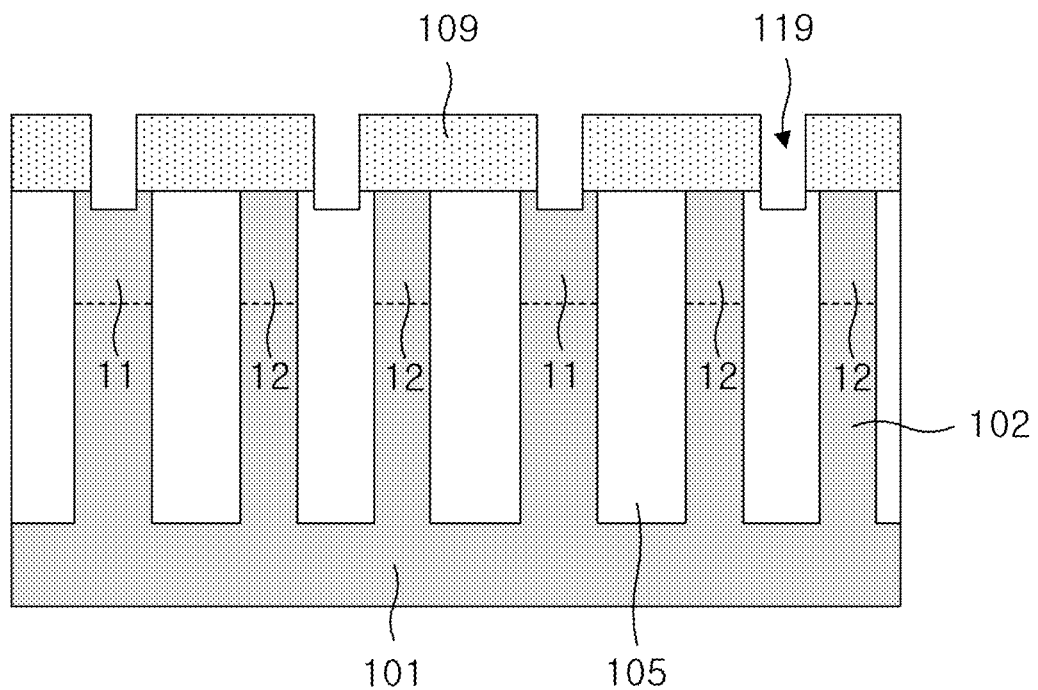
Figure 4C:
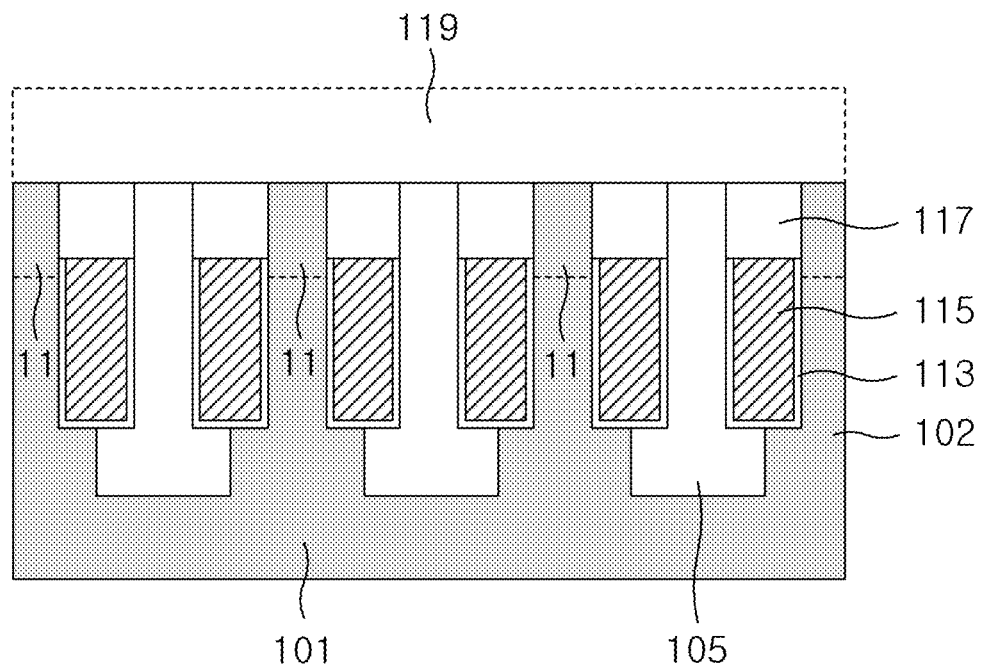

Referring to FIGS. 4A, 4B and 4C, second grooves 119 may be formed to be substantially orthogonal to a longitudinal direction of the word lines 115. For example, the second grooves 119 may be formed by patterning the mask patterns 109 and the word line capping layer 117 along the X-direction using another mask pattern (not illustrated). Adjacent ones of the second grooves 119 may be spaced apart from each other in the Y-direction. Due to the formation of the second grooves 119, not only the mask patterns 109 extending along the Y-direction, but also upper portions 117a (FIG. 5D) of the word line capping layer 117 protruding over the active region 102 may be separated into a plurality of portions. The second groove 119 may be formed to expose the first junction region 11 of the active region 102. During the formation of the second groove 119, the device isolation layer 105, the active region 102, and the word line capping layer 117 may be over-etched. However, the word line 115 may not be exposed by the second groove 119.

Figure 5A:
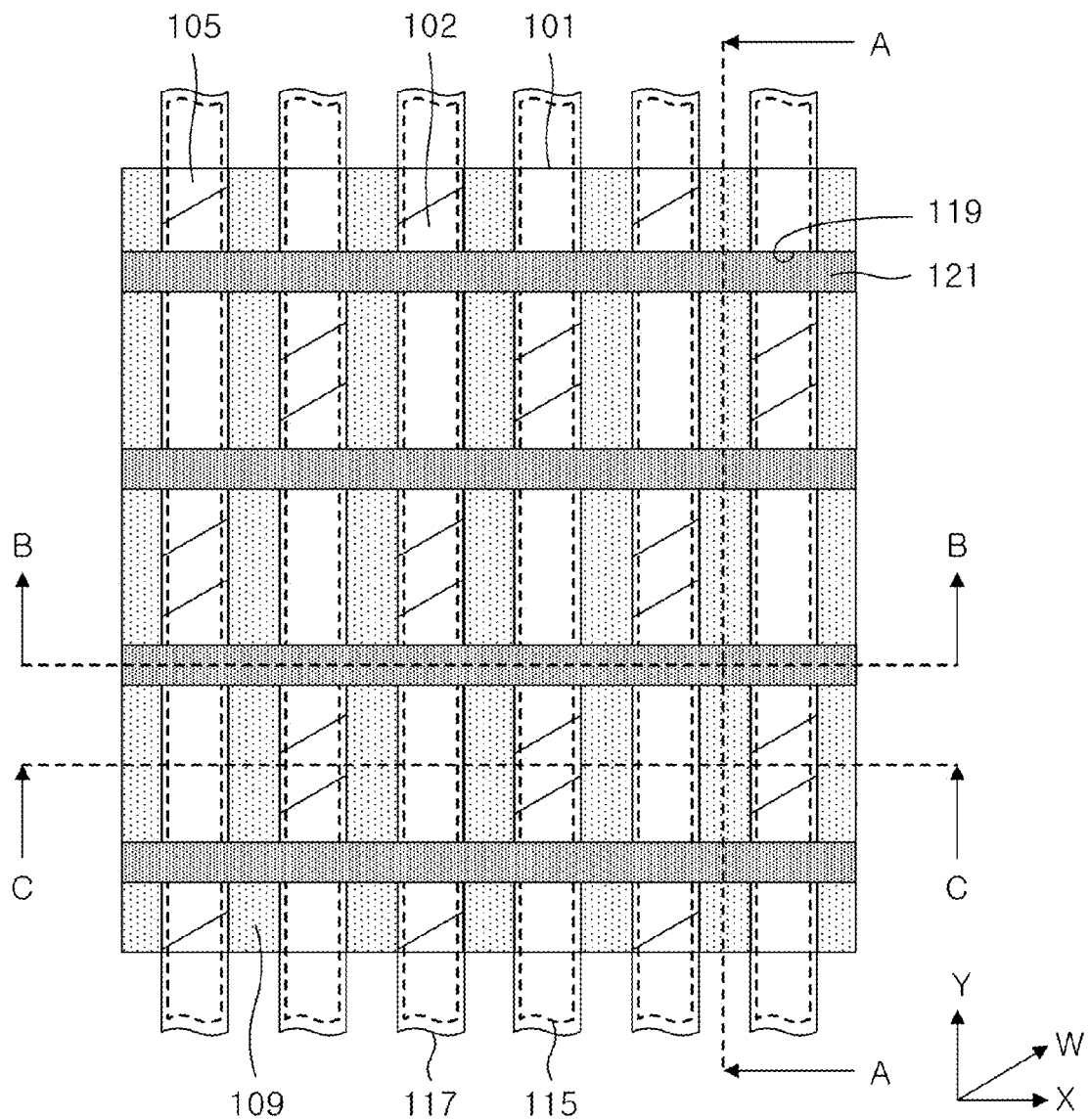
Figure 5B:
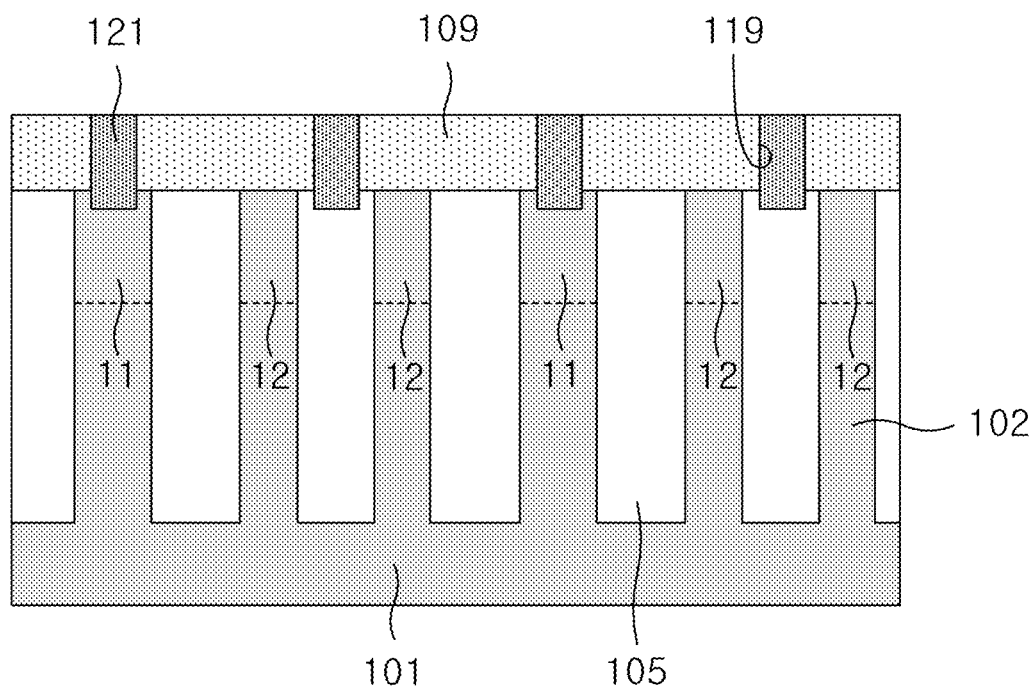
Figure 5C:
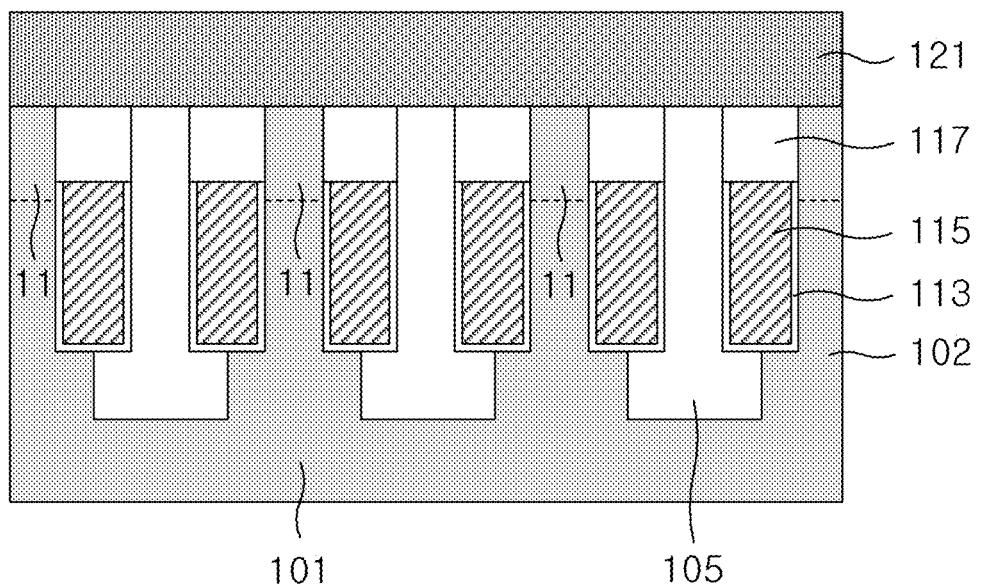
Figure 5D:
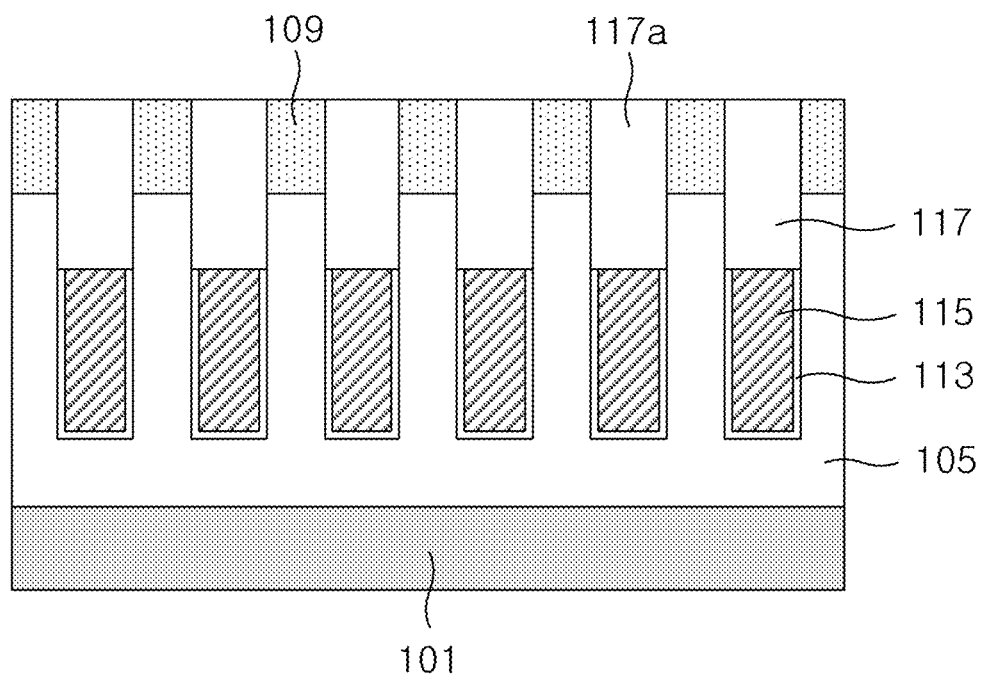
FIG. 5D is a cross-sectional view taken along a line C-C of FIG. 5A.

Referring to FIGS. 5A, 5B, 5C and 5D, one or more separation walls or fences 121 may be formed to fill the second grooves 119. In example embodiments, the one or more separation walls or fences 121 may be formed by depositing an insulating material (e.g., a silicon nitride layer, silicon oxynitride layer or a silicon oxide layer) and planarizing the insulating material, and thus, the one or more separation walls or fences 121 may be self-aligned with the mask patterns 109. For example, the one or more separation walls or fences 121 may be formed of an insulating material (e.g., silicon nitride), which is equal or similar to a material that forms the word line capping layer 117. The one or more separation walls or fences 121 may be shaped like a wall protruding from the top surface of the active region 102 and/or the device isolation layer 105, and extending along the second groove 119 (i.e., along the X-direction) with a height of about 50-1000 Å. Adjacent ones of the one or more separation walls or fences 121 may be spaced apart from each other in the Y-direction. As described above, the device isolation layer 105 and the active region 102 may be over-etched during the formation of the second grooves 119. In this case, the one or more separation walls or fences 121 may have a portion inserted into the device isolation layer 105 and the active region 102. A top surface of the one or more separation walls or fences 121 may be substantially coplanar with the top surfaces of the mask pattern 109 and the word line capping layer 117. Since the one or more separation walls or fences 121 may be formed to cross the upper portions 117a (FIG. 5D) of the word line capping layers 117, the one or more separation walls or fences 121 and the word line capping layers 117 may constitute patterns arranged in a form of a lattice on the substrate 101 as shown in FIG. 5A.

Figure 6A:
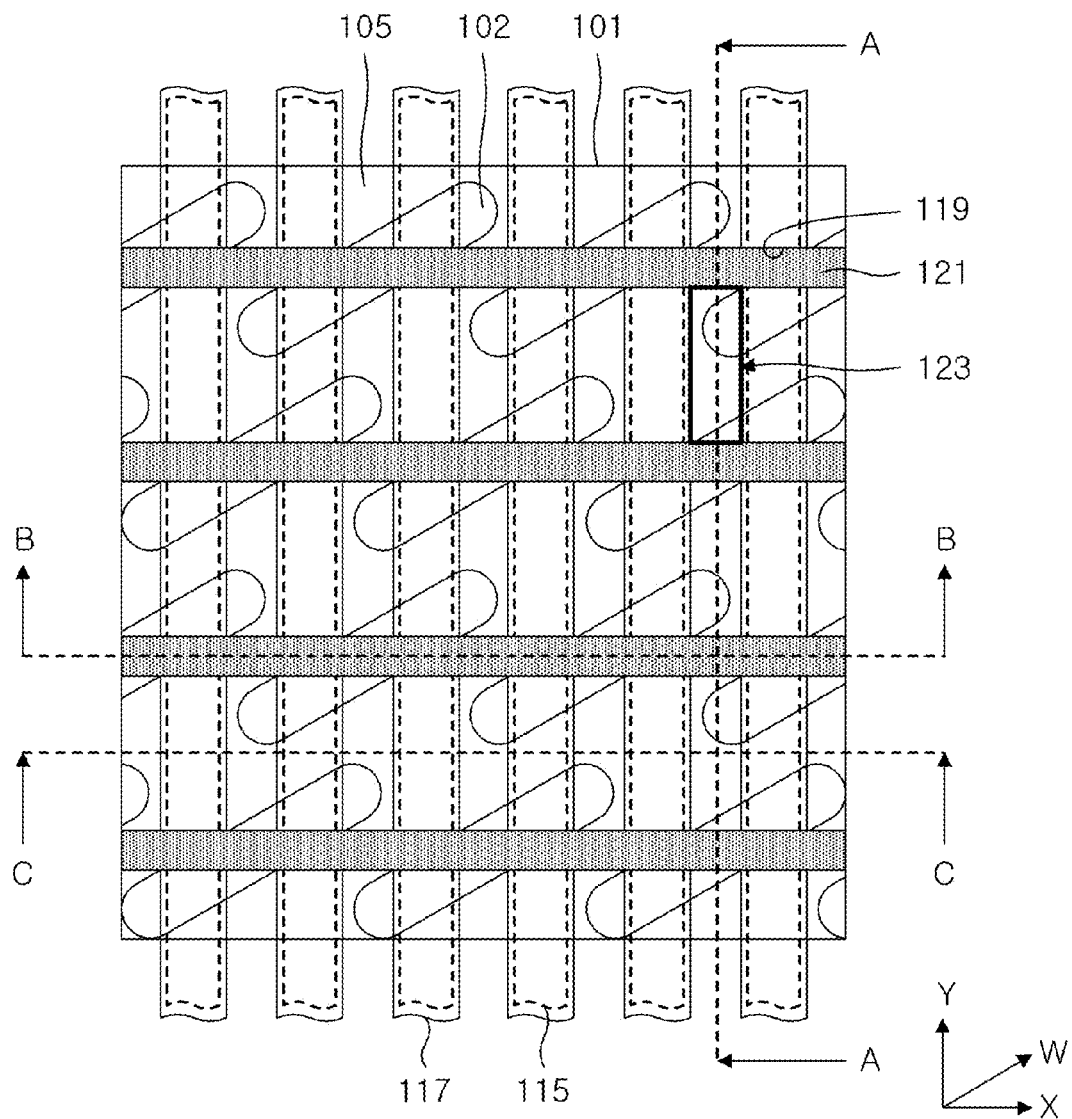
Figure 6B:
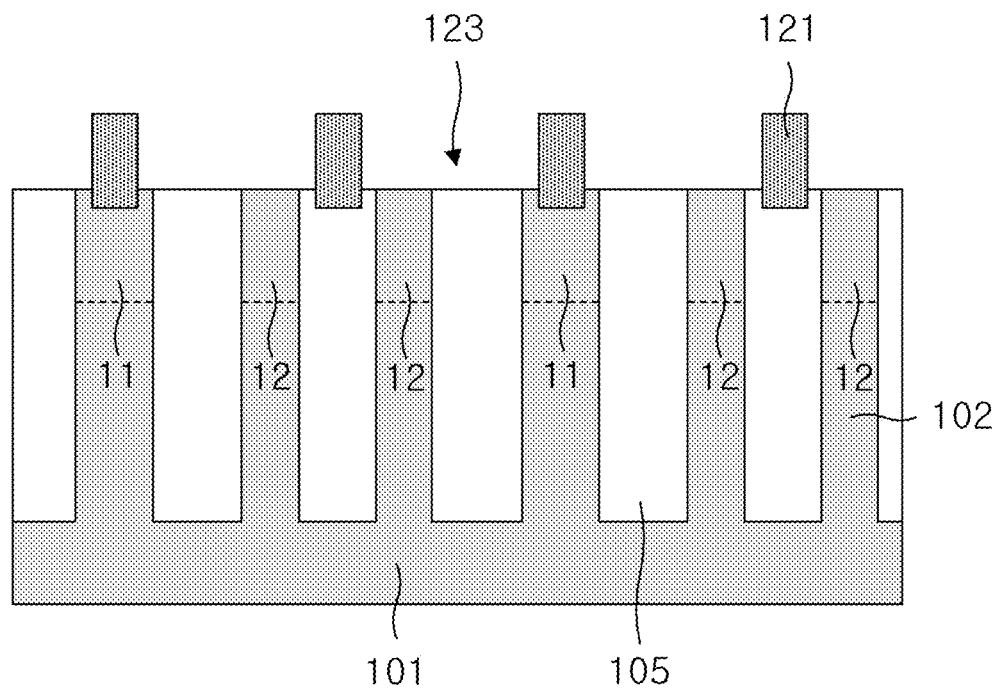
Figure 6C:
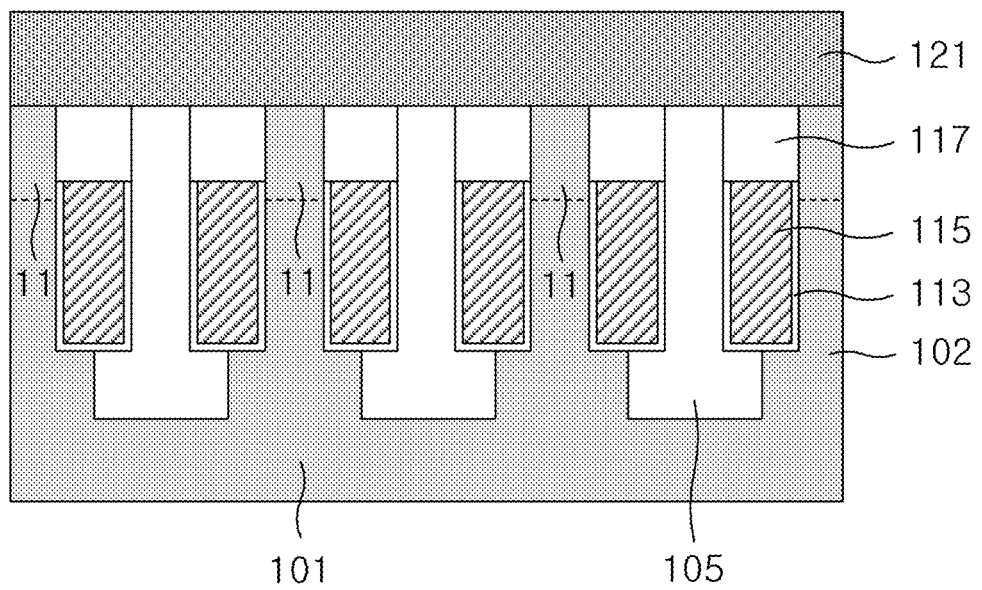
Figure 6D:
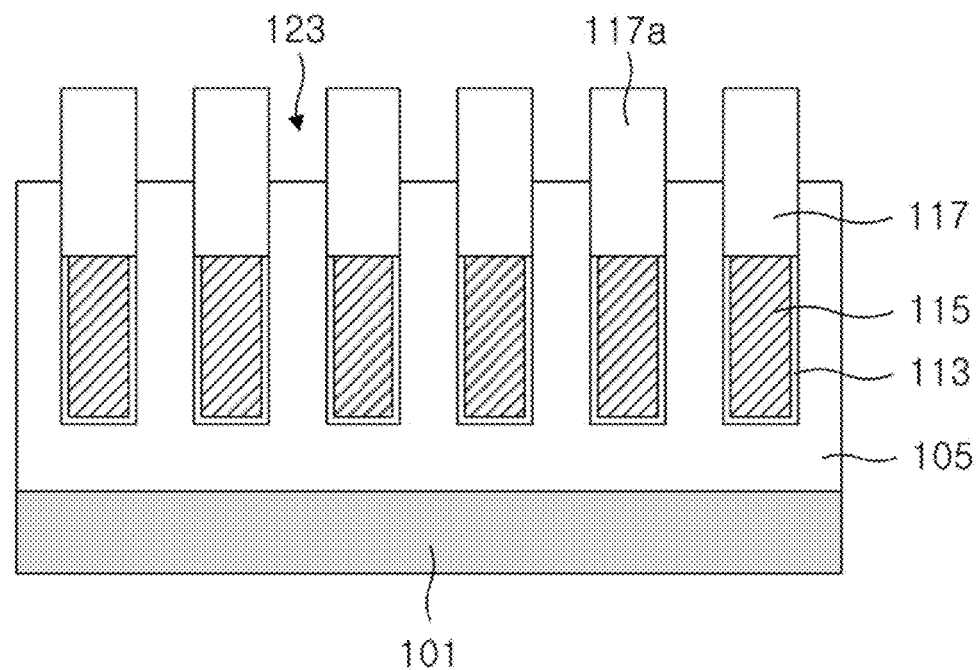
FIG. 6D is a cross-sectional view taken along a line C-C of FIG. 6A.
Figure 6E:
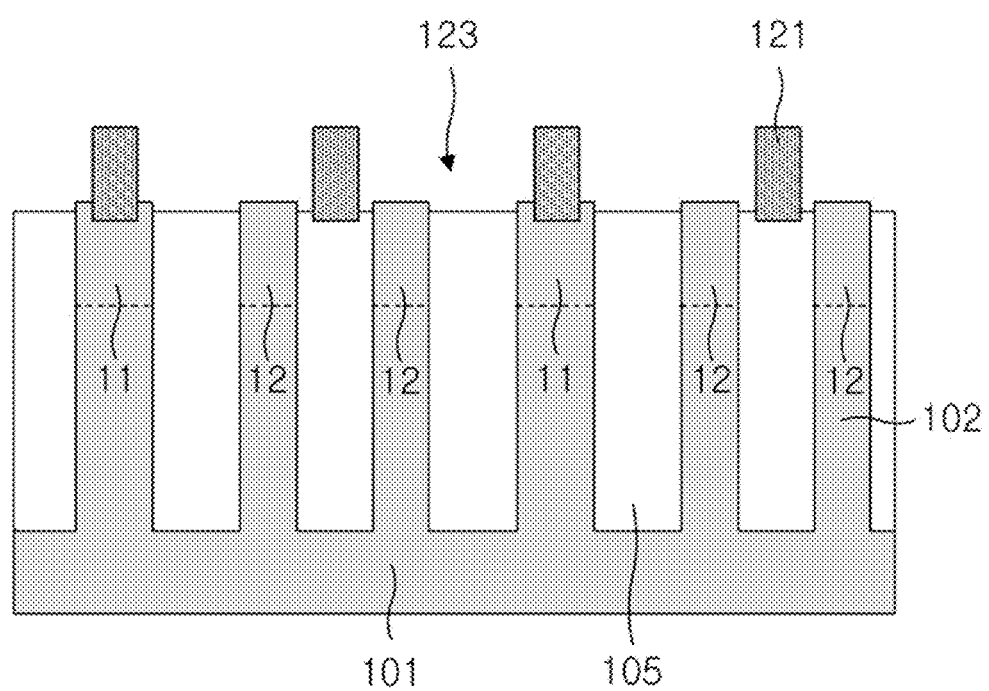
FIG. 6E is a cross-sectional view taken along a line C-C of FIG. 6A according to another embodiment.

Referring to FIGS. 6A, 6B, 6C and 6D, the mask patterns 109 may be removed to form lattice regions 123 confined by the word line capping layer 117 and the one or more separation walls or fences 121. The lattice regions 123 may expose portions of the device isolation layer 105 and the active region 102. The lattice regions 123 may expose the second junction region 12 of the active region 102 and a portion of the first junction region 11 of the active region 102 adjacent thereto and the device isolation layer 105. In some embodiments, a top surface of the device isolation layer 105 may be substantially planar with a top surface of the second junction region 12. In another embodiment, the top surface of the device isolation layer 105 may be located lower than the top surface of the second junction region 12 as shown in FIG. 6E. For example, using an etching process such as a wet etching process, the upper portion of the device isolation layer 5 may be partially etched such that the device isolation layer 5 may have a top surface lower than the top surface of the substrate 101 or first/second junction regions 11, 12. Although not illustrated, in this case, a portion of the storage node contact to be formed thereon may extend below the top surface of the second junction region 12 and a bottom surface of a storage node contact hole to be formed later may have a step.

Figure 7A:
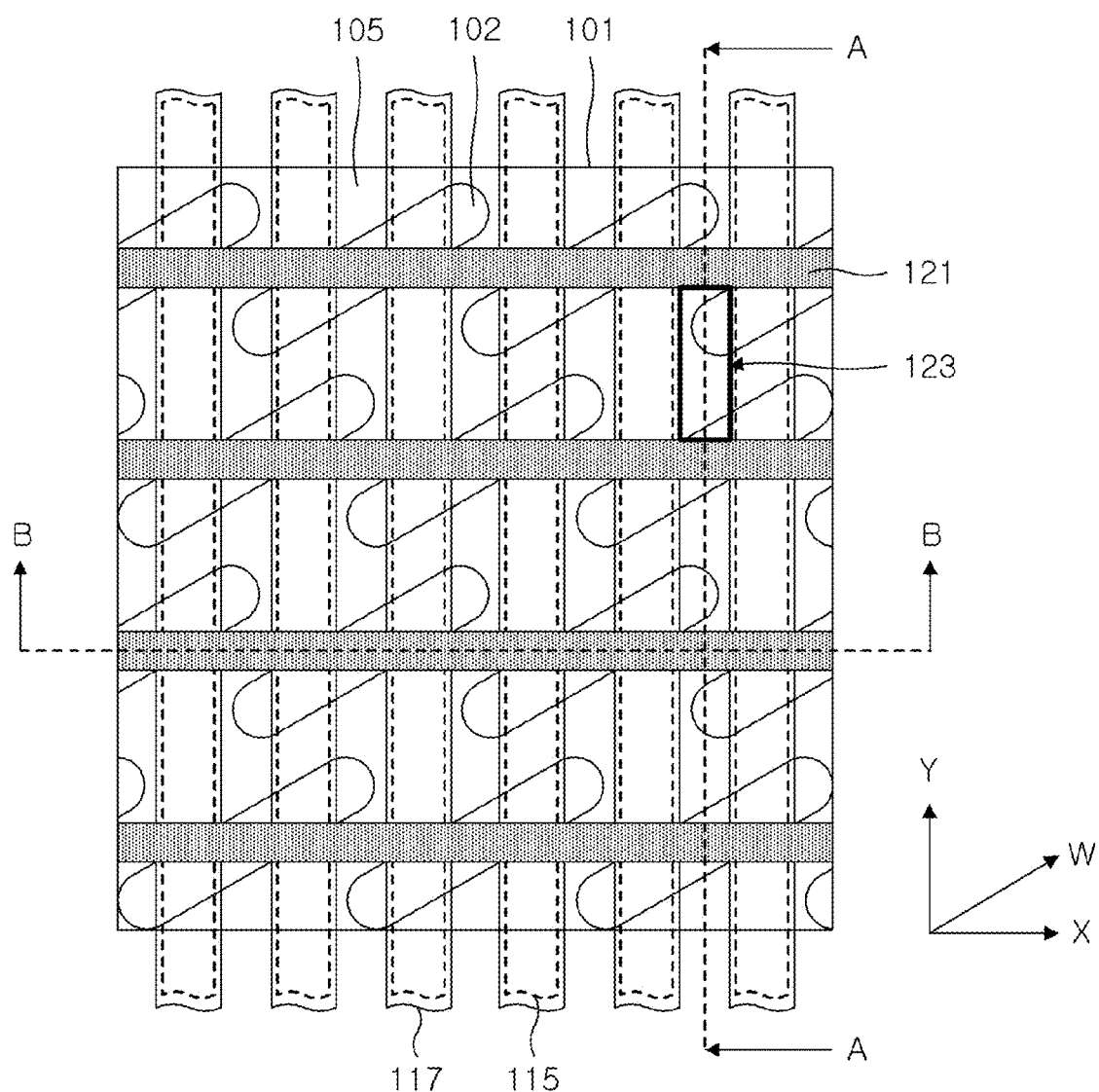
Figure 7B:
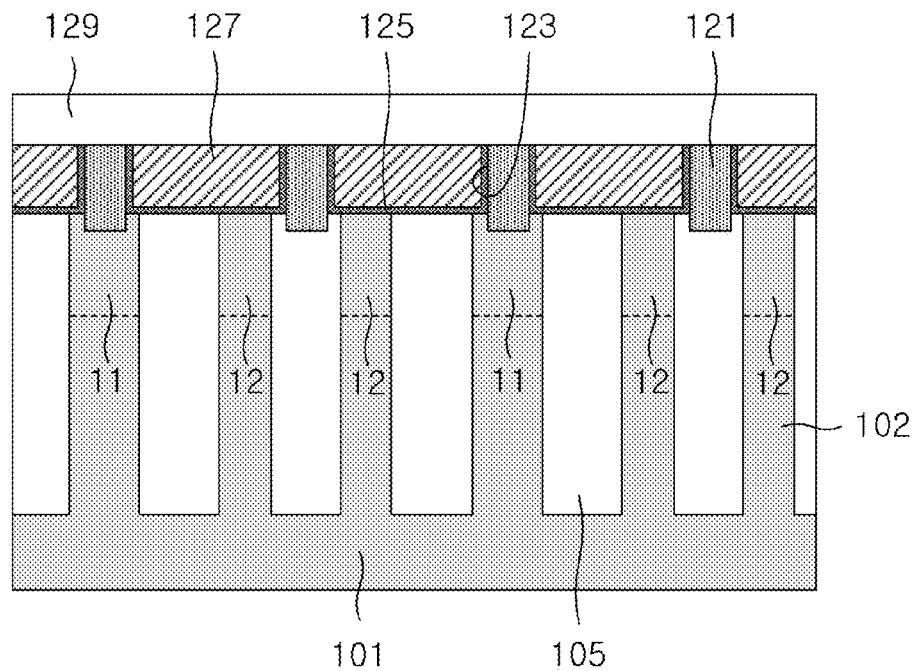
Figure 7C:
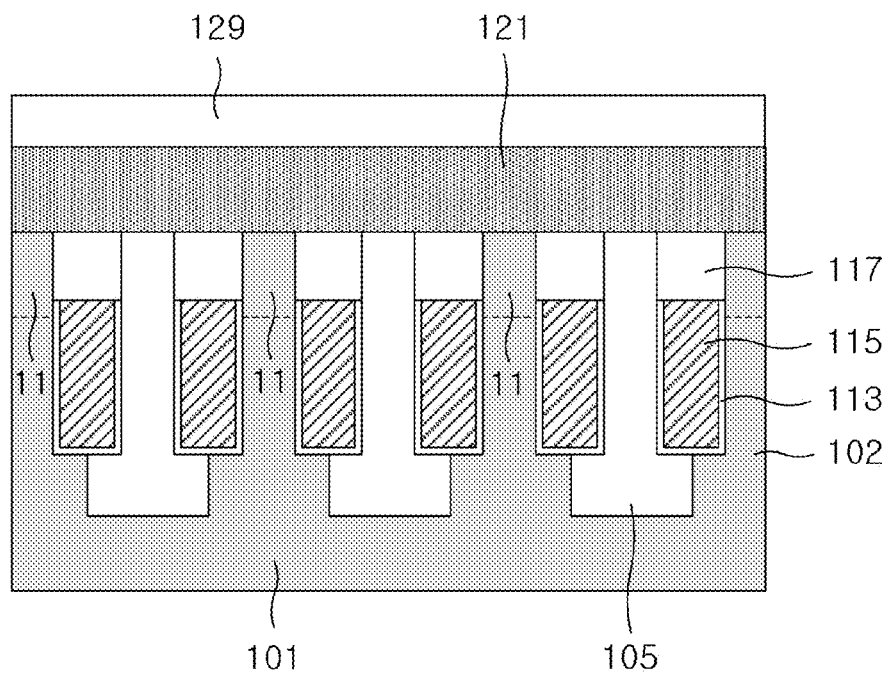

Referring to FIGS. 7A, 7B and 7C, an etch stop layer 125 and a sacrificial layer 127 may be formed in the lattice region 123. The etch stop layer 125 may be formed of an insulating material having an etch selectivity with respect to the device isolation layer 105 and/or the one or more separation walls or fence 121 and/or the capping layer 117. The insulating material may be, for example, a silicon oxide layer and/or a silicon nitride layer. In example embodiments, the etch stop layer 125 may be formed by depositing a silicon oxide layer or other suitable materials having an etch selectivity with respect to the sacrificial layer 127 or performing a thermal oxidation process. The etch stop layer 125 may be formed to have a thickness of about 5-100 Å. The sacrificial layer 127 may be formed of a material having etch selectivity with respect to the etch stop layer 125. In example embodiments, the sacrificial layer 127 may be formed by depositing and planarizing a conductive material (e.g., doped or undoped polysilicon, silicon-germanium, tungsten titanium nitride, and/or metals). In other embodiments, the sacrificial layer 127 may be formed by depositing and planarizing an insulating material (e.g., silicon oxide or silicon nitride). The sacrificial layer 127 may be formed of a material (e.g., oxide), of which etch rate is different from (e.g., higher than) those of the etch stop layer 125, the one or more separation walls or fences 121 and the capping layer 117. A chemical mechanical polishing (CMP) or etch-back process may be performed to planarize the sacrificial layer 127. After the planarizing of the sacrificial layer 127, a first interlayer insulating layer 129 may be formed over the resulting structure by depositing a silicon oxide layer or a silicon nitride layer. Since the lattice region 123 may expose a portion of the first junction region 11 of the active region 102 and the second junction region 12 of the active region 102, the sacrificial layer 127 and the etch stop layer 125 may be overlapped with the second junction region 12 and a portion of the first junction region 11.

Figure 8A:
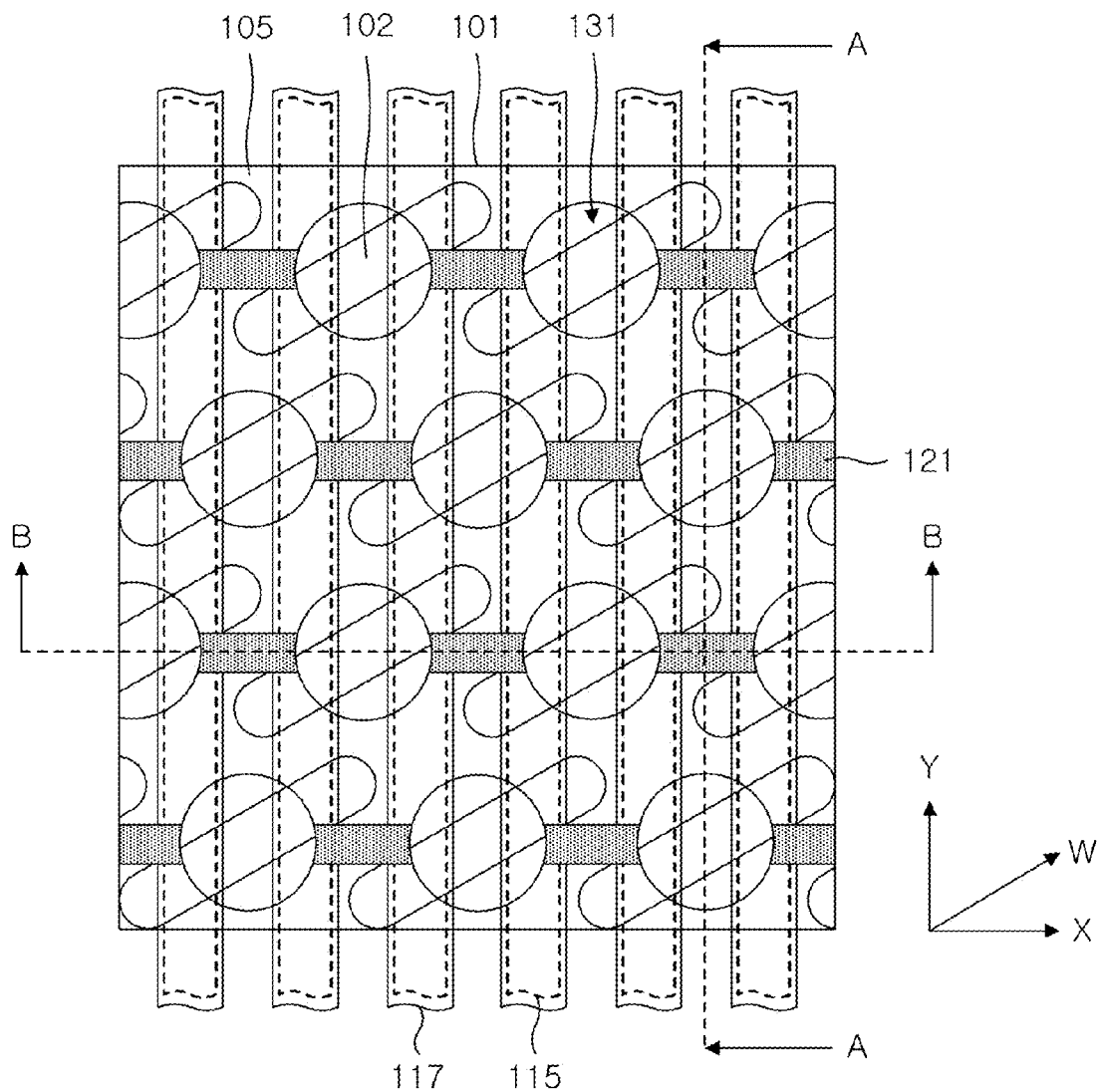
Figure 8B:
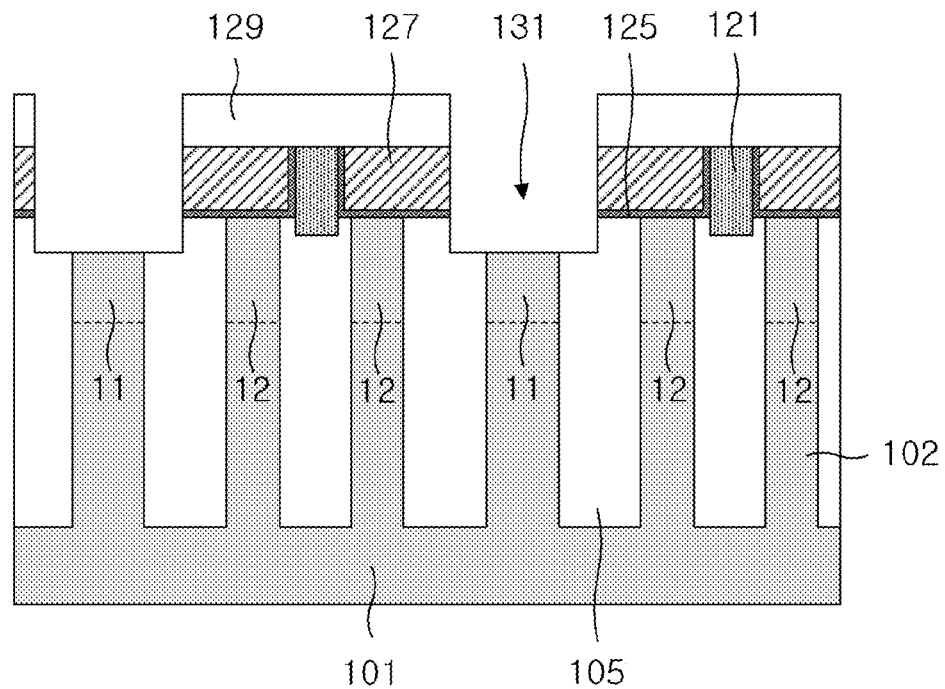
Figure 8C:
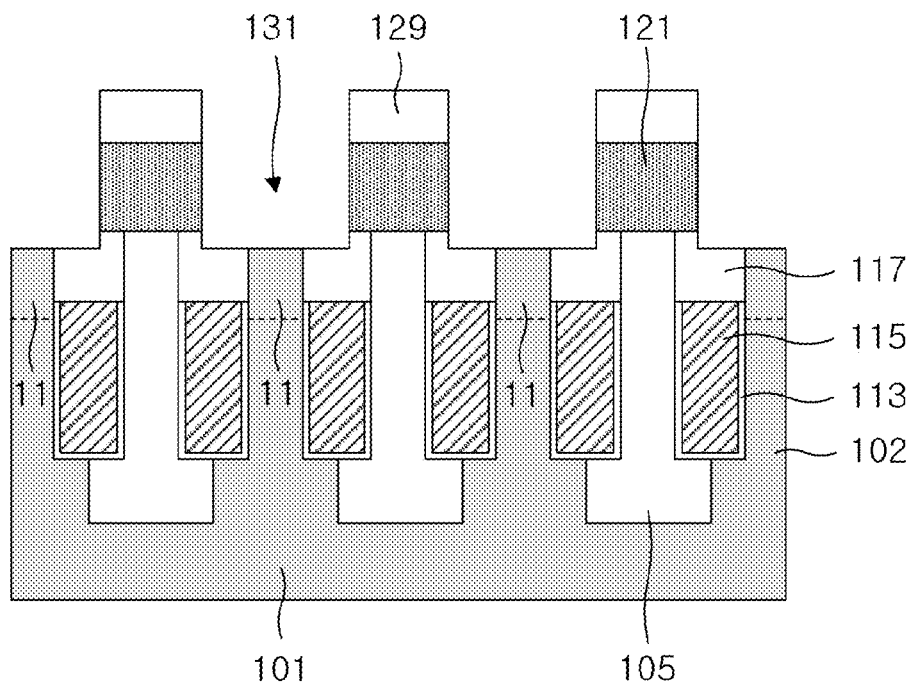

Referring to FIGS. 8A, 8B and 8C, bit line contact holes 131 may be formed to expose the first junction regions 11 of the active regions 102. For example, the first interlayer insulating layer 129 and the one or more separation walls or fences 121 may be patterned using an etching process, and thus, the bit line contact holes 131 may be formed to have a circular shape or other suitable shapes in plan view. During the etching of a portion of the fences 121, the sacrificial layer 127 and the etch stop layer 125 may be partially removed. During the formation of the bit line contact hole 131, the first junction region 11 may be over-etched. Accordingly, a top surface of the first junction region 11 may be lower than a top surface of the second junction region 12. In addition, the device isolation layer 105 and/or the word line capping layer 117 adjacent to the first junction region 11 may be over-etched as the result of the over-etching of the first junction region 11. Even if the word line capping layer 117 is over-etched, the word line 115 may not be exposed. As described with reference to FIG. 7B, the sacrificial layer 127 and the etch stop layer 125 may be overlapped with a portion of the first junction region 11. However, during the formation of the bit line contact hole 131, portions of the sacrificial layer 127 and the etch stop layer 125, which overlap the first junction region 11, may be removed. Accordingly, as will be described with reference to FIG. 13B, a storage node contact hole 151, which may be formed by removing the sacrificial layer 127 and the etch stop layer 125, may expose only the second junction region 12. Accordingly, it is possible to prevent the first junction region 11 from being electrically connected to the second junction region 12.

Figure 9A:
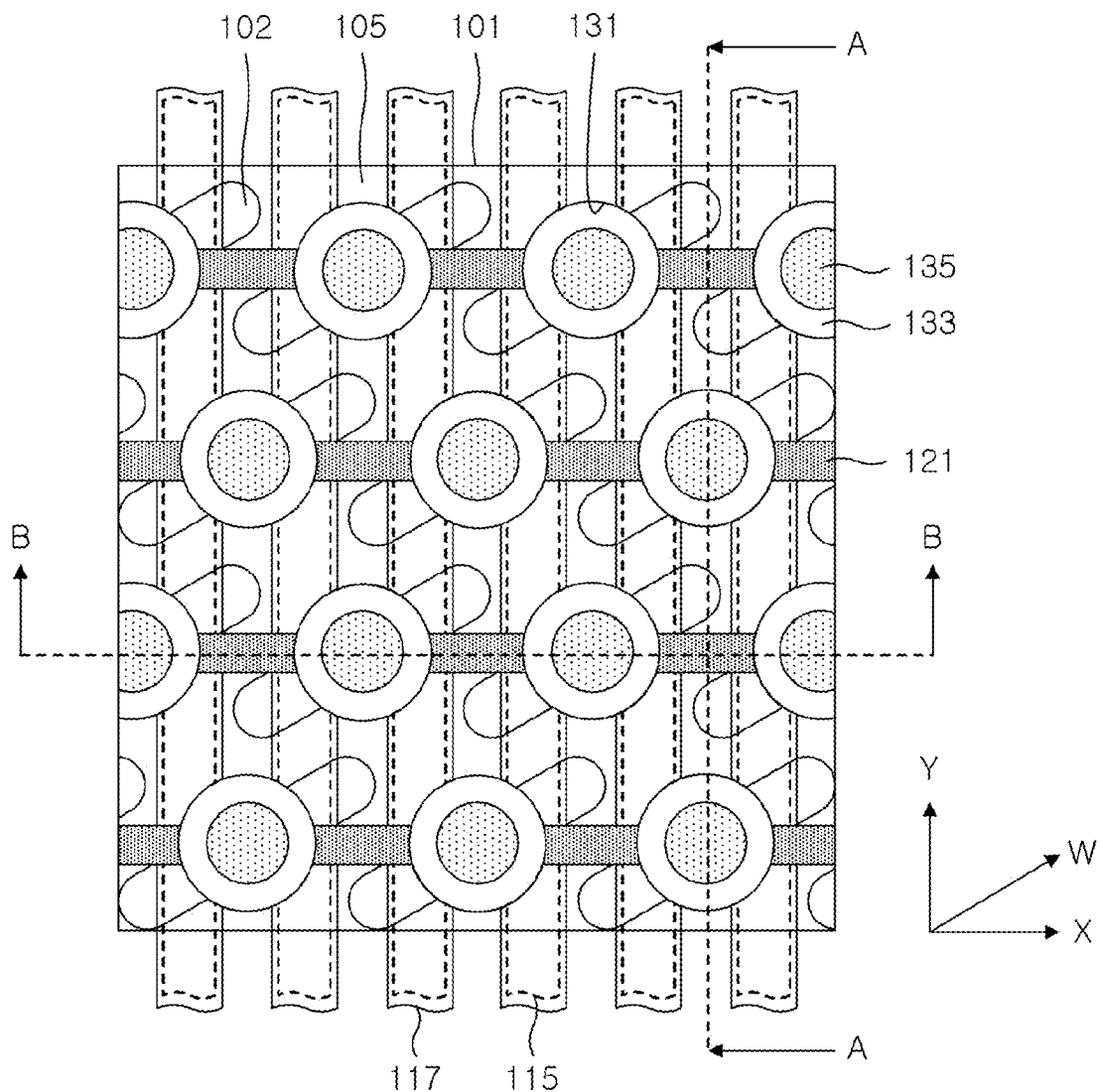
Figure 9B:
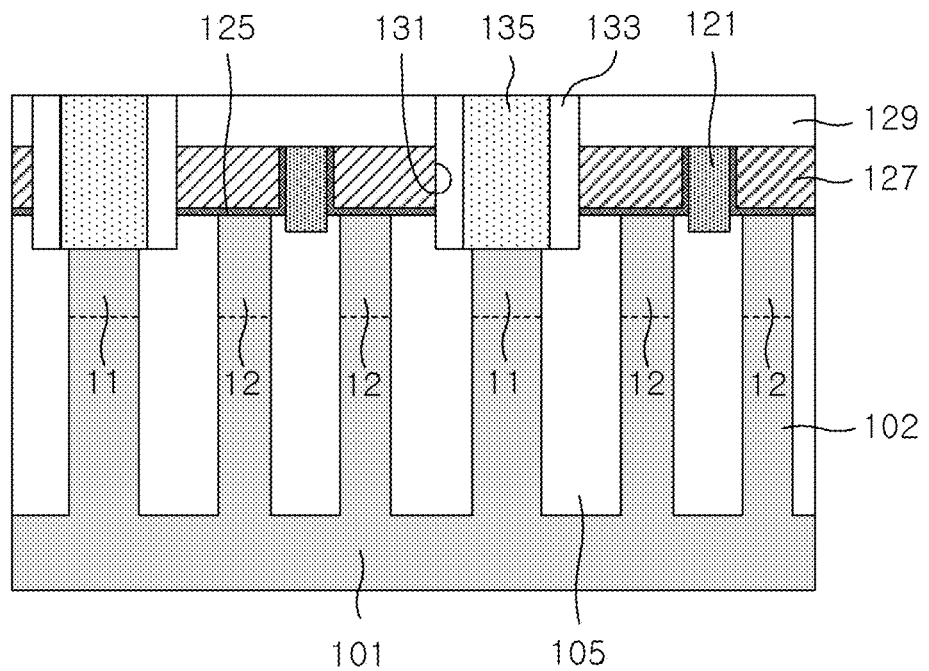
Figure 9C:
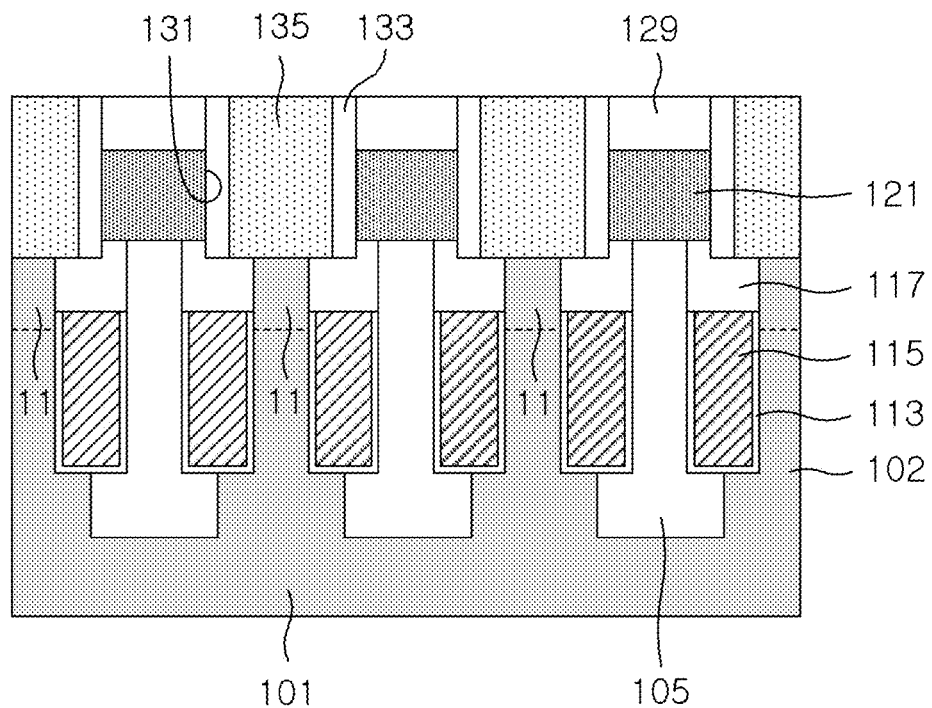

Referring to FIGS. 9A, 9B and 9C, bit line contacts 135 may be formed to fill the bit line contact holes 131. Before the formation of the bit line contacts 135, an insulating spacer or bit line contact spacer 133 may be formed on inner side surfaces or sidewalls of the bit line contact holes 131. In some embodiments, the insulating spacer 133 may be formed on sidewalls of the bit line contacts 135. The insulating spacer 133 may be formed by depositing an insulating material (e.g., a silicon oxide layer or a silicon nitride layer) having an etch selectivity with respect to the etch stop layer 125 and then anisotropically etching the insulating material. In some embodiments, the insulating spacer 133 may be formed of a silicon nitride layer. The bit line contacts 135 may be formed of a conductive material (e.g., polysilicon, metal, metal nitride, or metal silicide) and have a solid cylindrical shape. The bit line contact 135 may be in contact with the first junction region 11 of the active region 102. The insulating spacer 133 may prevent a later-formed storage node contact 157 from being electrically connected to the bit line contact 135. Also, this insulating spacer 133 may electrically isolate the first junction region 11 from the second junction region 12.

Figure 10A:
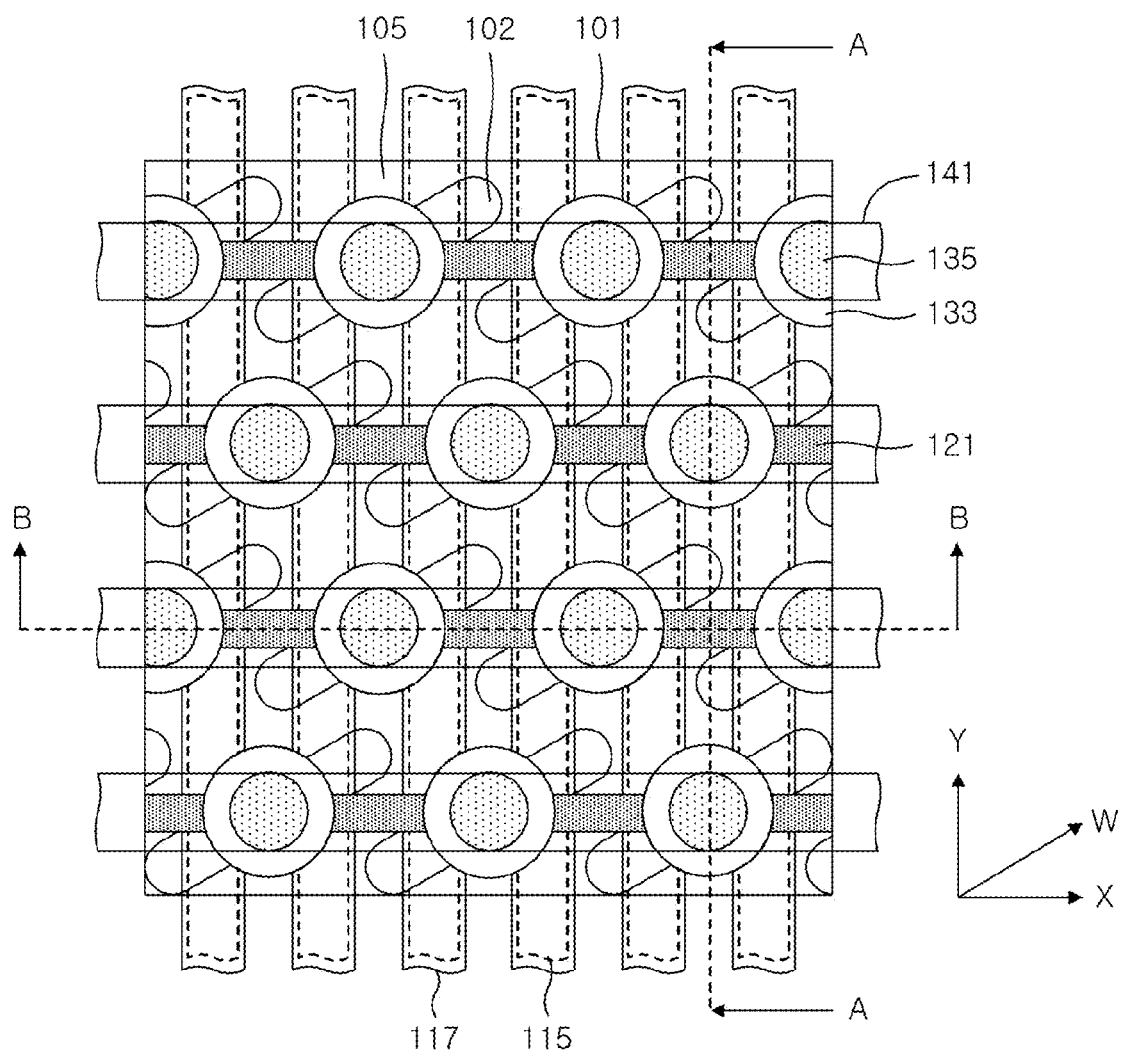
Figure 10B:
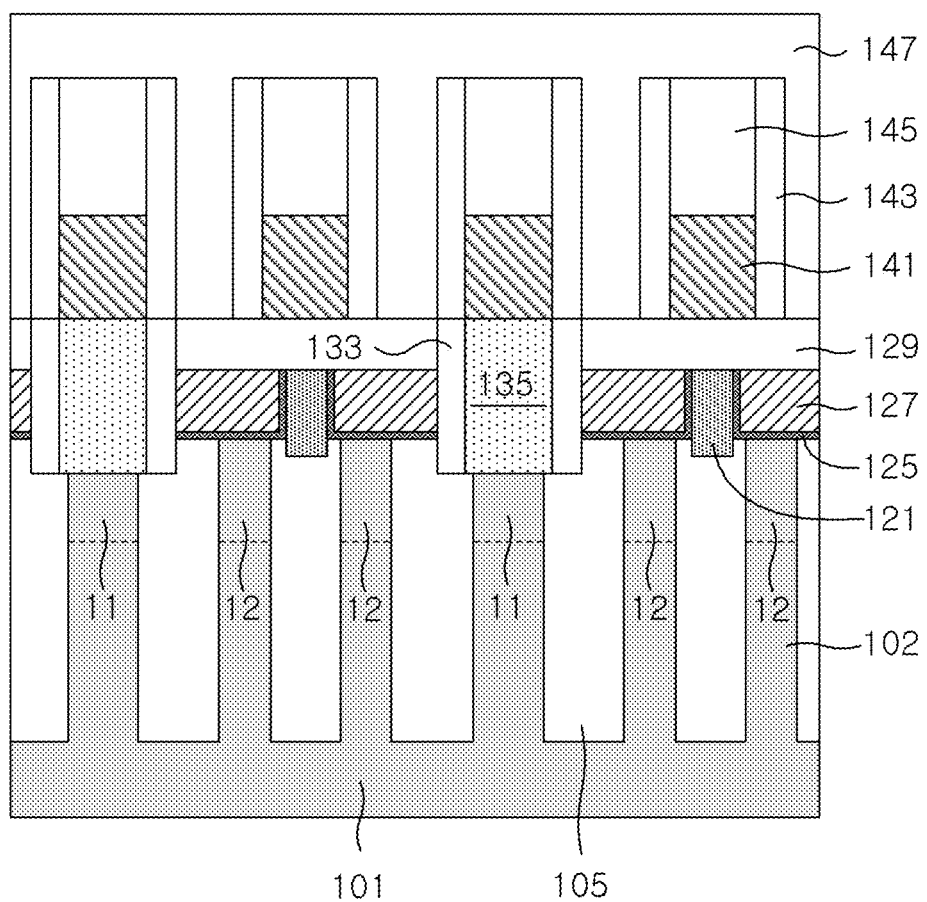
Figure 10C:
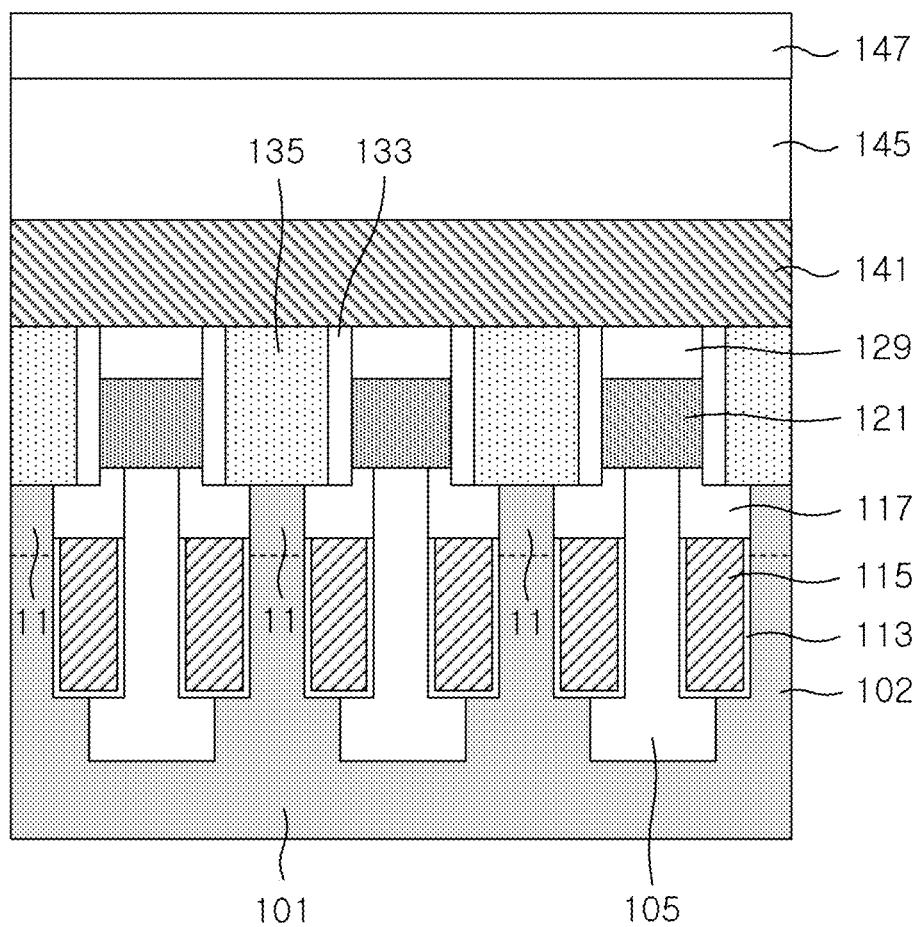

Referring to FIGS. 10A, 10B and 10C, bit lines 141 may be formed over the resulting structure to be in contact with the bit line contacts 135. The bit lines 141 may be formed of a conductive material (e.g., polysilicon, metal, or metal silicide). For example, the bit lines 141 may be formed by sequentially stacking a conductive material and an insulating material on the substrate 101 and patterning the conductive and insulating materials along the X-direction. In example embodiments, the bit lines 141 may extend along the X-direction over the one or more separation walls or fence 121. In some embodiments, the one or more separation walls 121 may extend along a direction crosswise of a direction of the plurality of word lines 141. In some other embodiments, the one or more separation walls 121 extend substantially parallel to a direction of the plurality of bit lines 141.

In one embodiment, the separation wall 121 has a substantially line shape in plan view. In another embodiment, a material that forms the word line capping layer 117 is substantially the same as a material that forms the one or more separation walls 121. Adjacent ones of the bit lines 141 may be spaced apart from each other in the Y-direction. A bit line capping layer 145 may be formed to cover the bit lines 141. An insulating material may be deposited and anisotropically etched to form bit line spacers 143 which surround side surfaces of the bit line 141 and the bit line capping layer 145. In some embodiments, the bit line capping layer 145 and the bit line spacer 143 may be formed of a silicon nitride layer or other suitable insulating material having an etch selectivity with respect to interlayer insulating layers. Thereafter, an insulating material (e.g., a silicon oxide layer or a silicon nitride layer) may be deposited to form a second interlayer insulating layer 147 covering the bit line 141. In some embodiments, the second interlayer insulating layer 147 may be formed of a silicon oxide layer or other suitable materials for interlayer insulating layers. The second interlayer insulating layer 147 may cover the bit line capping layer 145 or may be substantially coplanar with a top surface of the bit line capping layer 145. In other example embodiments, at least one of the bit line capping layer 145 and the bit line spacer 143 may not be formed. In still other example embodiments, the insulating spacer 133 and the bit line spacer 143 may be simultaneously formed using the same process. That is, after forming the bit line contact 135, the bit line 141 and the bit line capping layer 145, the bit line spacer 143 may be formed not only on the sidewall of the bit line 141 but also on the sidewall of the bit line contact 135 by a single step process. In still other example embodiments, the bit line capping layer 145 and the bit line spacer 143 may be simultaneously formed.

Figure 11A:
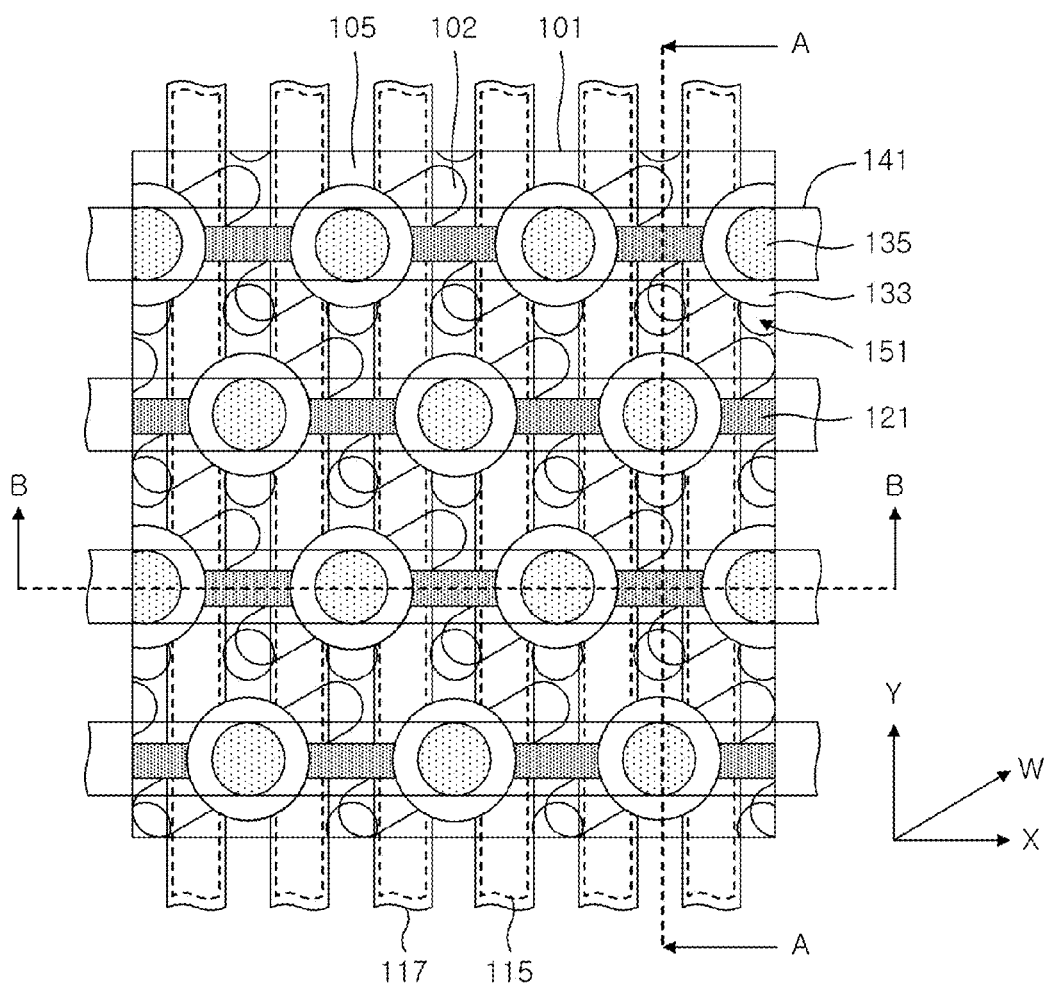
Figure 11B:
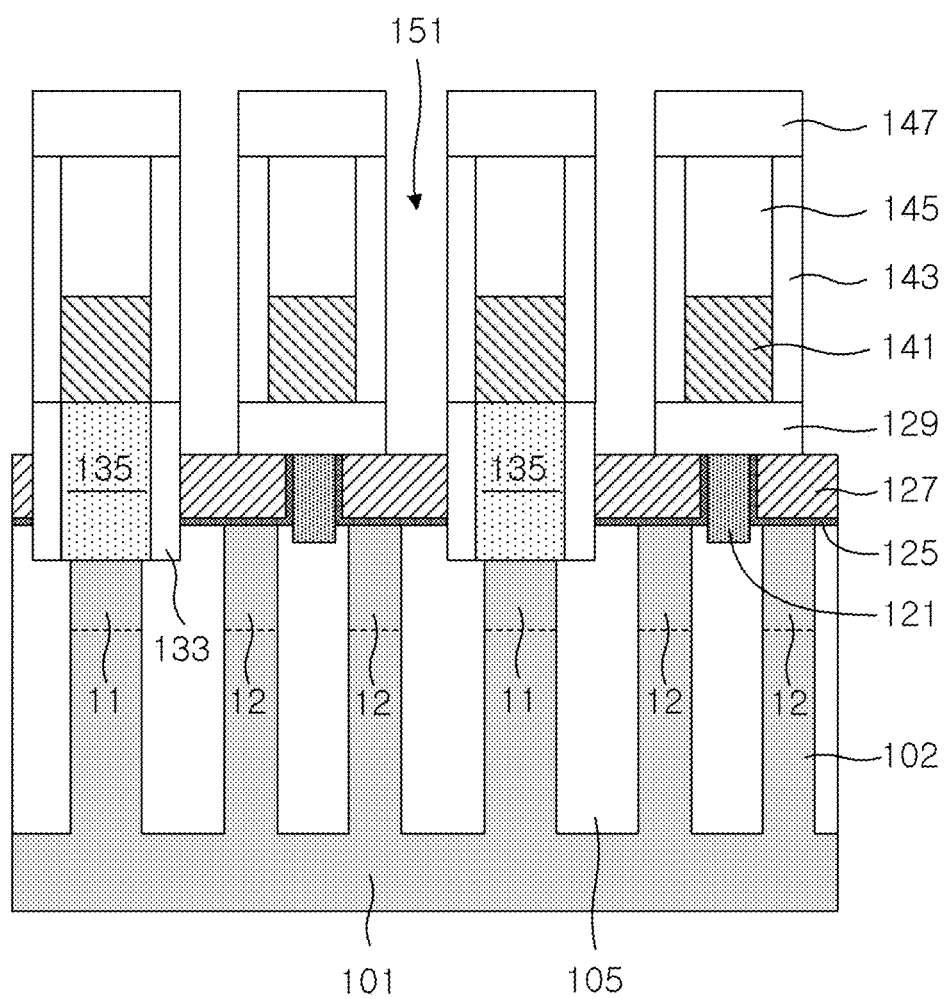
Figure 11C:
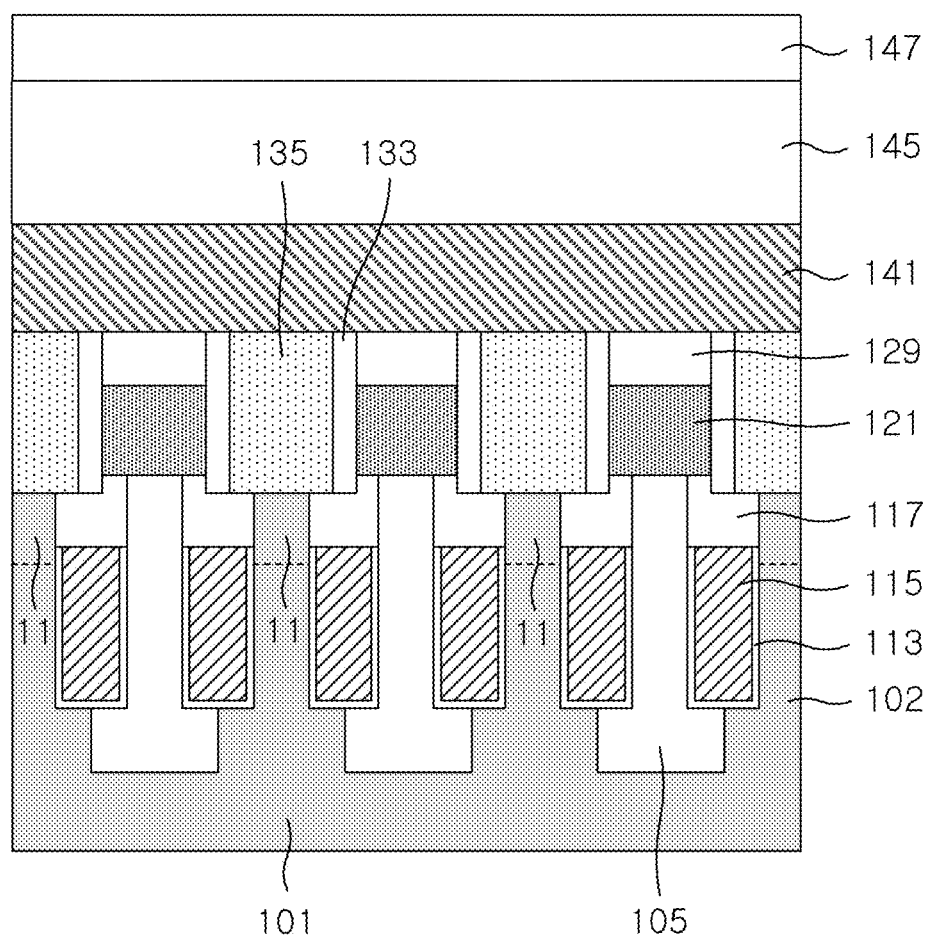

Referring to FIGS. 11A, 11B and 11C, the first interlayer insulating layer 129 and the second interlayer insulating layer 147 may be selectively etched to form the storage node contact holes 151 between adjacent ones of the bit lines 141. The storage node contact holes 151 may be formed to expose a portion of the sacrificial layer 127. In example embodiments, the first and second interlayer insulating layers 129 and 147 may be formed of a silicon oxide layer and the bit line spacer 143 may be formed of a silicon nitride layer, and thus, the bit line 141 can be protected against the etching process. If the second interlayer insulating layer 147 is coplanar with the top surface of the bit line capping layer 145, the bit line capping layer 145 may protect the bit line 141 from etching damage during the etching process. After the etching process, the second interlayer insulating layer 147 may remain partially on or be substantially entirely removed from the bit line capping layer 145. The storage node contact holes 151 may be formed to have a width smaller than that of the sacrificial layer 127. Accordingly, a portion of the sacrificial layer 127 may be exposed by the storage node contact hole 151. In example embodiments, at least one of the storage node contact holes 151 may not be vertically aligned with the second junction region 12. In other words, the at least one of the storage node contact holes 151 may be offset from the second junction region 12.

Figure 12A:
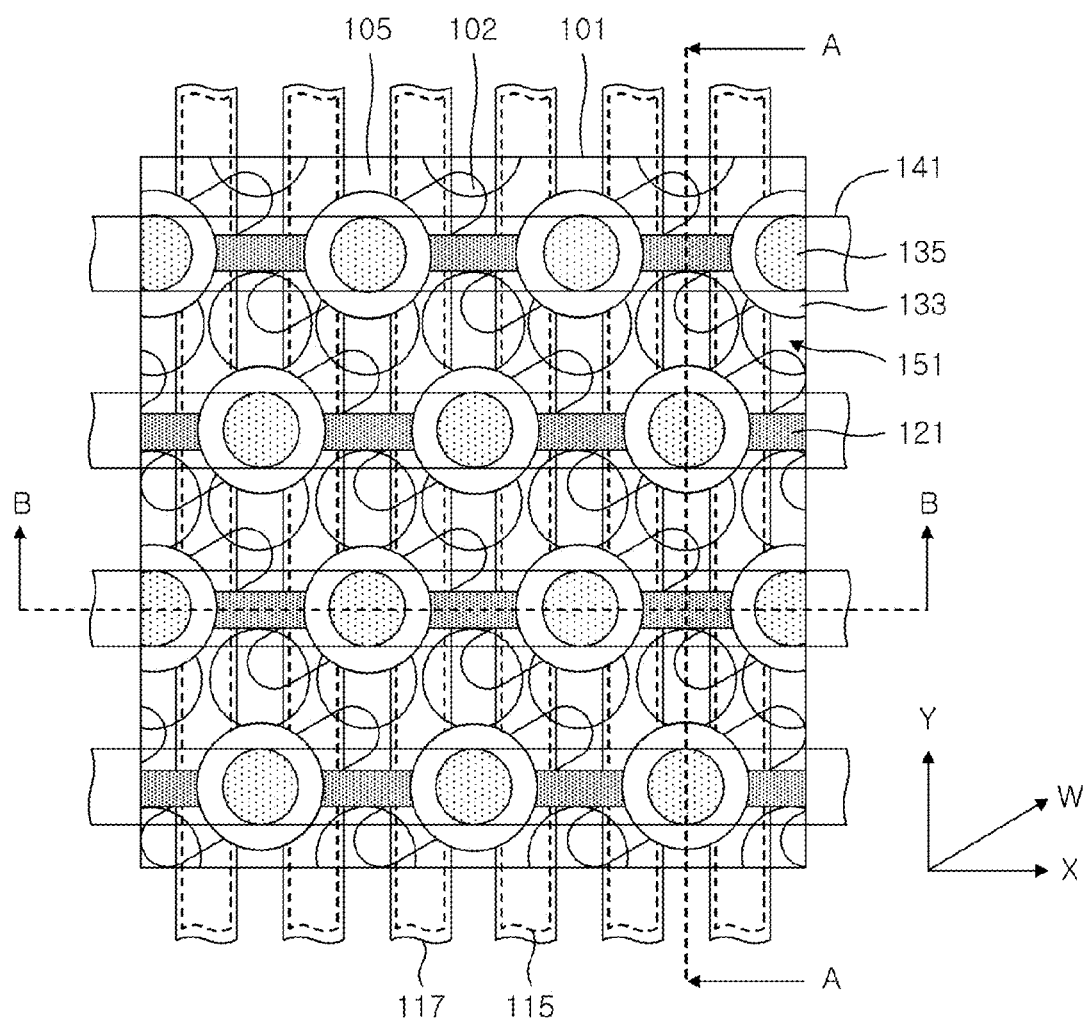
Figure 12B:
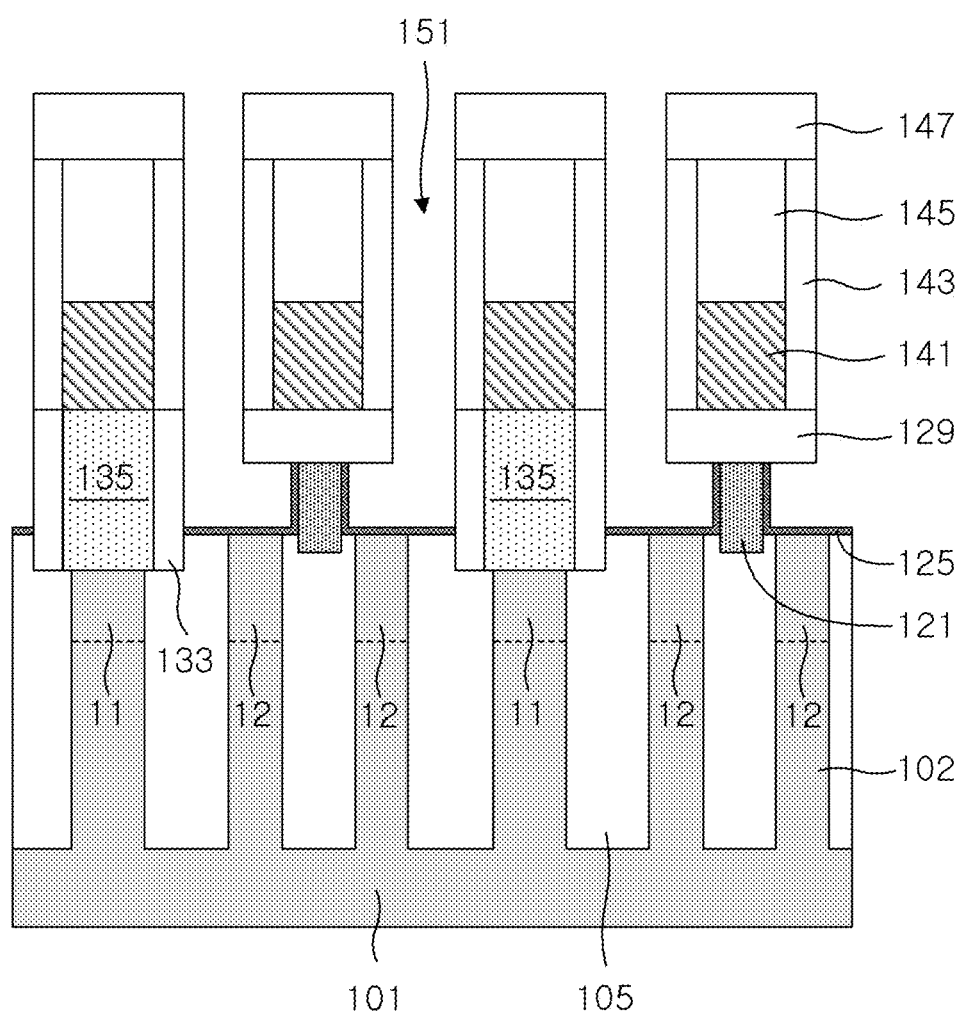
Figure 12C:
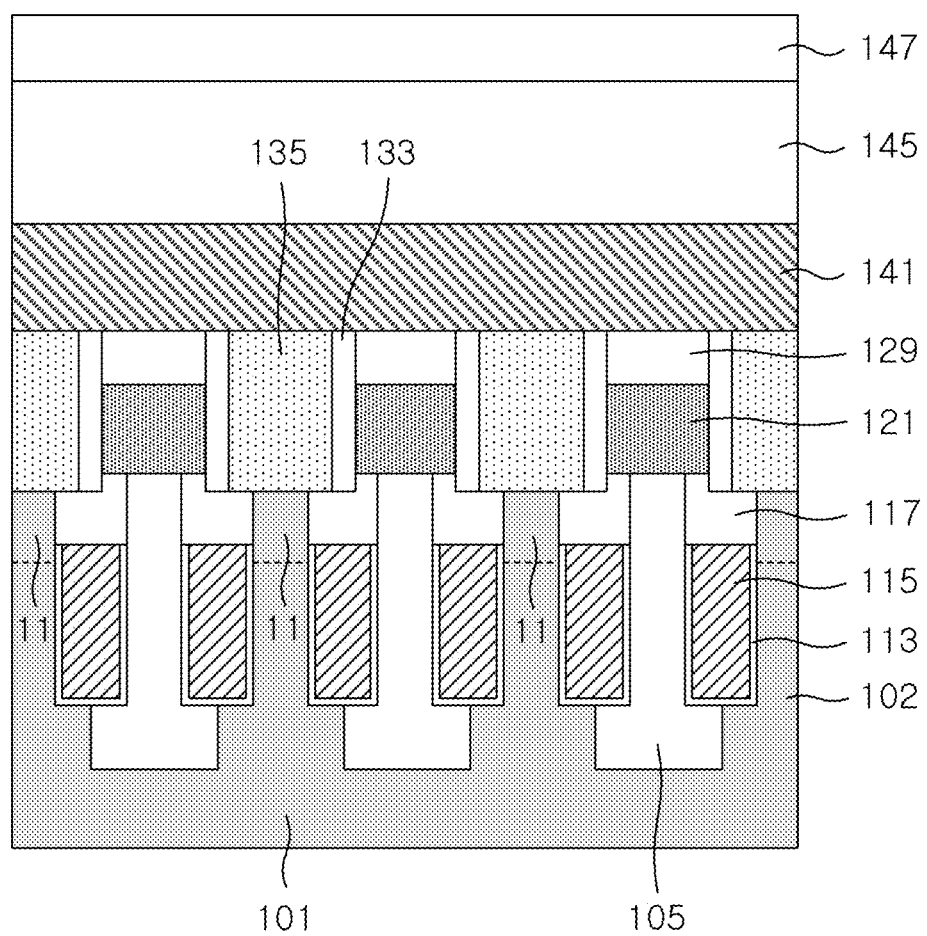

Referring to FIGS. 12A, 12B and 12C, the sacrificial layer 127 may be removed to expose the etch stop layer 125. In example embodiments, if the sacrificial layer 127 is formed of polysilicon, the sacrificial layer 127 may be removed by supplying an etchant capable of selectively removing polysilicon through the storage node contact hole 151. For example, the etchant may be at least one of chemicals (e.g., ammonia) having an etch selectivity with respect to a silicon oxide layer and/or a silicon nitride layer, and in this case, the sacrificial layer 127 may be selectively removed through a wet etching process. In other example embodiments, if the etch stop layer 125 is formed of silicon oxide and the bit line spacer 143 is formed of silicon nitride, the sacrificial layer 127 may be formed of an oxide layer, of which etch rate is greater than that of the etch stop layer 125 as described above. Here, even when the sacrificial layer 127 is etched, the active region 102 may be covered with the etch stop layer 125. In example embodiments, even if the storage node contact hole 151 is formed to have a small width, the storage node contact hole 151 can be expanded by the removal of the sacrificial layer 127. For example, the storage node contact hole 151 can have a lower portion having a width greater than an upper portion thereof. In example embodiments, at least one of the storage node contact holes 151 may be formed to have a linear vertical section or a bent or non-linear vertical section. If the sacrificial layer 127 is etched, the etch stop layer 125 may protect the active region 102 from an etch damage. This may improve a gate-induced-drain-leakage property, which may be caused by a recess of the active region 102.

Figure 13A:
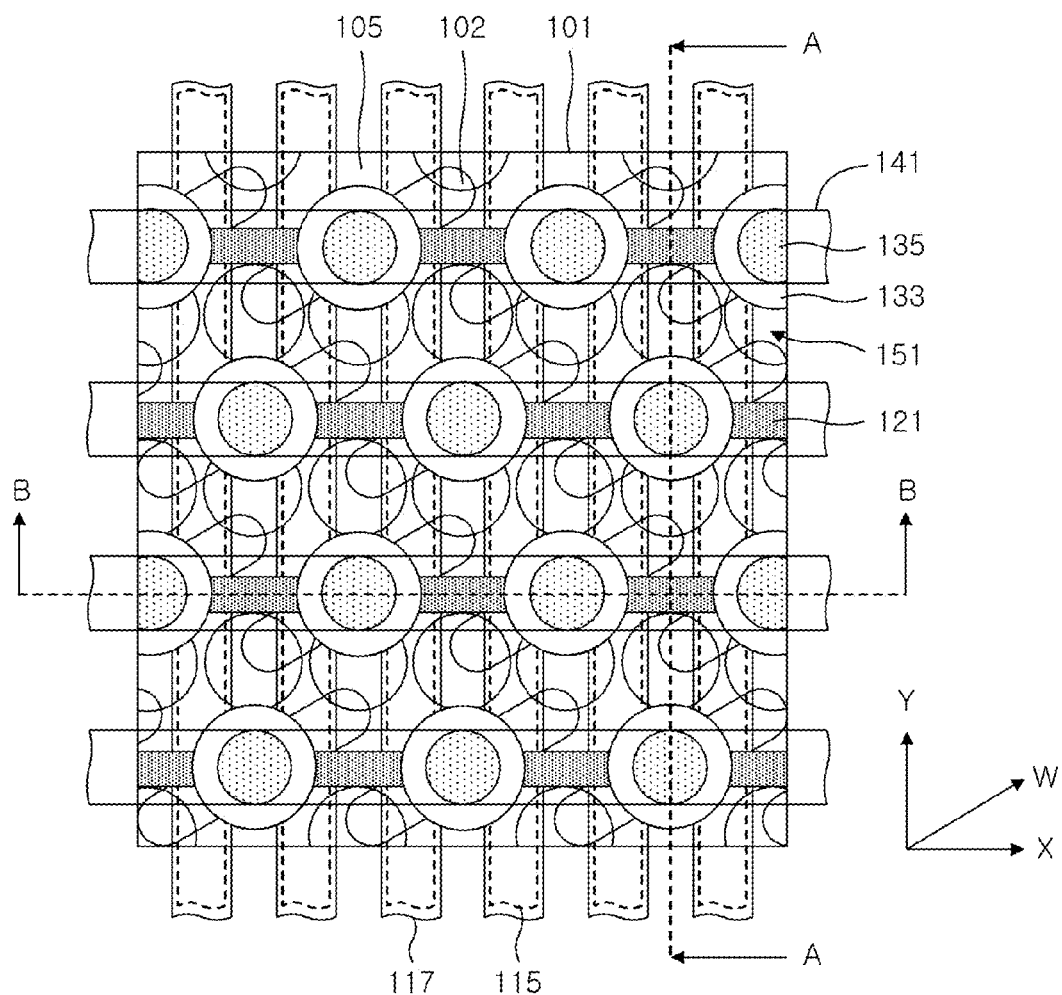
Figure 13B:
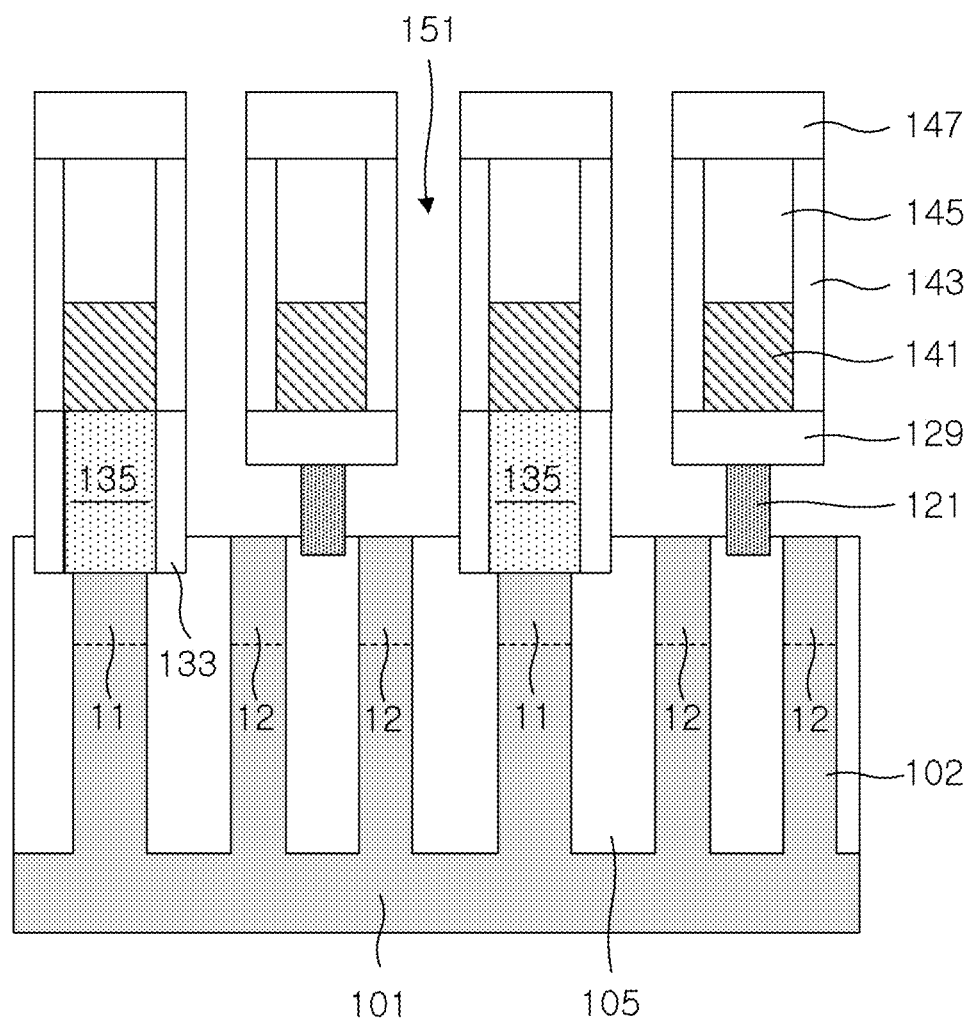
Figure 13C:
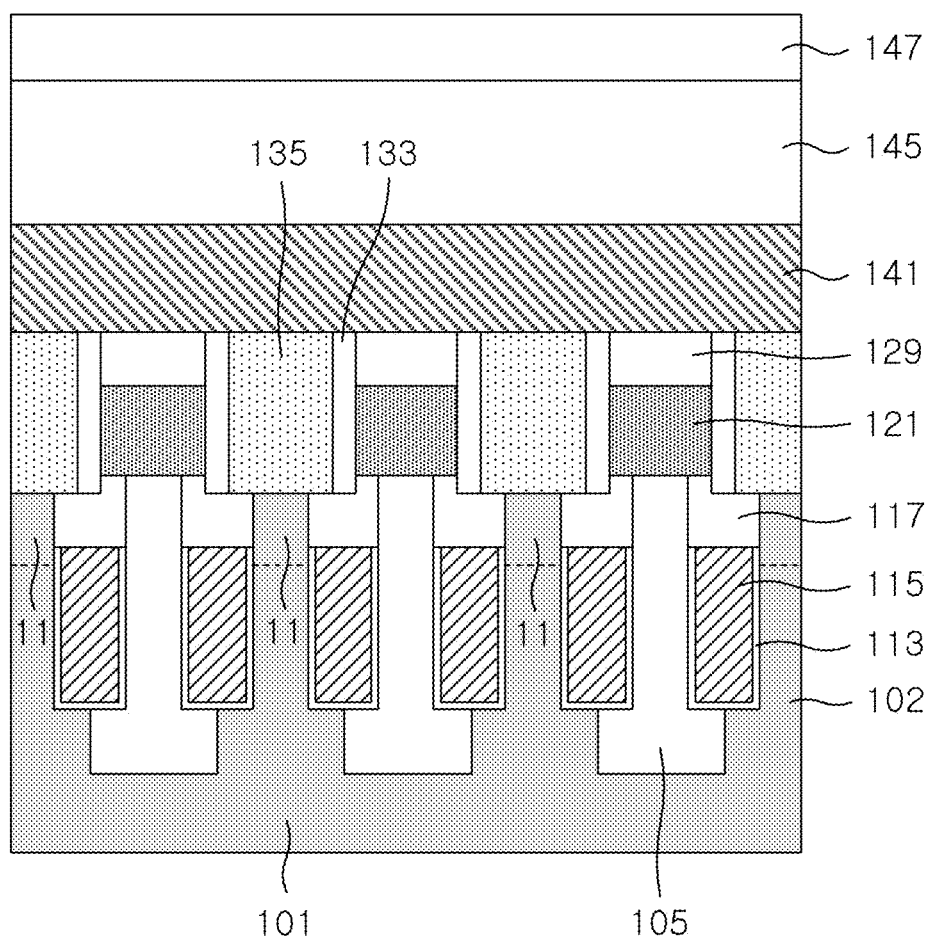

Referring to FIGS. 13A, 13B and 13C, the etch stop layer 125 may be removed. For example, a cleaning process may be performed to remove the etch stop layer 125. In example embodiments, the cleaning process may be performed as a pre-treatment step in a process of forming a storage node contact 157 of FIG. 14B and be performed using a plasma native oxide cleaning (PNC), ozone ($O_3$), and so forth. Accordingly, the second junction region 12 of the active region 102 may be exposed through the storage node contact hole 151. In this case, the device isolation layer 105 near the exposed second junction region 12 may be exposed through the storage node contact hole 151.

Due to unique processing steps described immediately above, the bottom surface of the storage node contact hole 151 may be substantially flat unlike the conventional storage node contact hole structure because the storage node contact hole 151 is formed using the etch stop layer 125. Thus, in some embodiments, the bottom surface of the storage node contact hole 151 may be formed without a step. Consequently, a bottom surface of the storage node contact can be prevented from being excessively lowered or expanded, and thus, a gate-induced drain lowering (GIDL) effect can be reduced.

In example embodiments, a width of a lower portion of the storage node contact hole 151 may be greater than that between adjacent ones of the bit lines 141. Thus, even if the storage node contact hole 151 is not vertically aligned to the second junction region 12, an exposed region of the second junction region 12 can be increased as the result of the expansion of the storage node contact hole 151.

Figure 14A:
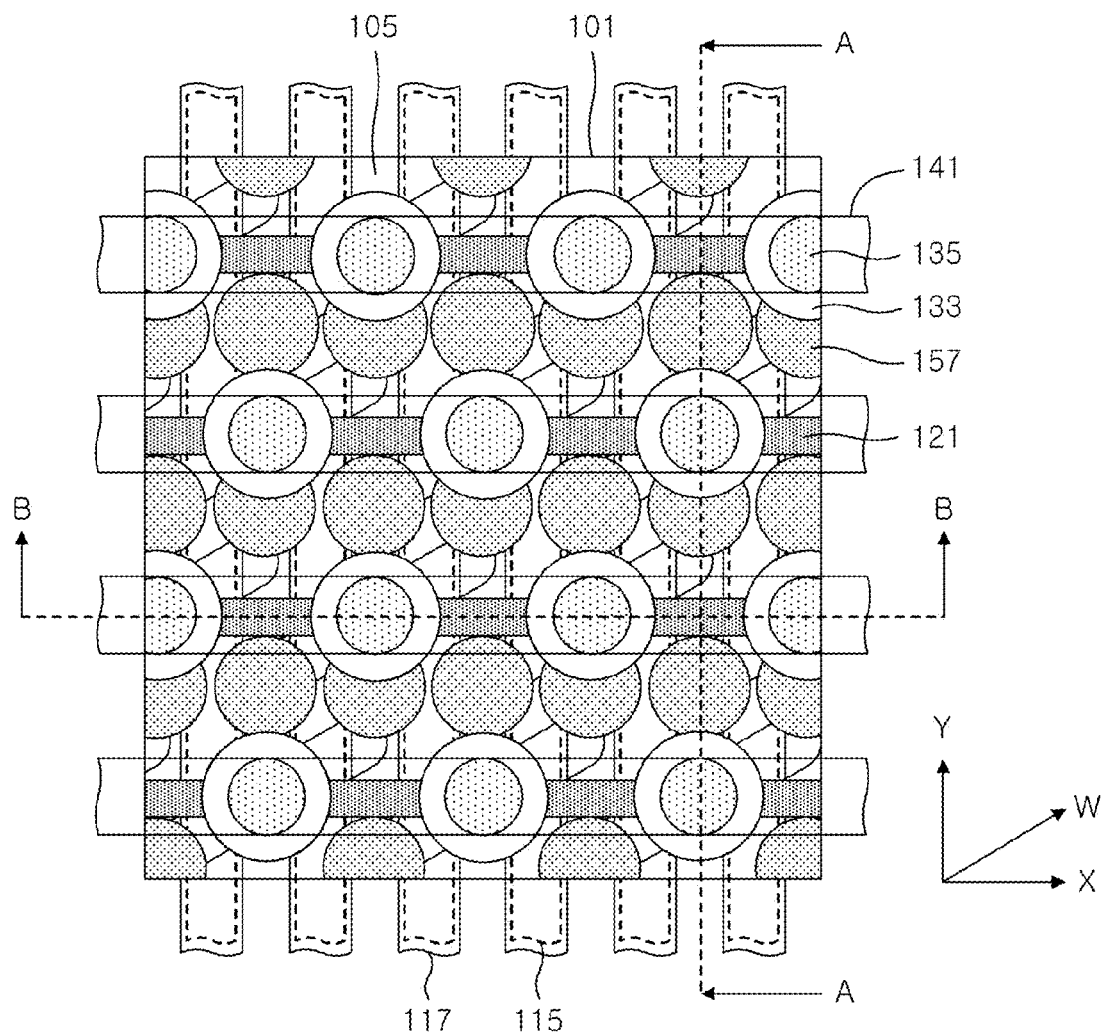
Figure 14B:
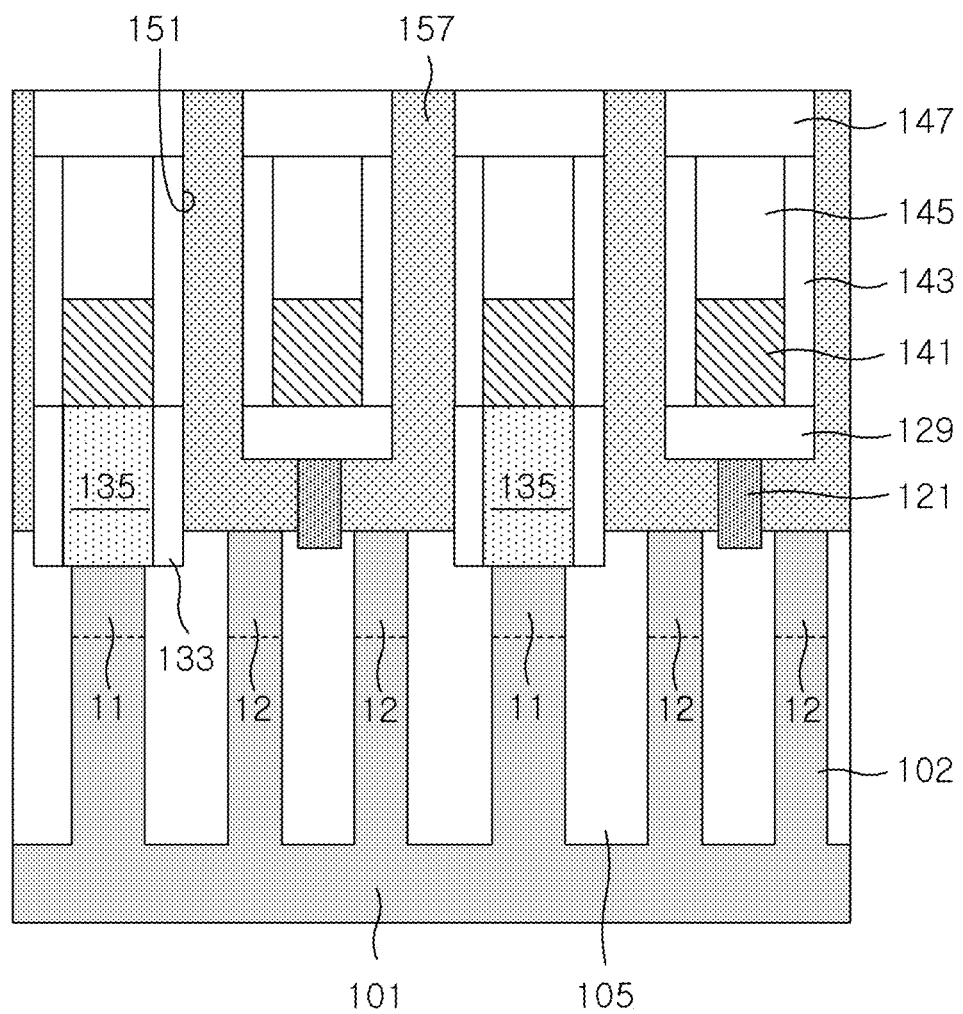
Figure 14C:
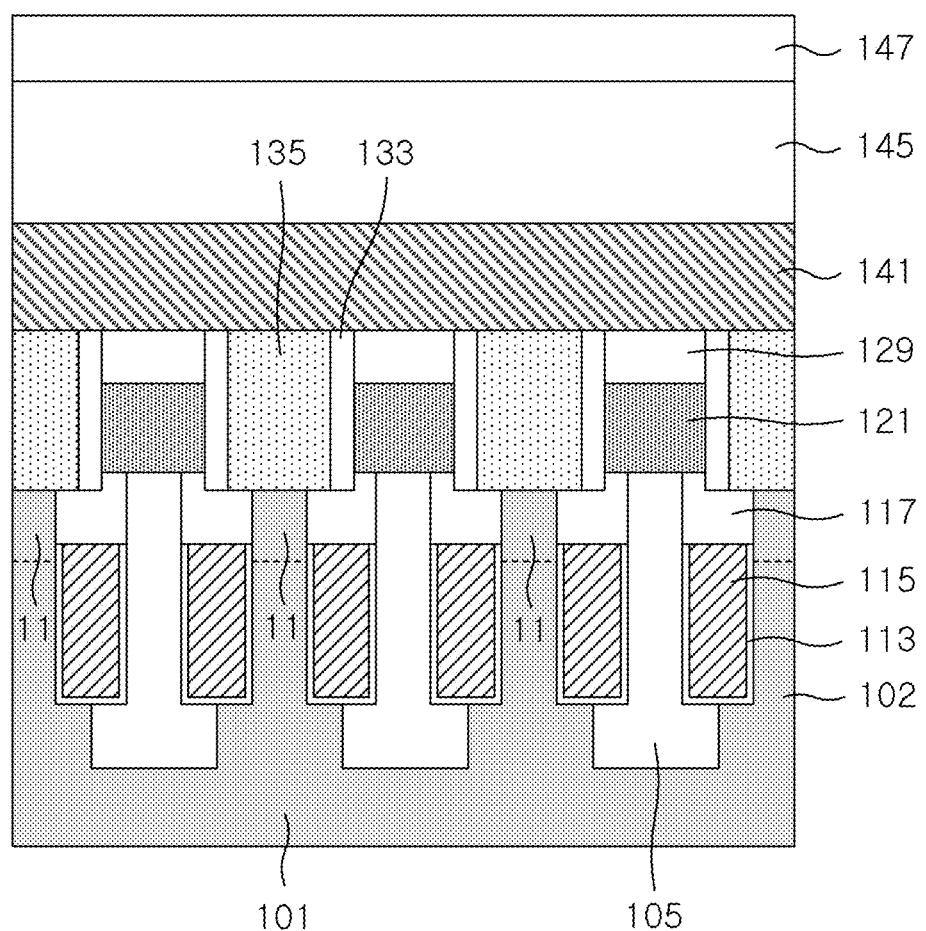

Referring to FIGS. 14A, 14B and 14C, the storage node contact hole 151 may be filled with a conductive material to form storage node contacts 157 in contact with the second junction regions 12. For example, the storage node contacts 157 may be formed by depositing and planarizing a polysilicon layer, a metal silicide layer, a metal nitride layer, a metal layer, and so forth. In other example embodiments, the storage node contacts 157 may be an epitaxially grown silicon layer. In still other example embodiments, the storage node contacts 157 may include an epitaxially grown silicon layer and a metal layer deposited thereon. A lower portion of the storage node contact 157 may be larger than an upper portion thereof in terms of an area overlapping the second junction region 12. Accordingly, it may be possible to increase a contact area and thus a contact resistance between the storage node contacts 157 and the second junction regions 12 may be lowered. The storage node contact 157 may include an upper portion extending substantially vertically from the top surface of the substrate 101 and a lower portion extending substantially horizontally along the top surface of the substrate 101. The upper and lower portions of the storage node contact 157 may form a single integral body structure, in which an interfacial surface is not formed, and thus, the storage node contact 157 can have a relatively low resistance.

Some of the storage node contacts 157 may have a linear vertical profile (e.g., like a linear pillar). For example, a central vertical axis of the lower portion of the storage node contact 157 connected to the second junction region 12 may be aligned with a central vertical axis of the upper portion of the storage node contact 157 disposed between the bit lines 141. In some other embodiments, the storage node contacts 157 may have a bent or non-linear vertical profile. For example, the central vertical axis of the lower portion of the storage node contact 157 connected to the second junction region 12 may not be aligned with (or offset from) a central vertical axis of the upper portion of the storage node contact 157 disposed between the bit lines 141. The central vertical axes of the second junction region 12 and the storage node contact 157 adjacent thereto may not be aligned with each other. In example embodiments, the storage node contact 157 may be in direct contact with the second junction region 12, and this may increase a contact area therebetween. Accordingly, it may be possible to skip a process of forming a contact pad between the storage node contact 157 and the second junction region 12. The storage node contact 157 may also be in contact with the device isolation layer 105 around the second junction region 12.

In some embodiments, a top surface of the second junction region 12 in contact with the storage node contact 157 may be substantially coplanar with a top surface of the device isolation layer 105 underneath the separation wall 121.

In some embodiments, a bottom of the separation wall 121 may be higher than a bottom of the insulating spacer 133.

Figure 15A:
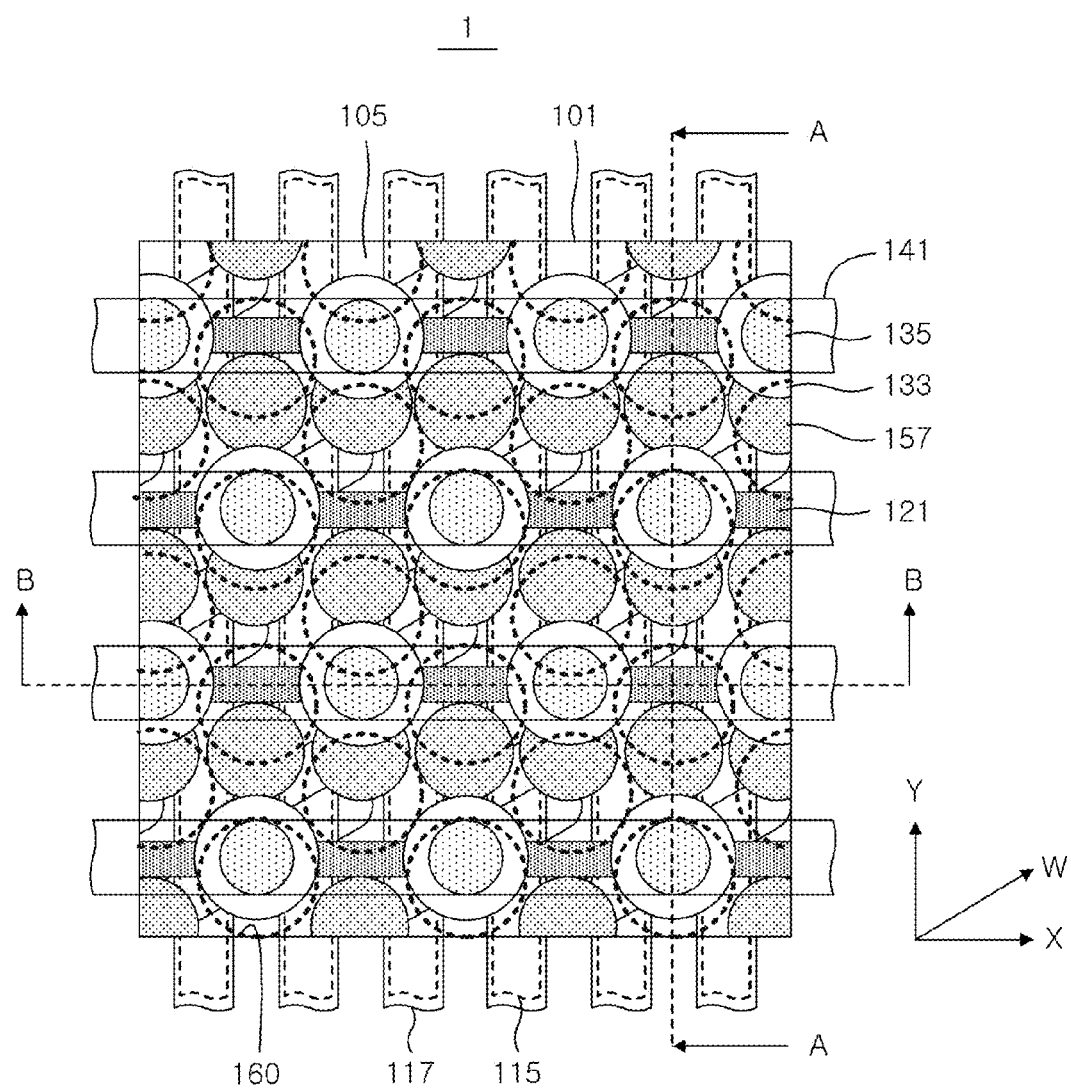
Figure 15B:
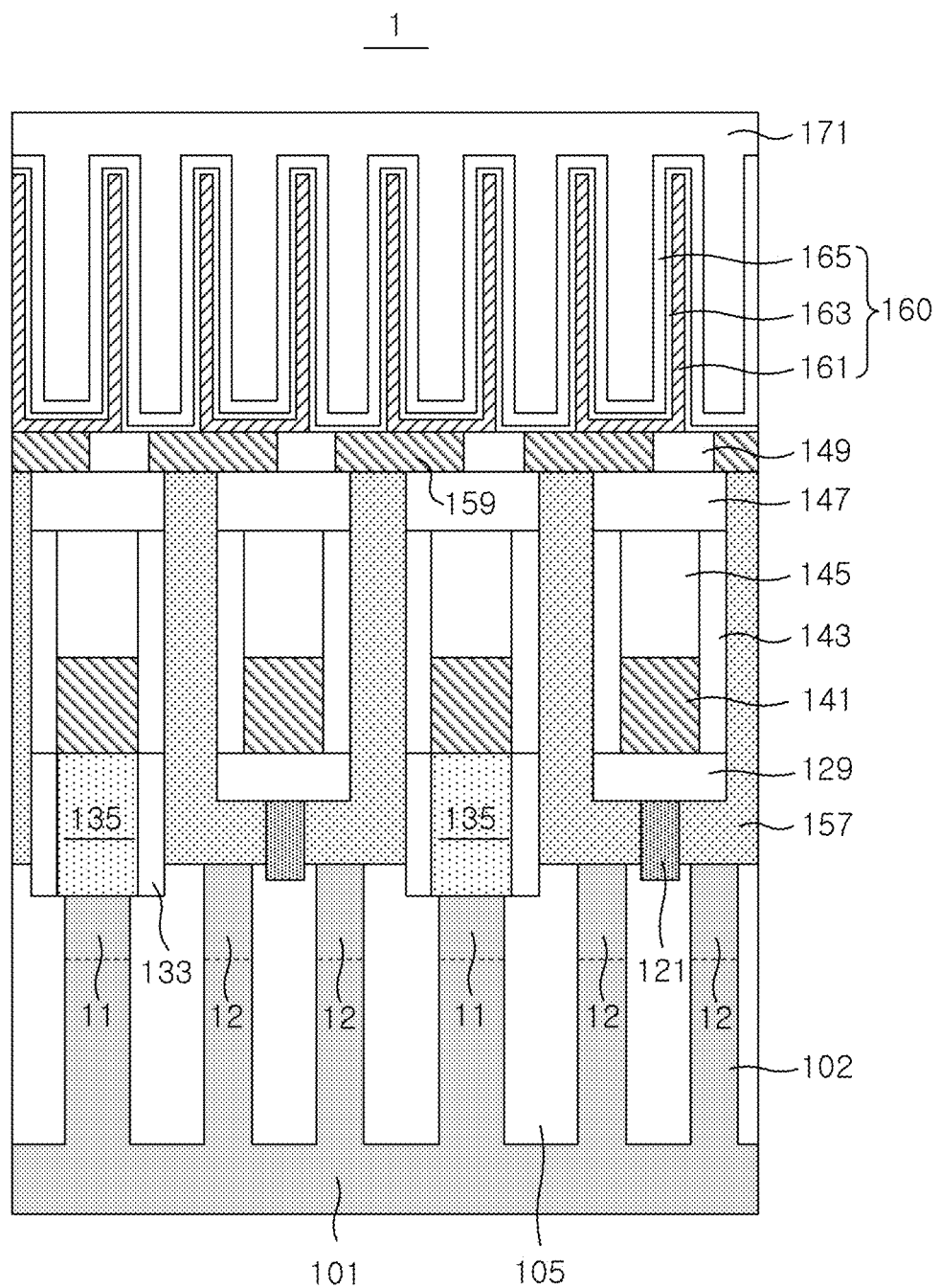
Figure 15C:
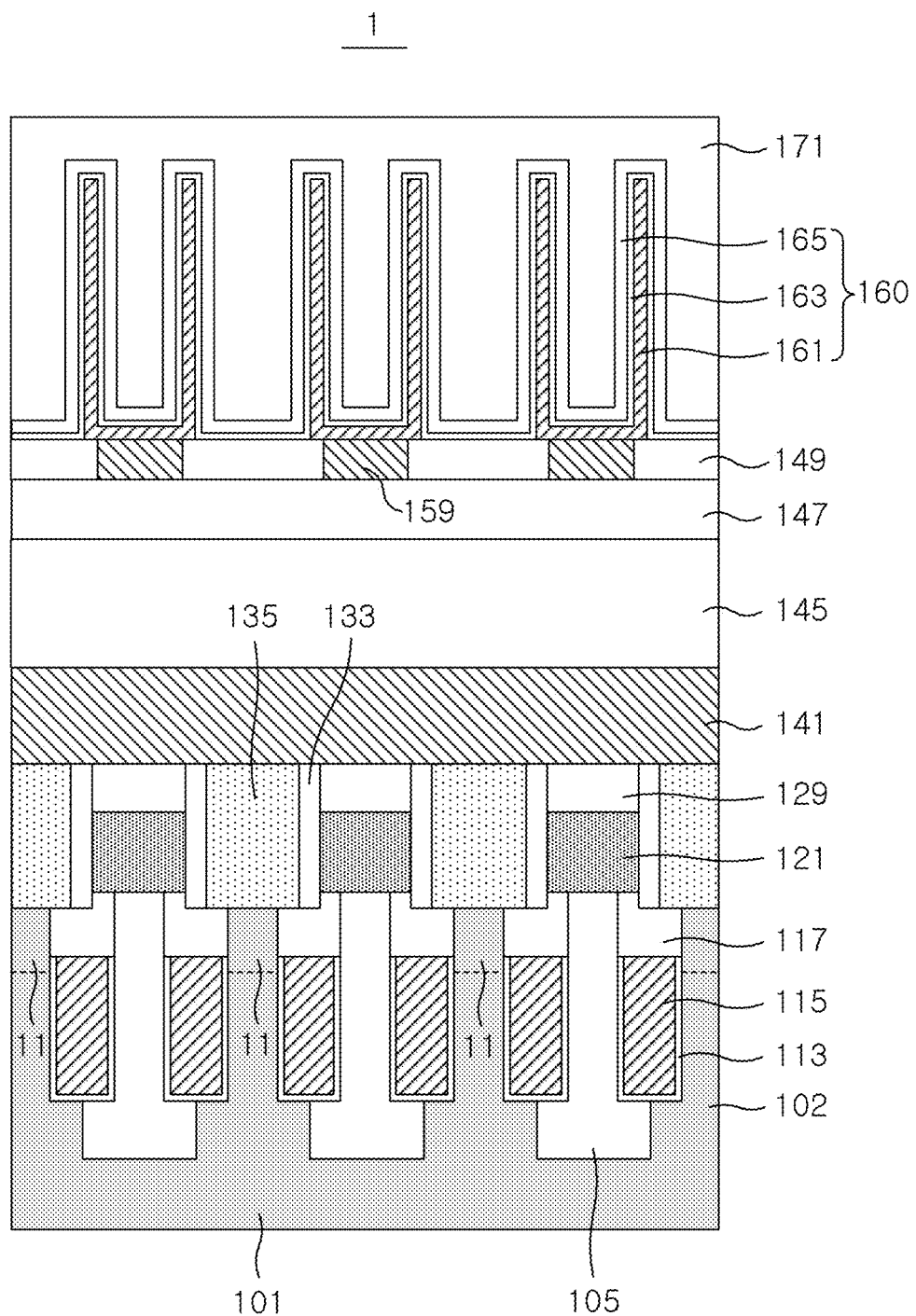

Referring to FIGS. 15A, 15B and 15C, a memory element, such as a capacitor 160, may be formed to be in contact with the storage node contact 157. In example embodiments, a capacitor lower electrode 161, which may be provided as a storage node connected to the storage node contact 157, may be formed to have a cylindrical shape or a pillar shape. In addition, according to a profile of the capacitor lower electrode 161, a capacitor dielectric 163 and a capacitor upper electrode 165 may be formed to have a sinuous shape. The capacitor upper electrode 165 may have a sinuous shape like that of the capacitor lower electrode 161 or a plate shape. In example embodiments, the capacitor 160 and the storage node contact 157 may not be vertically aligned with each other or be offset to each other. A landing pad 159 may be further formed to connect the lower electrode 161 of the capacitor 160 electrically to the storage node contact 157. The landing pads 159 may be formed by depositing and patterning a layer of a conductive material such as doped polysilicon or metal. A third interlayer insulating layer 149 may be formed to electrically isolate the landing pads 159 from each other. The third interlayer insulating layer 149 may be formed by depositing and planarizing an insulating material (e.g., a silicon oxide layer or a silicon nitride layer). Each of the landing pads 159 may be in contact with a substantially entire or partial top surface of the storage node contact 157 as well as a substantially entire or partial bottom surface of the capacitor lower electrode 161. A central vertical axis of the landing pad 159 may be offset from the central vertical axis of the upper portion of the storage node contact 157. And also, the central vertical axis of the landing pad 159 may be offset from that of the lower electrode 161. After the formation of the capacitor 160, a silicon oxide layer or a silicon nitride layer may be deposited to form a fourth interlayer insulating layer 171 covering the capacitor 160. In example embodiments, the capacitors 160 may be arranged to form a hexagonal configuration like a beehive. By using the above-described fabricating method, a semiconductor device 1 (e.g., a dynamic random access memory (DRAM)) according to the example embodiment of the inventive can be formed to have an increased contact area between the storage node contact 157 and the active region 102. The lower portion of the storage node contact 157 may be substantially surrounded by the one or more separation walls or fences 121, the protruded capping layer 117 and the insulating spacer 133 (or the bit line spacer 143). In other words, the lower portion of the storage node contact 157 may be disposed within a space confined or defined by sidewalls of adjacent word line capping layers 117 and sidewalls of adjacent separation walls or fences 121 extending between the adjacent word line capping layers 117. In some embodiments, the insulating spacer 133 may function as one of separation walls extending between the adjacent word line capping layers 117.

In one embodiment, one of the sidewalls of the adjacent separation walls has a flat surface and another sidewall has a curved surface. For example, the sidewall of the insulating spacer 133 may have a curved surface and the sidewall of the separation wall 121 has a flat surface.

In some embodiments, the height of the insulating spacer 133 (or the bit line spacer 143) may be higher than the height of the one or more separation walls or fences 121.

Hereinafter, semiconductor devices and methods for fabricating the same according to modified embodiments of the inventive concept will be described below. For concise description, duplication description of elements previously described with reference to FIGS. 1A through 15A may be omitted.

[Other Example Embodiments]

FIGS. 16A through 20A are plan views exemplarily illustrating a method of fabricating a semiconductor device according to other example embodiments of the inventive concept. FIGS. 16B through 20B are cross-sectional views taken along lines A-A of FIGS. 16A through 20A, respectively. FIGS. 16C through 20C are cross-sectional views taken along lines B-B of FIGS. 16A through 20A, respectively.

Figure 16A:
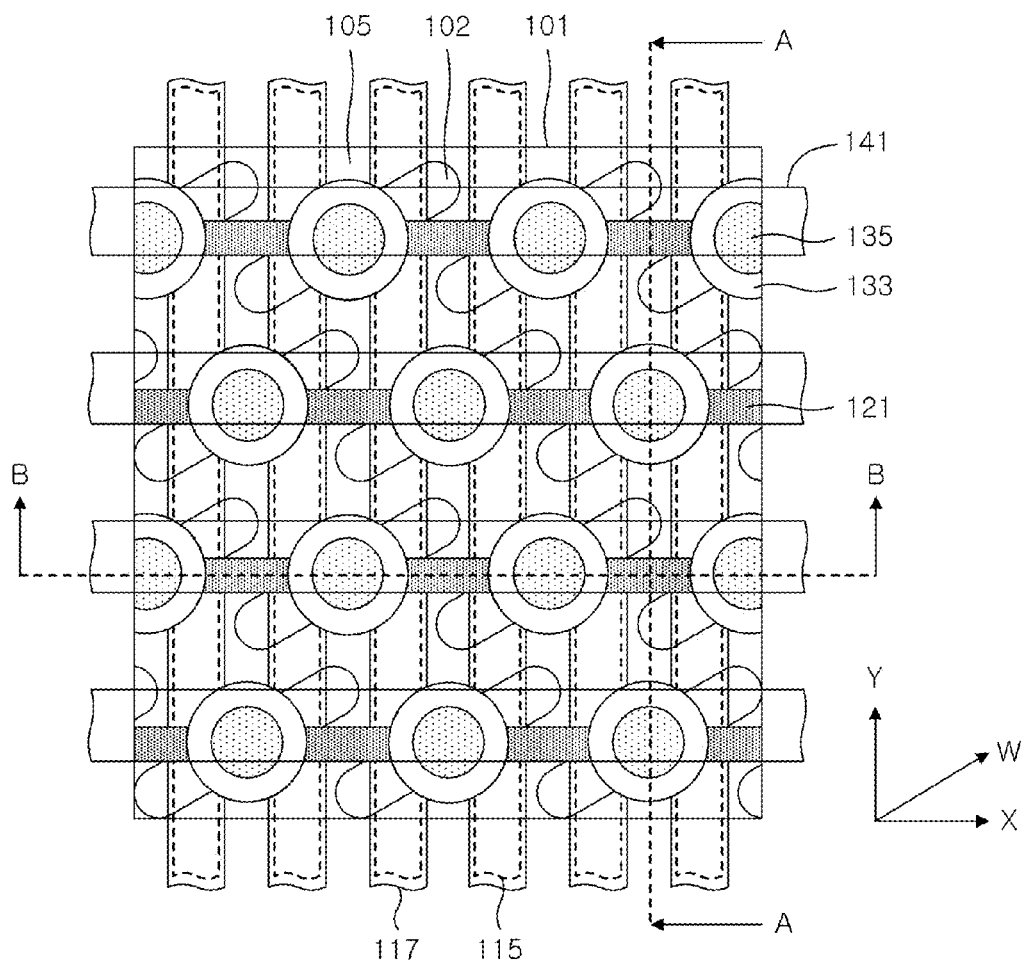
Figure 16B:
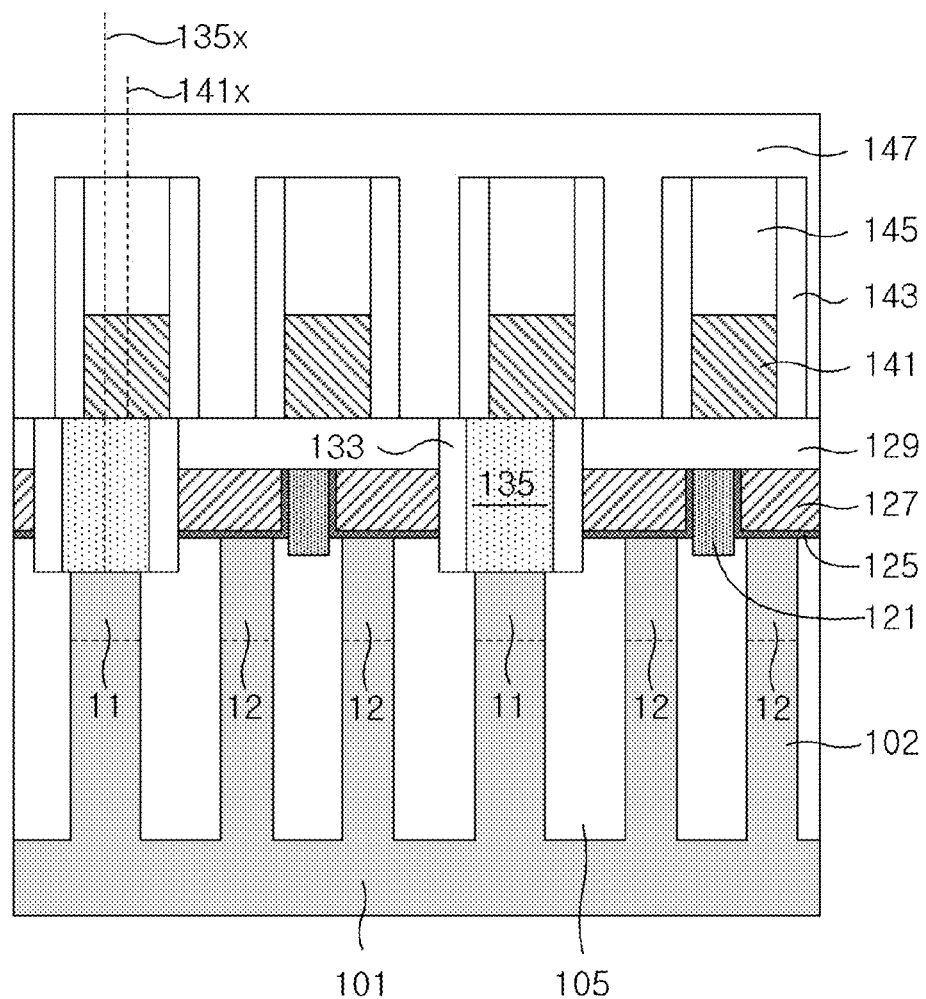
Figure 16C:
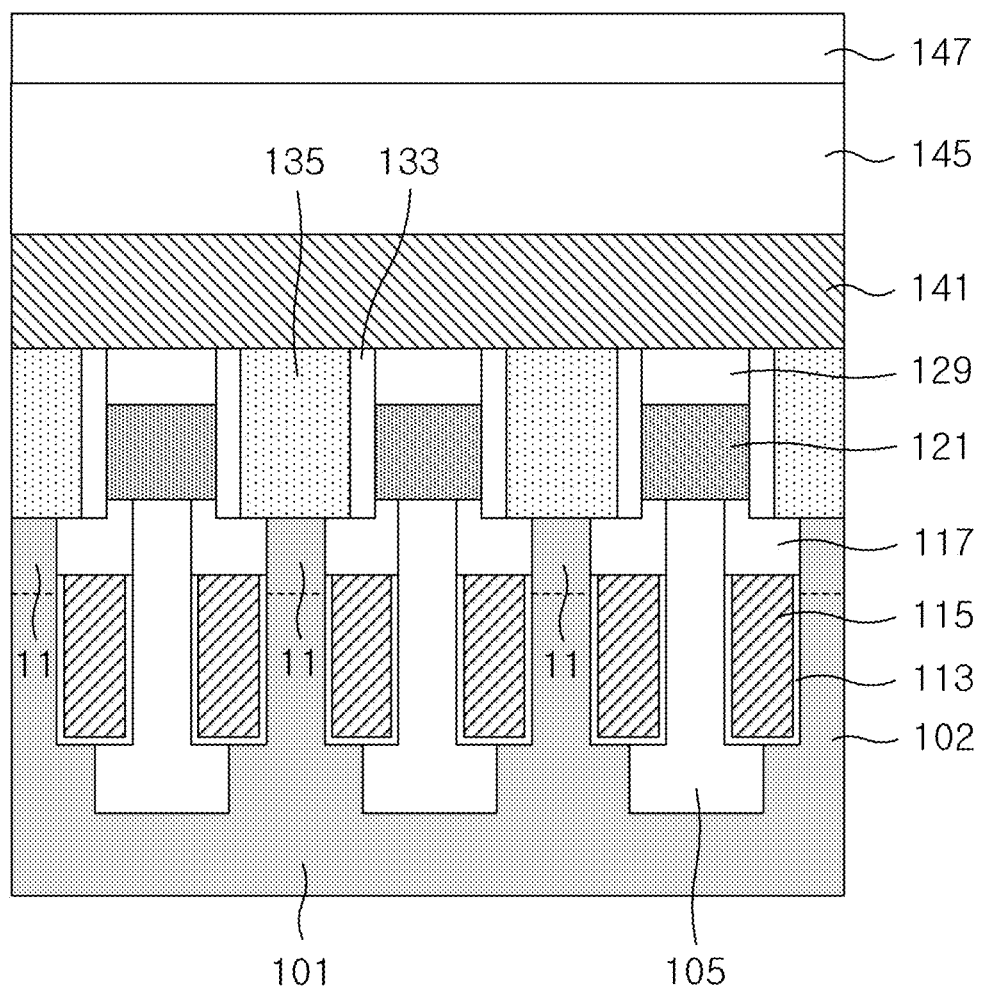

FIGS. 16A, 16B and 16C illustrate some other embodiments modified from the embodiments described with reference to FIGS. 10A, 10B and 10C. In particular, the bit line 141 may have a central vertical axis 141x misaligned or offset from a central vertical axis 135x of the bit line contact 135 as shown in FIG. 16B. In example embodiments, at least one of the bit lines 141 may be misaligned due to several factors relating to the device shrinkage or photolithographic processes. For example, one or more bit lines 141 may be shifted in the Y-direction from an original or desired position. After the formation of the bit line 141, the second interlayer insulating layer 147 may be formed to cover the bit line 141.

Figure 17A:
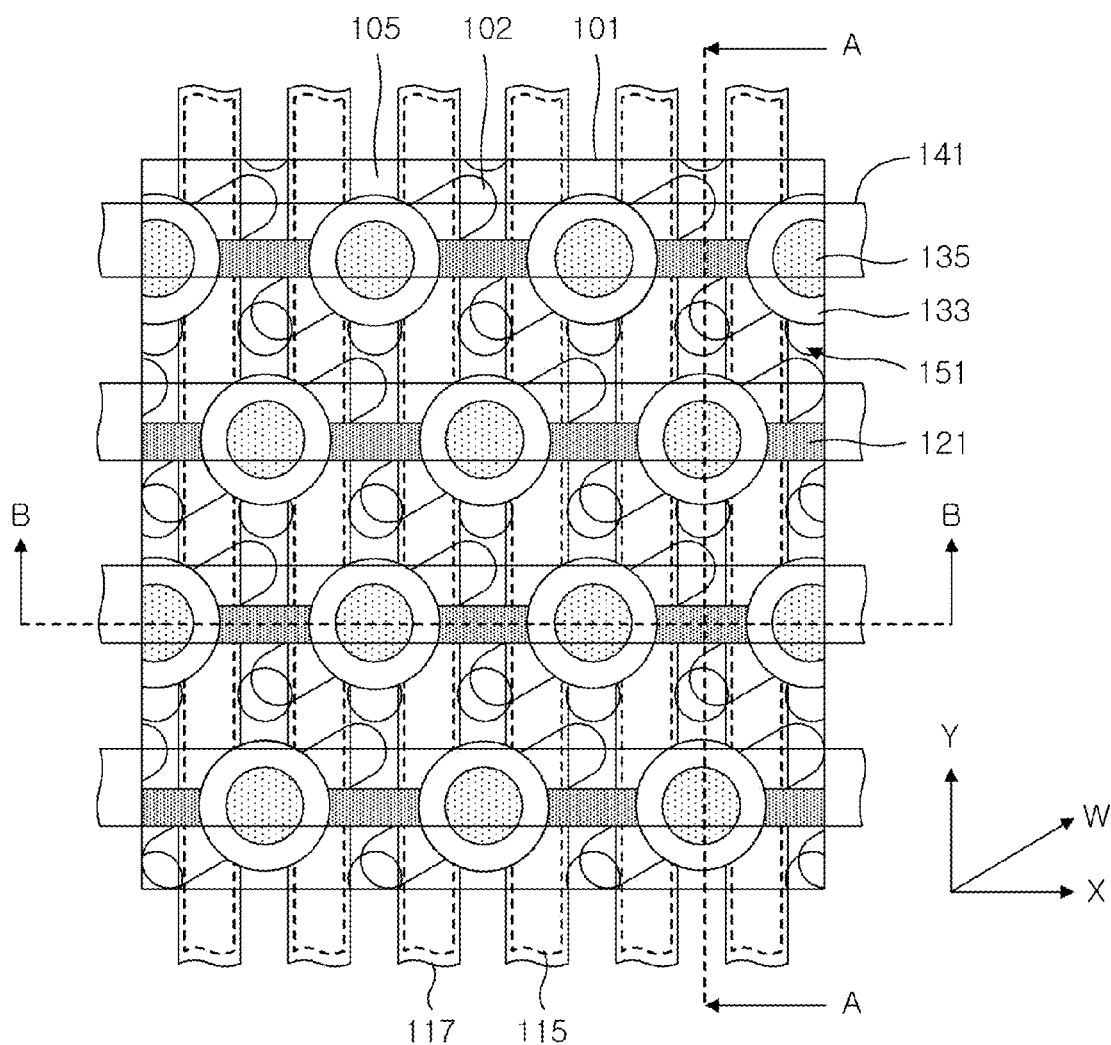
Figure 17B:
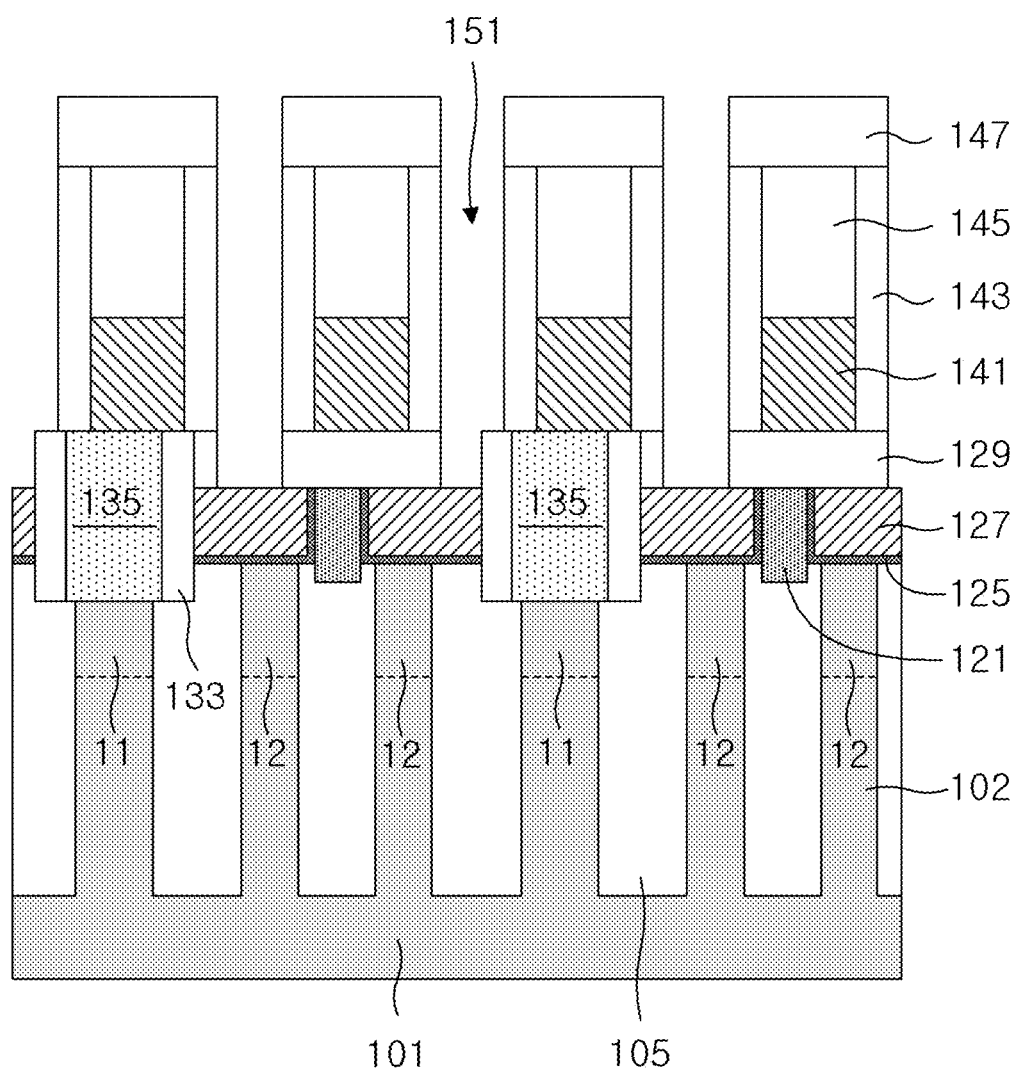
Figure 17C:
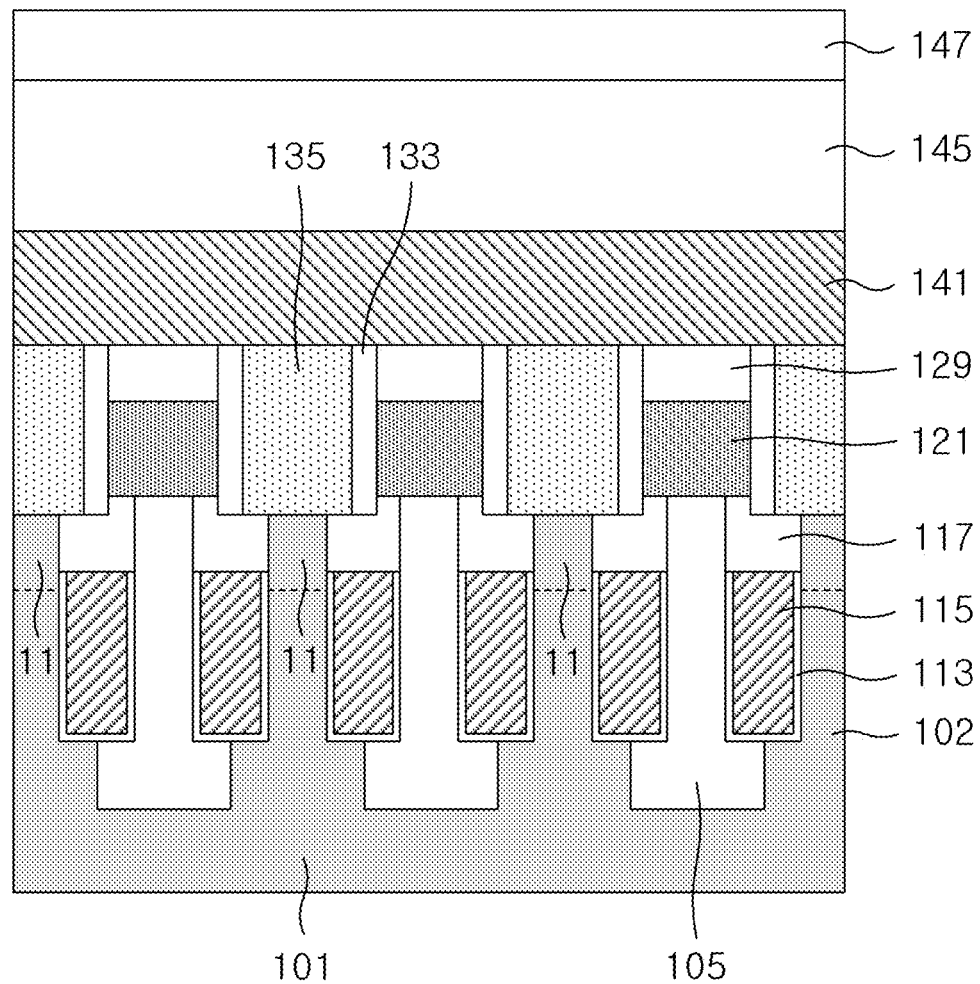

Referring to FIGS. 17A, 17B and 17C, the first interlayer insulating layer 129 and the second interlayer insulating layer 147 may be etched to form the storage node contact hole 151 exposing the sacrificial layer 127. At least one of the storage node contact holes 151 may partially overlap, or not overlap at all with, the second junction region 12.

Figure 18A:
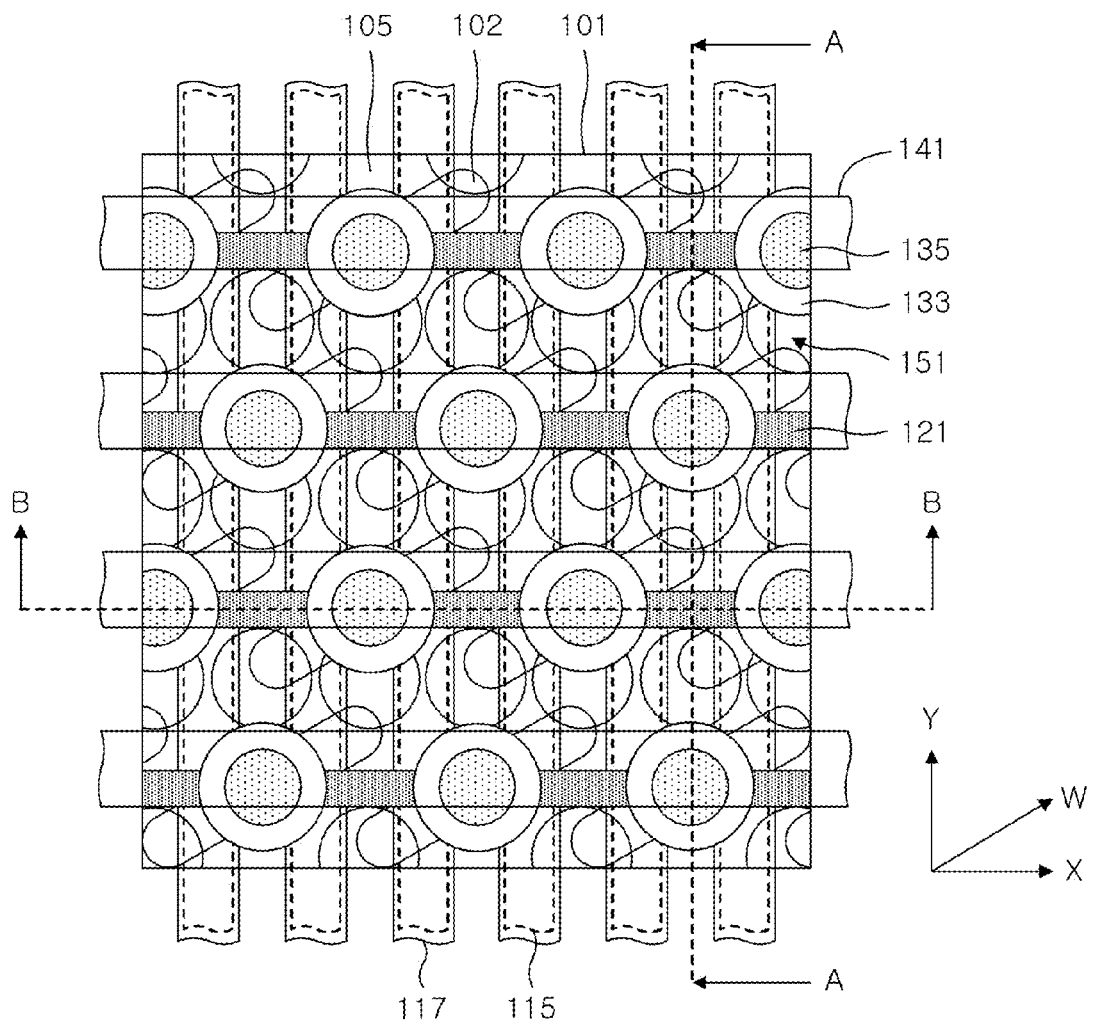
Figure 18B:
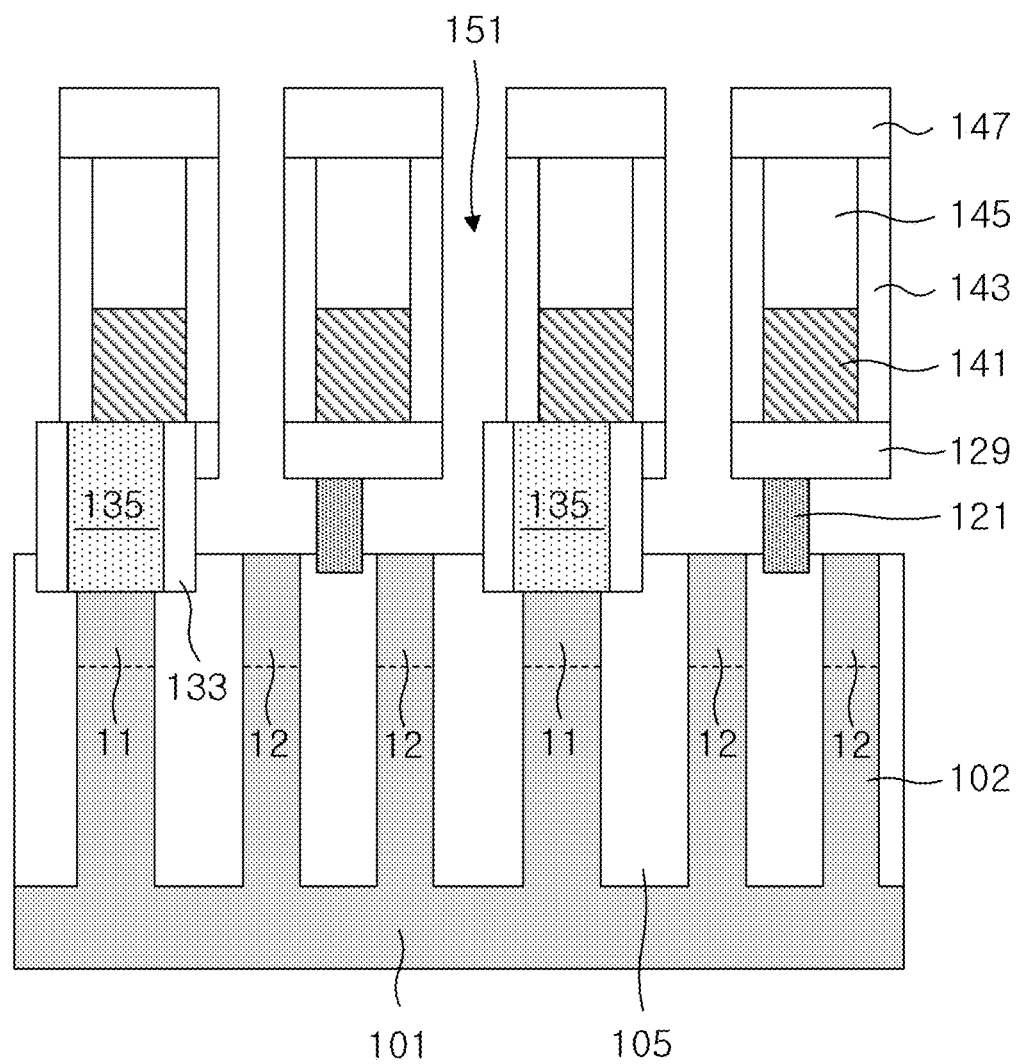
Figure 18C:
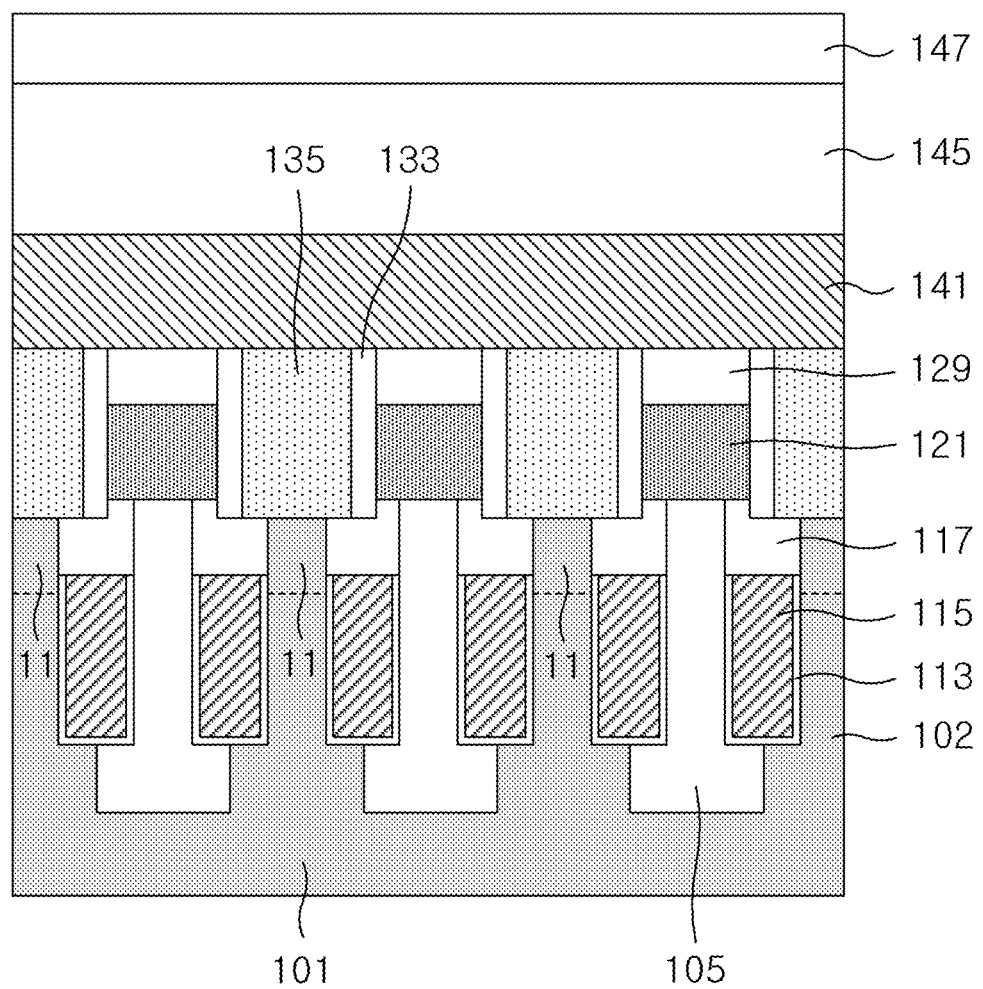

Referring to FIGS. 18A, 18B and 18C, the sacrificial layer 127 and the etch stop layer 125 may be sequentially removed to expand the storage node contact hole 151. In example embodiments, the sacrificial layer 127 may be removed using a wet etching process and the etch stop layer 125 may be removed using a cleaning process. As the result of expanding of the storage node contact hole 151, the second junction region 12 and the device isolation layer 105 adjacent thereto may be exposed.

Figure 19A:
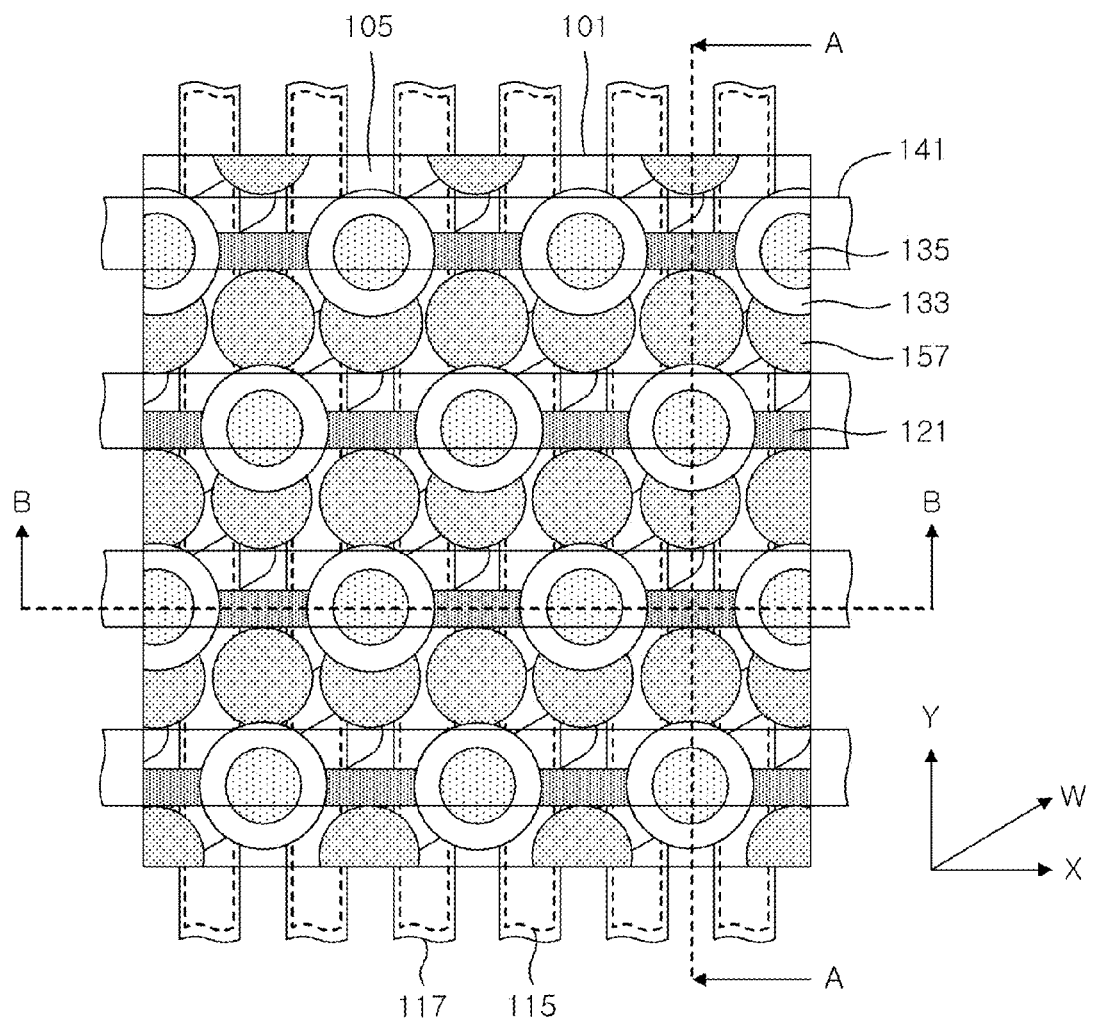
Figure 19B:
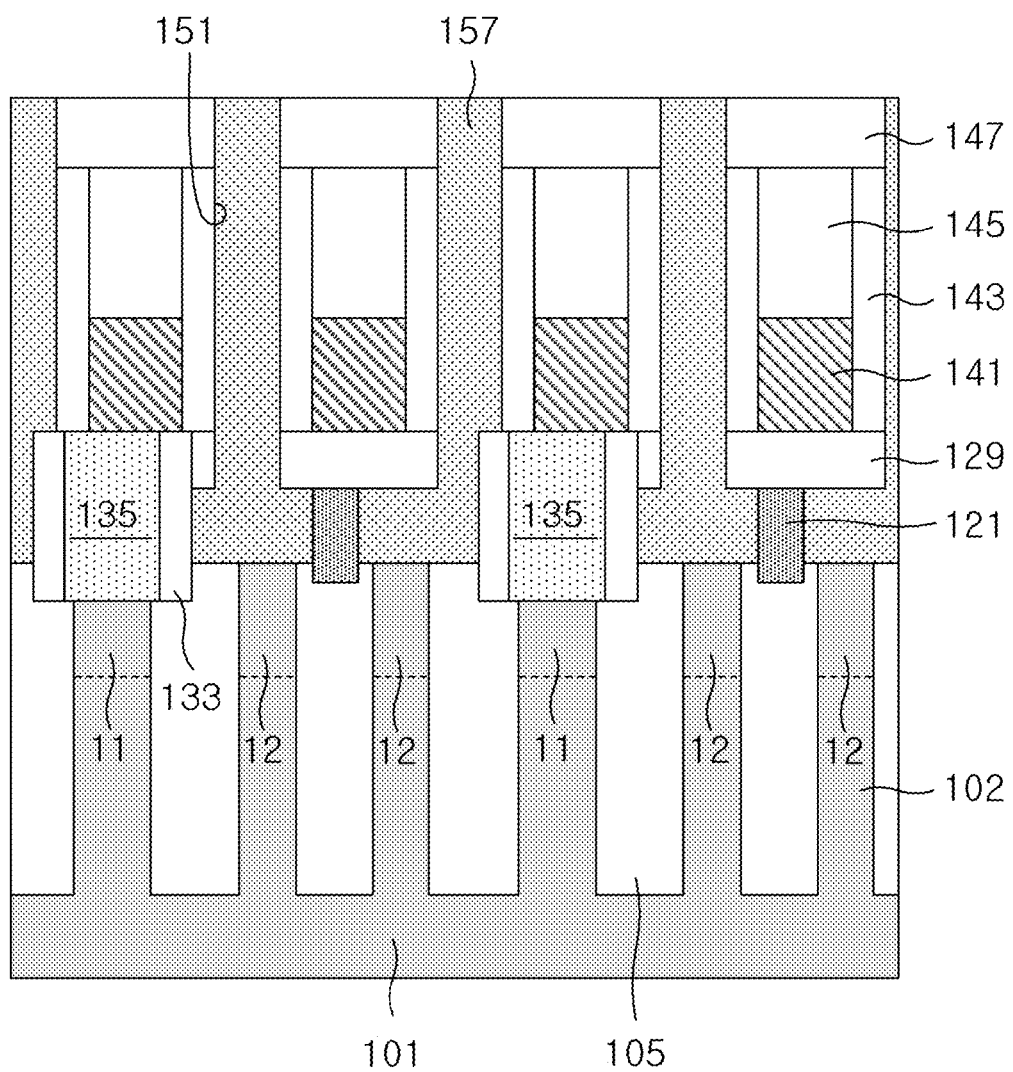
Figure 19C:
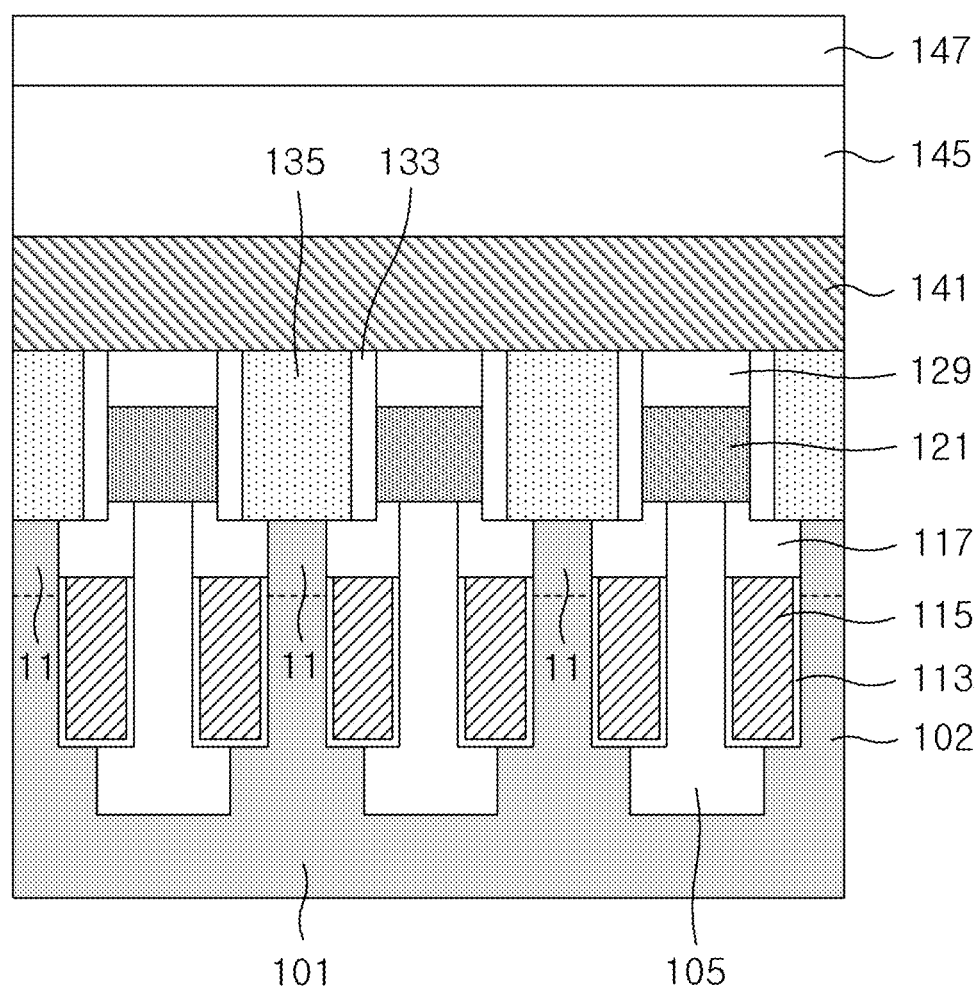

Referring to FIGS. 19A, 19B and 19C, the storage node contact 157 may be formed to fill the expanded storage node contact hole 151. The storage node contact 157 may be formed to have a lower portion having a width greater than that of an upper portion thereof. For example, the storage node contact 157 may be formed to have a bent or non-linear structure, in which central vertical axes of its lower and upper portions are offset to each other.

In other example embodiments, the storage node contact 157 may be formed to have a linear structure, in which central vertical axes of its lower and upper portions are aligned with each other. Even if there is a misalignment of the bit line 141 and/or a misalignment between the storage node contact hole 151 and the second junction region 12, a lower portion of the storage node contact hole 151 can be expanded by the removal of the sacrificial layer 127. Accordingly, the storage node contact 157 can have an expanded lower portion, and this may enable to increase a contact area between the storage node contact 157 and the second junction region 12.

Figure 20A:
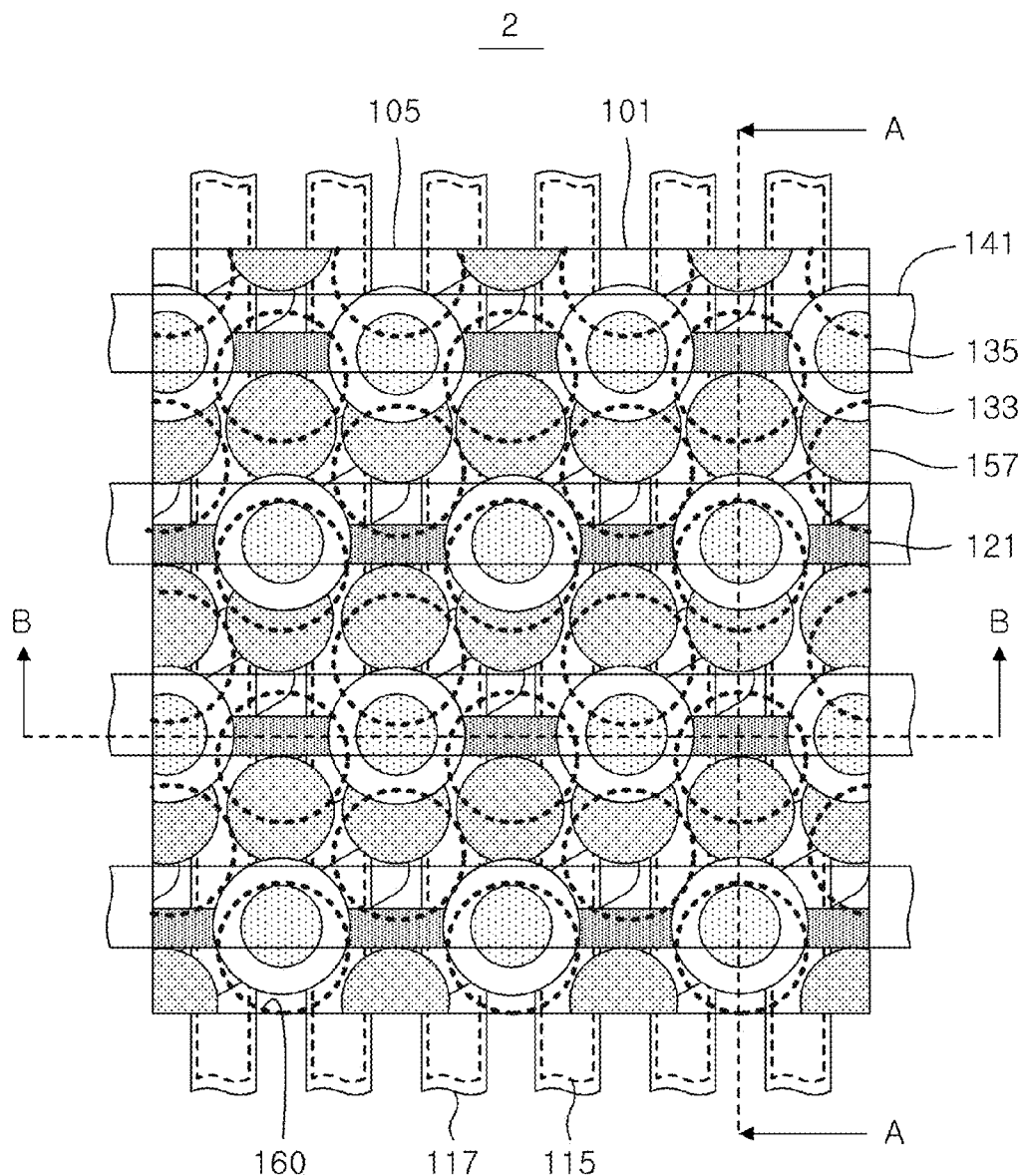
Figure 20B:
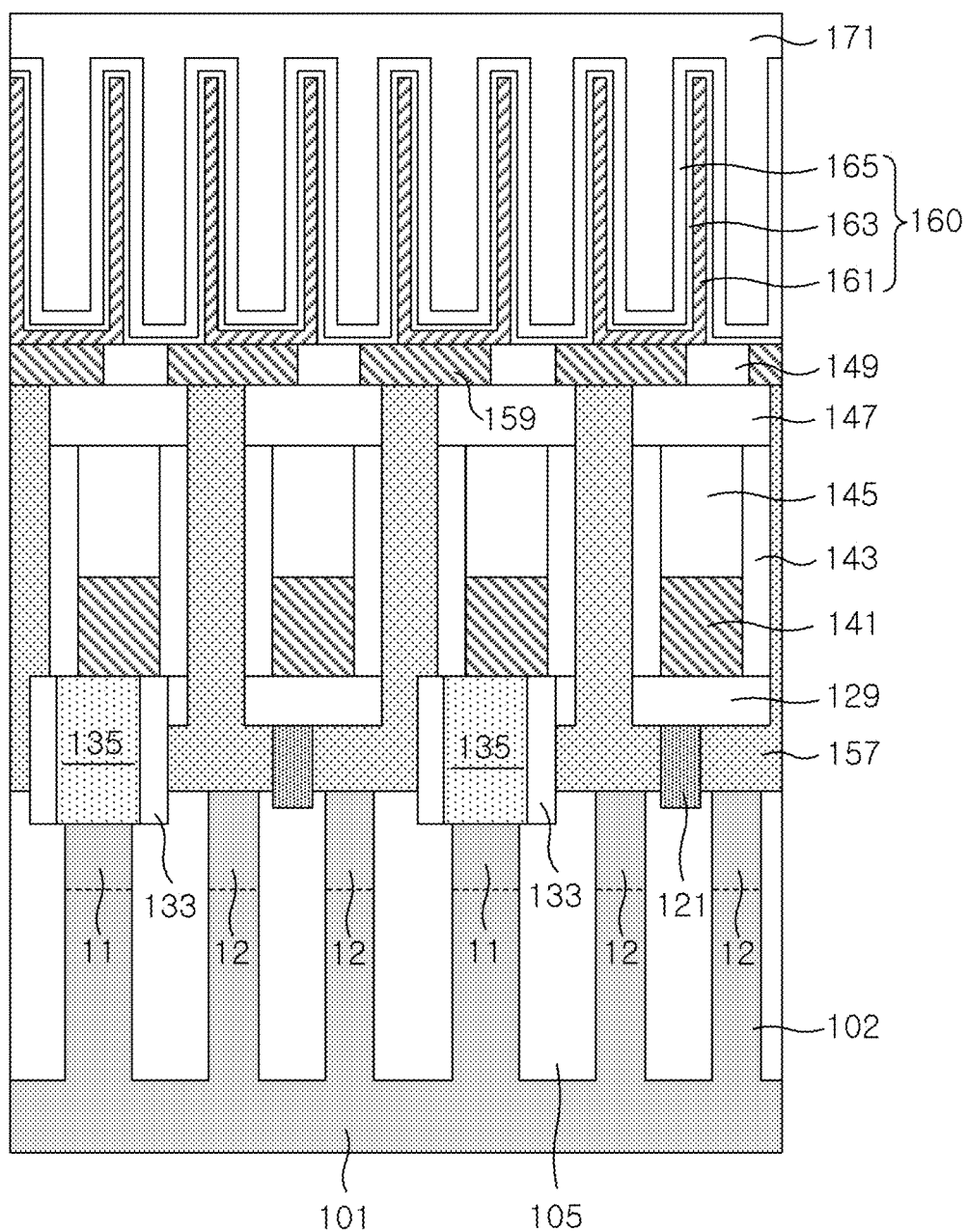
Figure 20C:
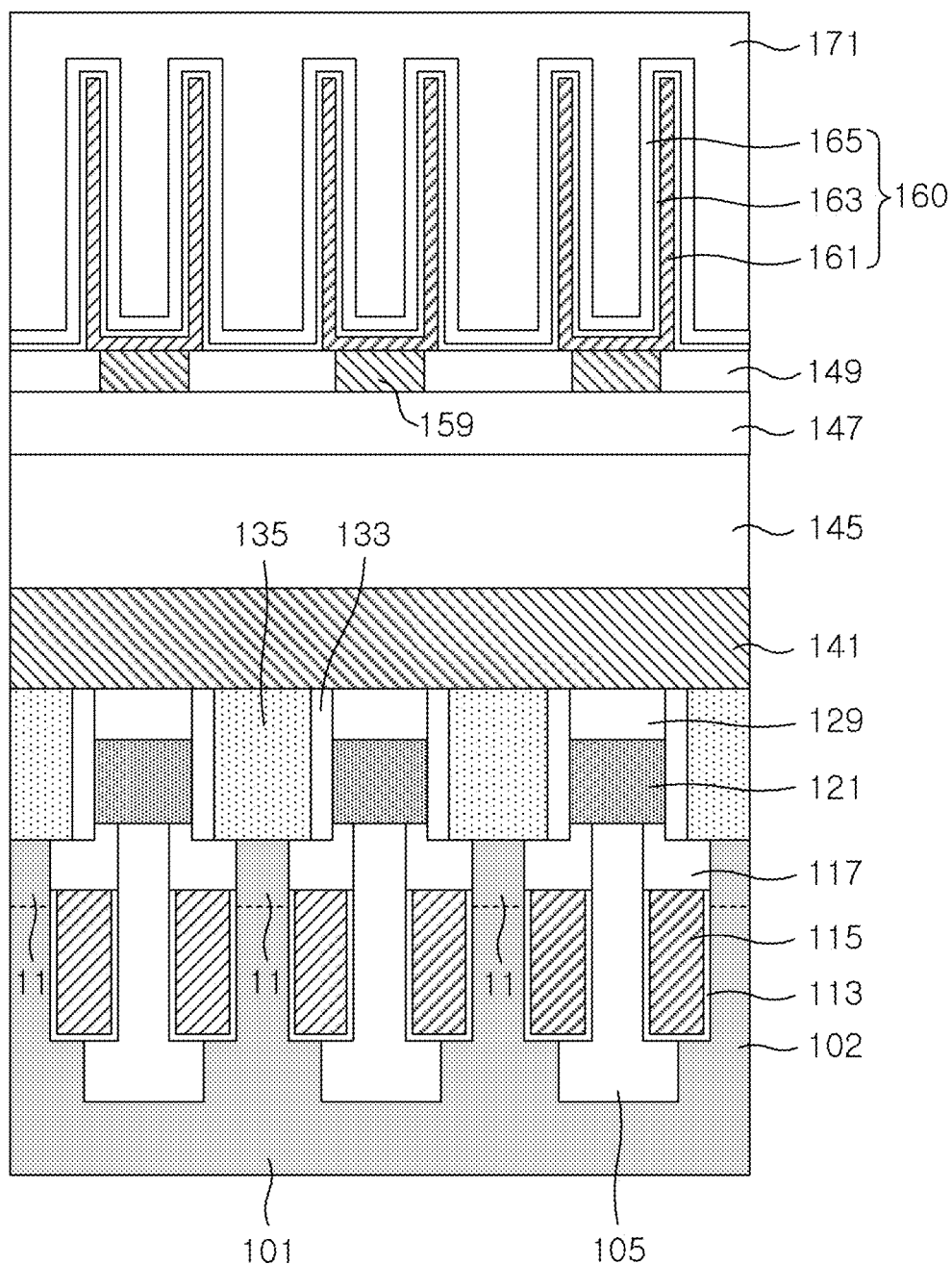

Referring to FIGS. 20A, 20B and 20C, identical or similar to the embodiments described with reference to FIGS. 1A through 15A, the landing pads 159 may be formed to be electrically isolated from each other by the third interlayer insulating layer 149 and the capacitors 160 may be formed to be electrically connected to the storage node contacts 157 via the landing pads 159. The fourth interlayer insulating layer 171 may be formed to cover the capacitors 160. In the present embodiments, even if one or more bit lines 141 are misaligned, a semiconductor device 2 can be fabricated to include the storage node contact 157 being in good contact with the second junction region 12.

[Still Other Example Embodiments]

Figure 21A:
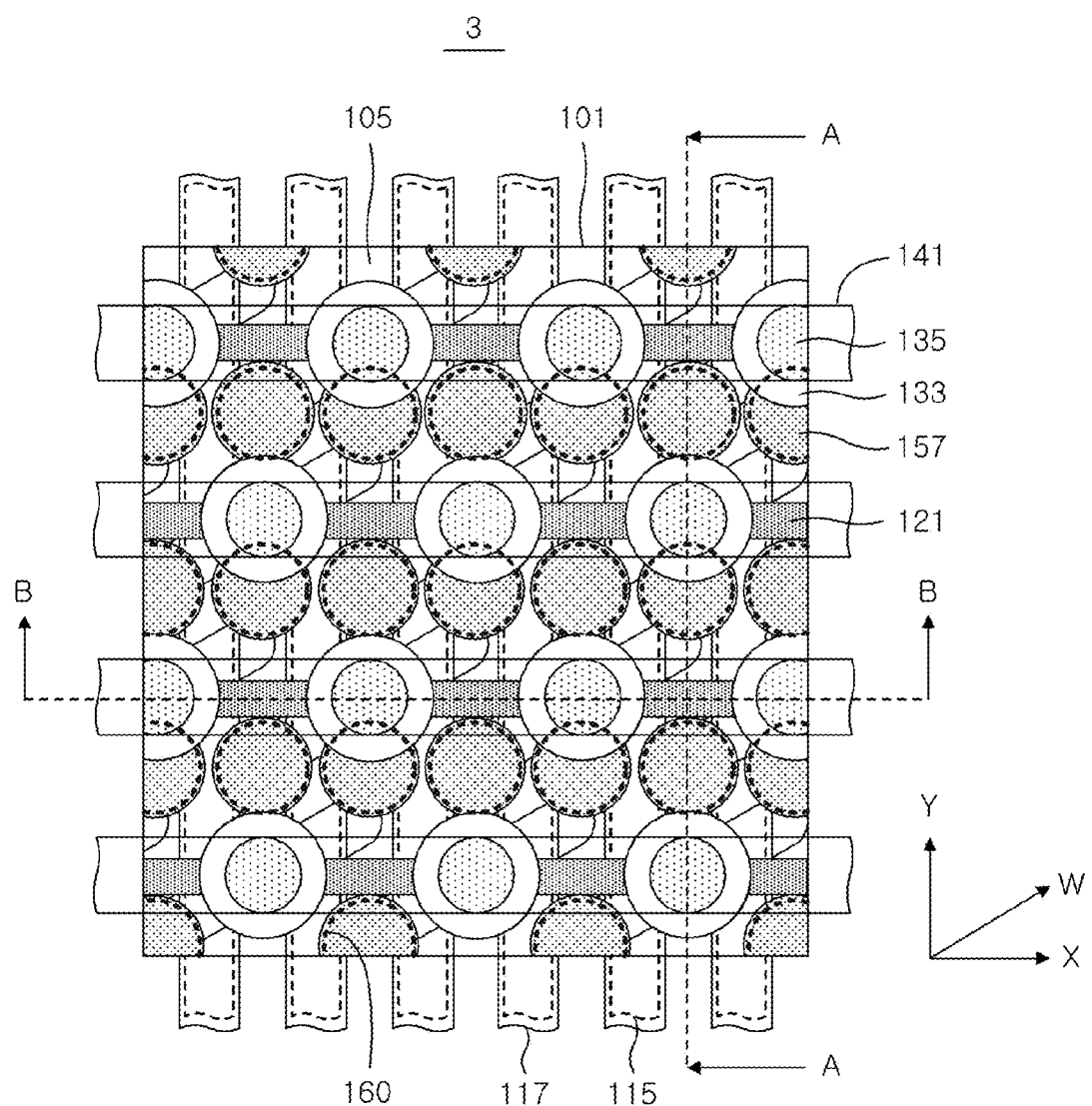
FIG. 21A is a plan view exemplarily illustrating a method of fabricating a semiconductor device according to still other example embodiments of the inventive concept.
Figure 21B:
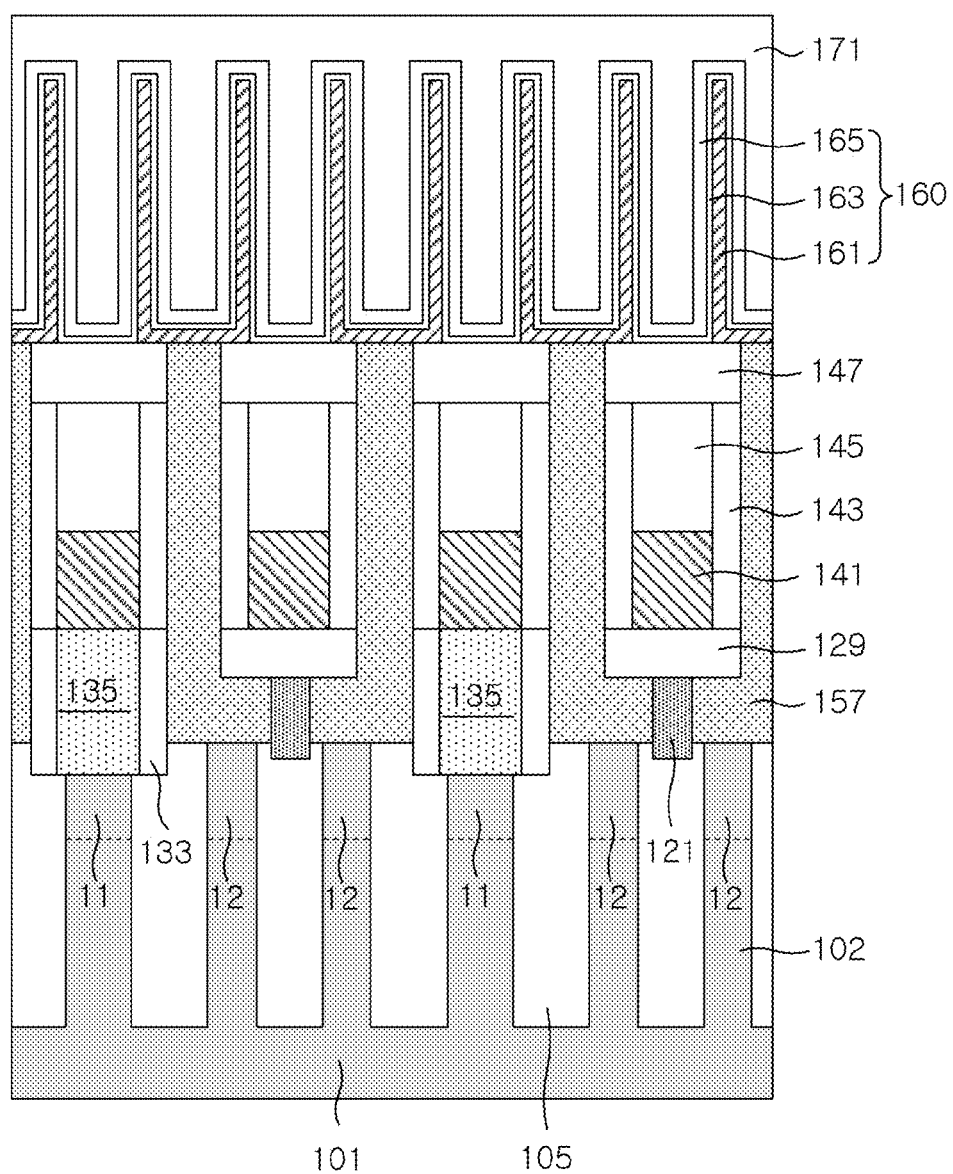
FIG. 21B is a cross-sectional view taken along a line A-A of FIG. 21A.

FIG. 21A is a plan view exemplarily illustrating a method of fabricating a semiconductor device according to still other example embodiments of the inventive concept. FIG. 21B is a cross-sectional view taken along line A-A of FIG. 21A, and FIG. 21C is a cross-sectional view taken along line B-B of FIG. 21A.

Figure 21C:
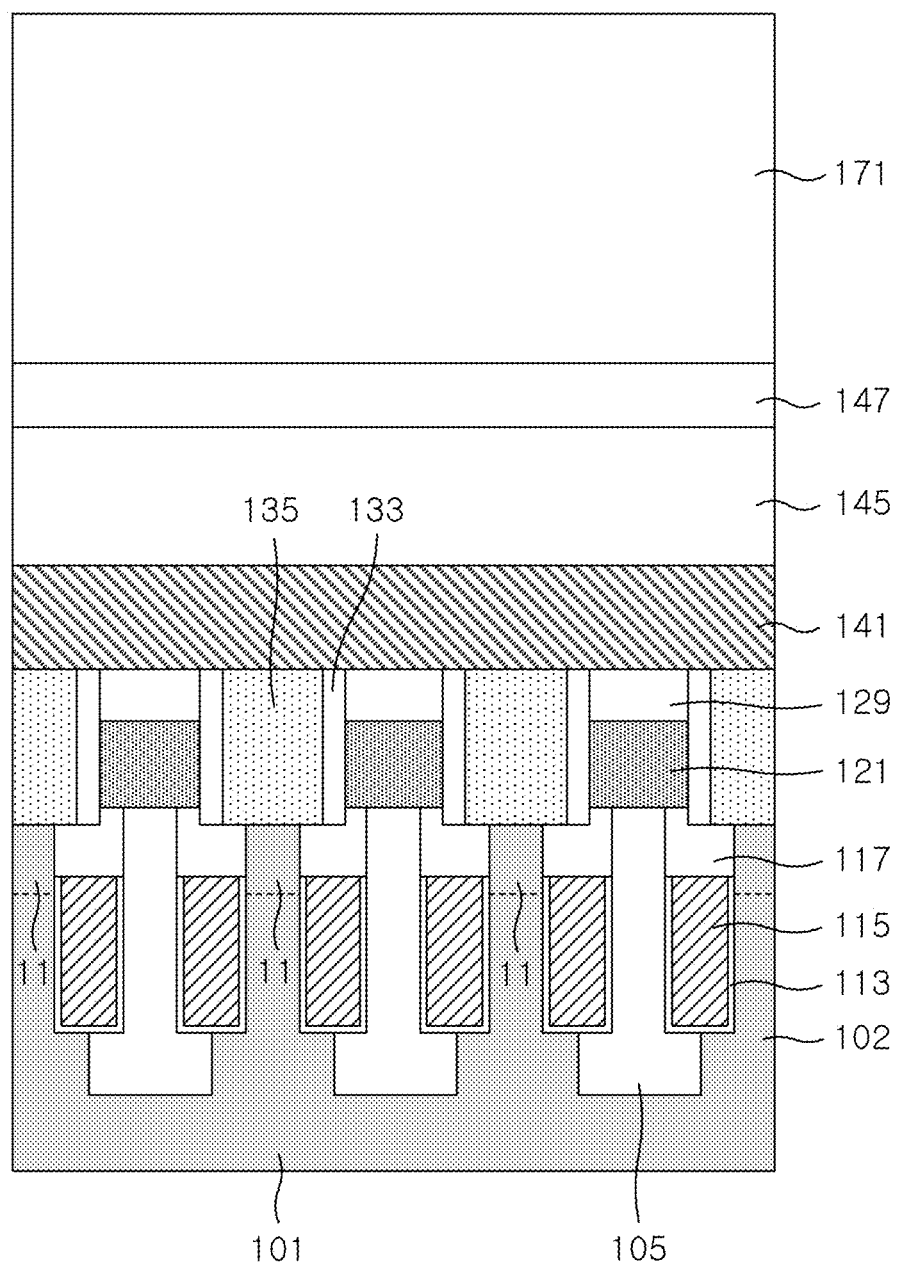
FIG. 21C is a cross-sectional view taken along a line B-B of FIG. 21A.

Referring to FIGS. 21A, 21B and 21C, according to a modification of the embodiments described with reference to FIGS. 15A, 15B and 15C, a semiconductor device 3 may be fabricated to include the capacitor 160 aligned with the storage node contact 157. For the semiconductor device 3, as a result of the alignment between the storage node contact 157 and the capacitor 160, it may not be necessary to form a landing pad for electrically connecting the storage node contact 157 with the capacitor lower electrode 161. Thus, the capacitor lower electrode 161 may be directly coupled to the top surface of the storage node contact 157 without the landing pads 159.

[Other Example Embodiments]

Figure 22A:
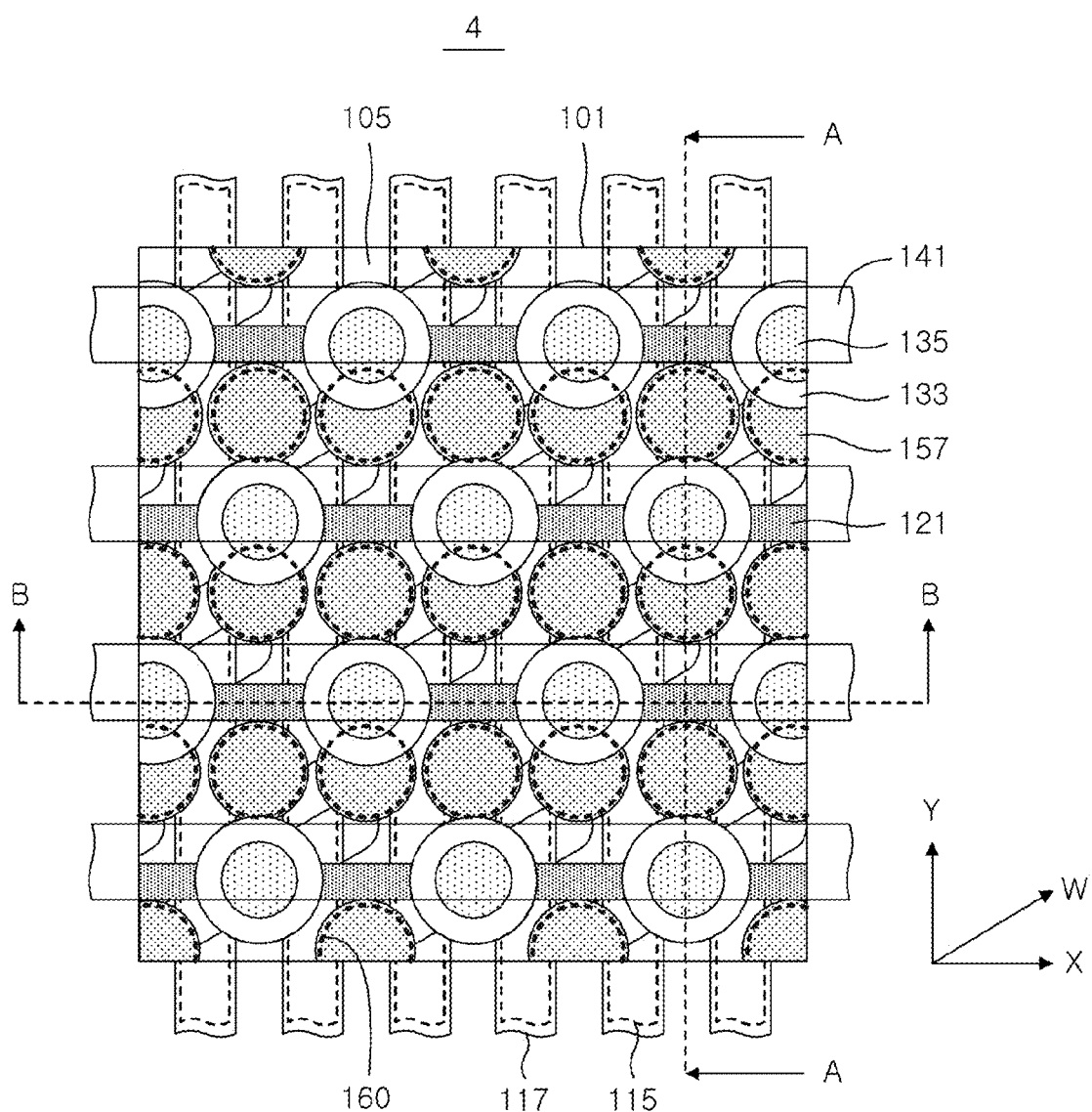
FIG. 22A is a plan view exemplarily illustrating a method of fabricating a semiconductor device according to even other example embodiments of the inventive concept.
Figure 22B:
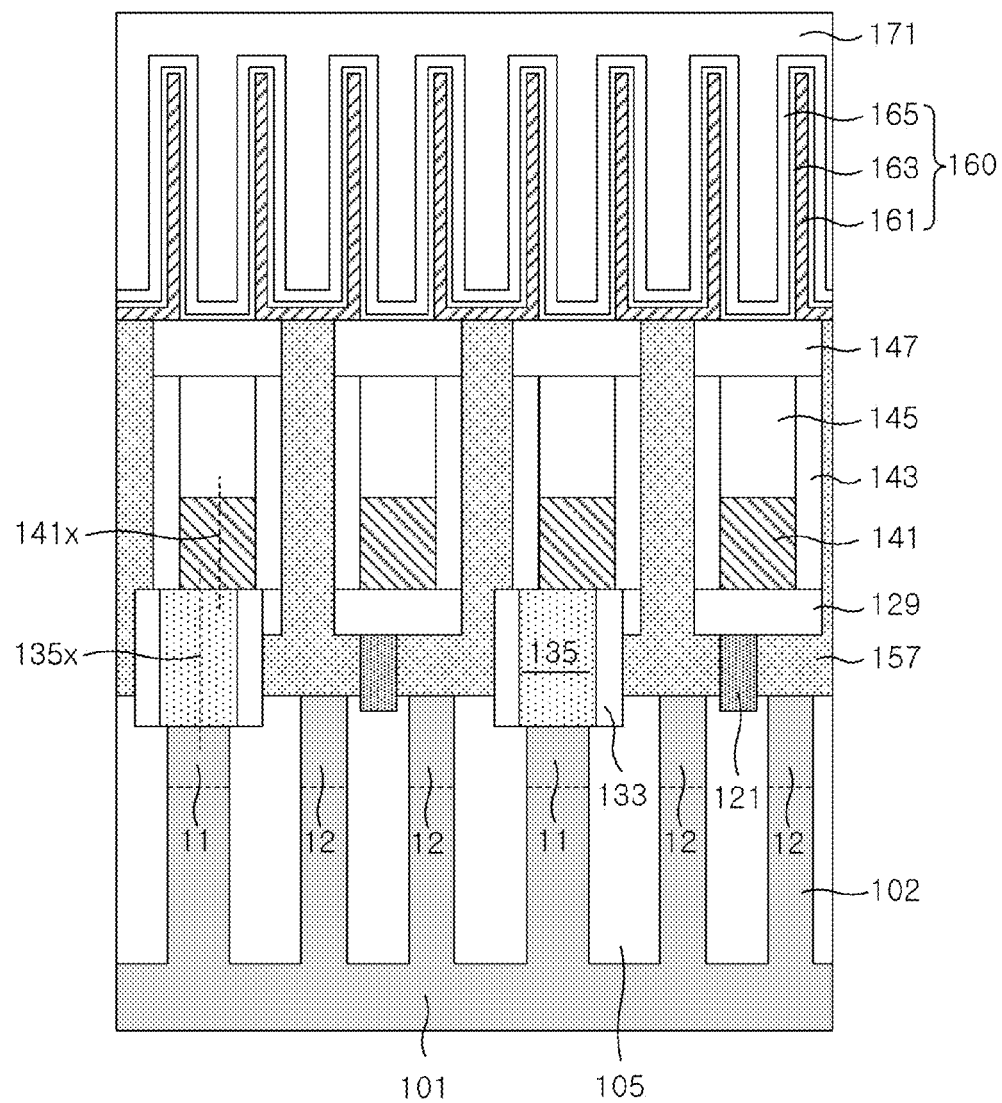
FIG. 22B is a cross-sectional view taken along a line A-A of FIG. 22A.

FIG. 22A is a plan view exemplarily illustrating a method of fabricating a semiconductor device according to some other example embodiments of the inventive concept. FIG. 22B is a cross-sectional view taken along line A-A of FIG. 22A, and FIG. 22C is a cross-sectional view taken along line B-B of FIG. 22A.

Figure 22C:
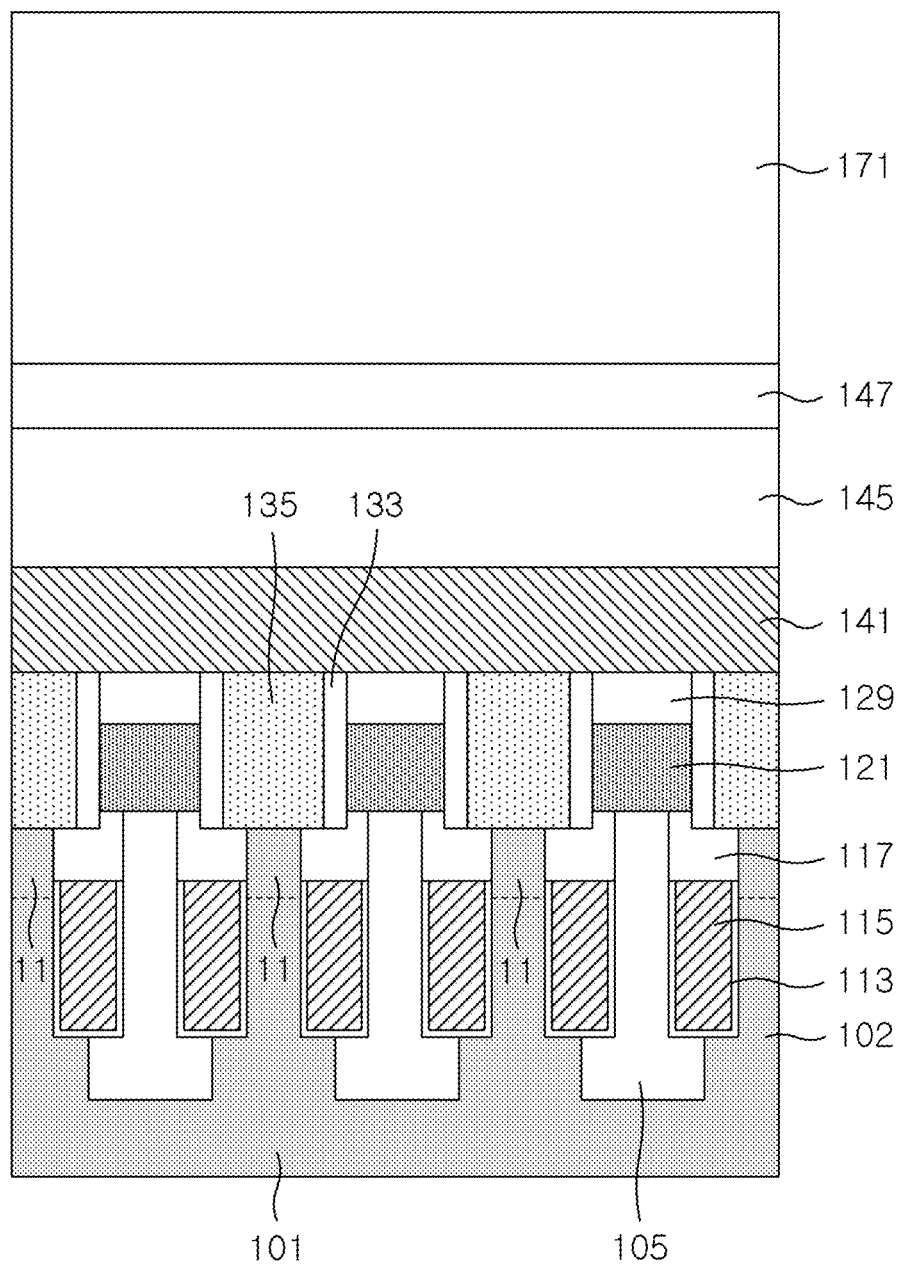
FIG. 22C is a cross-sectional view taken along a line B-B of FIG. 22A.

Referring to FIGS. 22A, 22B and 22C, the bit line 141 may have a central vertical axis 141x misaligned or offset to a central vertical axis 135x of the bit line contact 135. Even if the bit line 141 is misaligned, the storage node contact 157 can be formed to have a sufficiently large contact area with the second junction region 12. The capacitor 160 may be aligned with the storage node contact 157 in plan view. Therefore, there is no necessity to form a landing pad between the storage node contact 157 and the capacitor lower electrode 161. According to the present embodiments, a semiconductor device 4 can be fabricated to include at least one misaligned bit line 141 and the capacitor 160 aligned with the storage node contact 157.

[Yet Other Example Embodiments]

FIGS. 23 through 26 illustrate a method of fabricating a semiconductor device according to yet other example embodiments of the inventive concept and are cross-sectional views taken along line A-A of FIG. 15A. In the present embodiments, cross-sectional views corresponding to FIGS. 23 through 26 (e.g., taken along line B-B of FIG. 15A) may be identical with those of the example embodiments and thus will be omitted.

Figure 23:
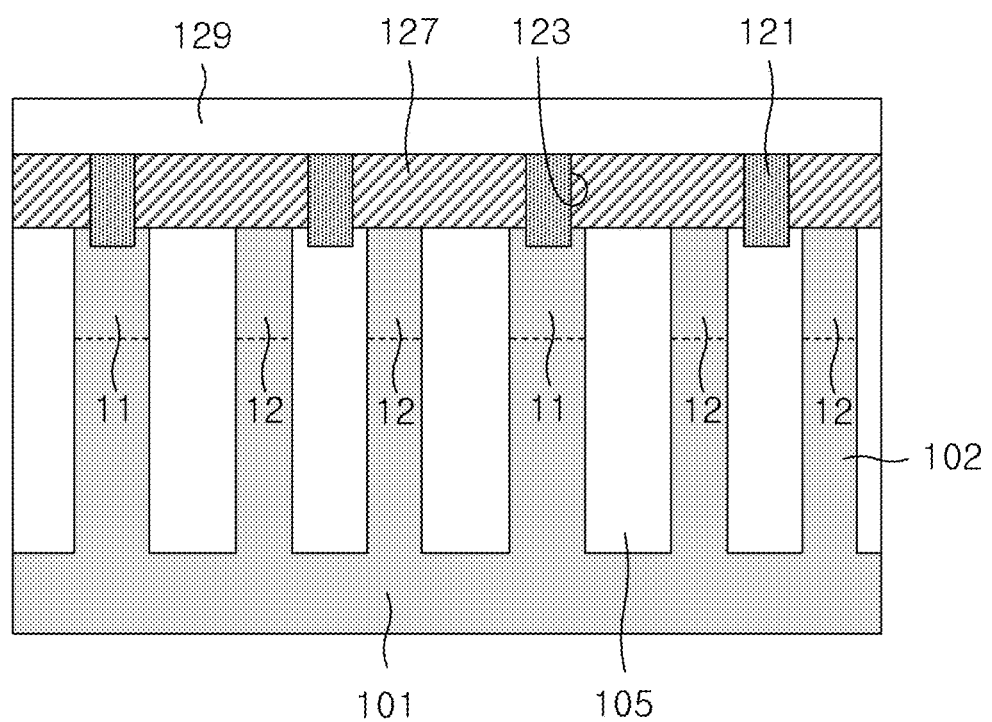
FIGS. 23 through 26 illustrate a method of fabricating a semiconductor device according to yet other example embodiments of the inventive concept and are cross-sectional views taken along the line A-A of FIG. 15A.

Referring to FIG. 23, according to a modification of the embodiments described with reference to FIG. 7B, the lattice region 123 may be filled with the sacrificial layer 127. The sacrificial layer 127 may be formed by depositing and planarizing a conductive material (e.g., doped polysilicon, silicon-germanium, tungsten titanium nitride, or metals) or other suitable materials for forming a sacrificial layer such as undoped polysilicon. In other example embodiments, the sacrificial layer 127 may be formed of an insulating material (e.g., a silicon oxide layer). According to the present embodiment, a process of forming the etch stop layer 125 (e.g., of FIG. 7B) may be omitted. The first interlayer insulating layer 129 may be formed on the substrate 101 to cover the sacrificial layer 127.

Figure 24:
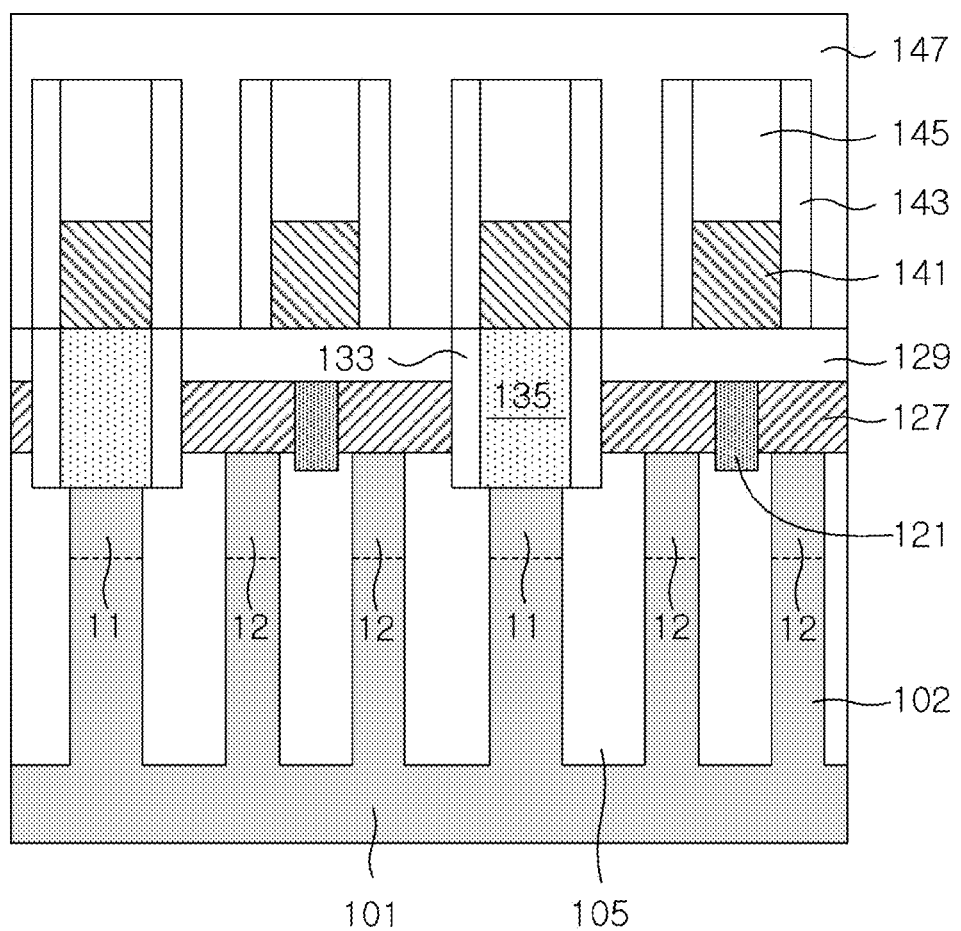

Referring to FIG. 24, a process described with reference to FIGS. 8B, 9B and 10B may be identically or similarly performed to form the bit line contact 135 connected to the first junction region 11 and the bit line 141 connected to the bit line contact 135. For example, an etching process may be performed to form the bit line contact hole 131 exposing the first junction region 11, and the insulating spacer 133 and the bit line contact 135 may be formed in the bit line contact hole 131. A portion of the sacrificial layer 127 overlapped with the first junction region 11 may be removed as the result of the etching process for forming the bit line contact hole 131. A silicon nitride layer may be deposited and patterned to form the bit line capping layer 145 and the bit line spacer 143 covering the bit line 141. Thereafter, a silicon oxide layer may be deposited to form the second interlayer insulating layer 147 covering the bit line 141.

Figure 25:
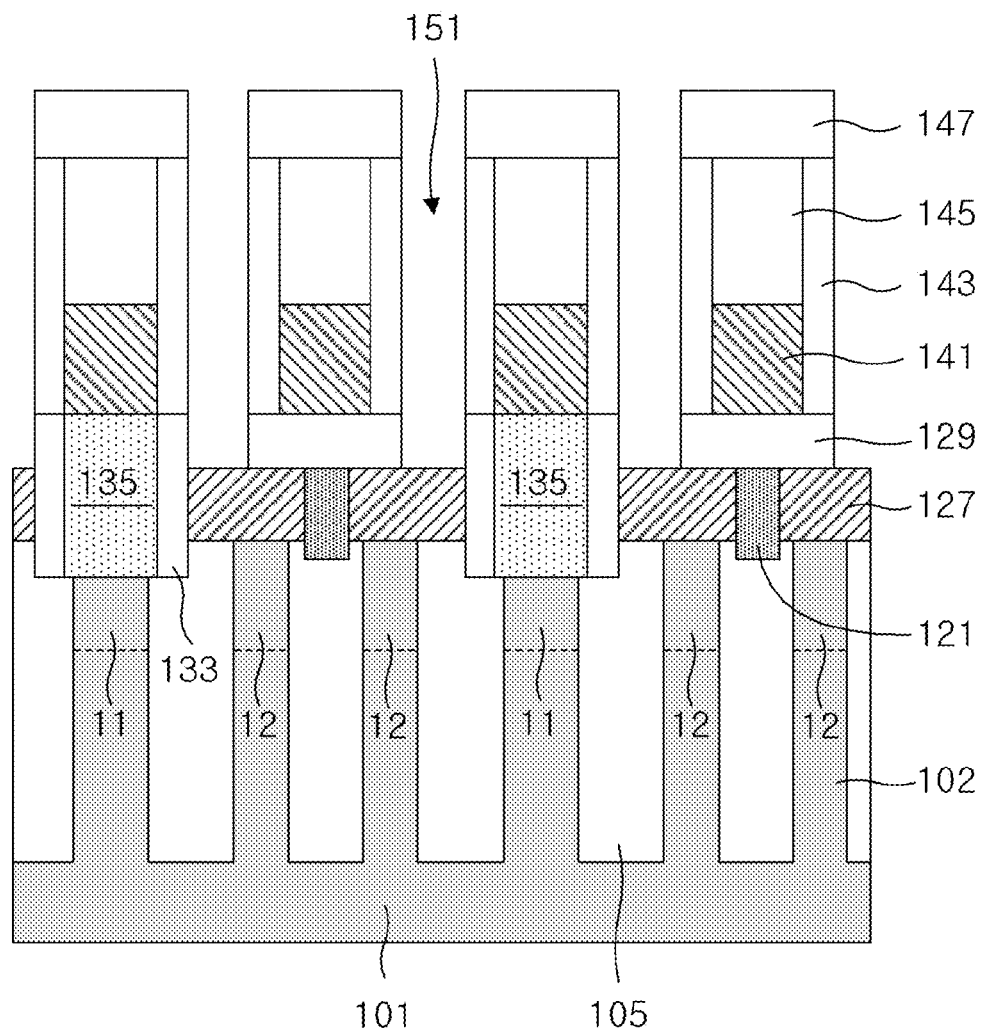

Referring to FIG. 25, a process described with reference to FIG. 11B may be identically or similarly performed to pattern the first interlayer insulating layer 129 and the second interlayer insulating layer 147 and form the storage node contact hole 151 between adjacent ones of the bit lines 141. The sacrificial layer 127 may be exposed by the storage node contact hole 151. The storage node contact hole 151 may have a horizontal width smaller than that of the sacrificial layer 127. The sacrificial layer 127 may be etched by an etchant supplied via the storage node contact hole 151.

Figure 26:
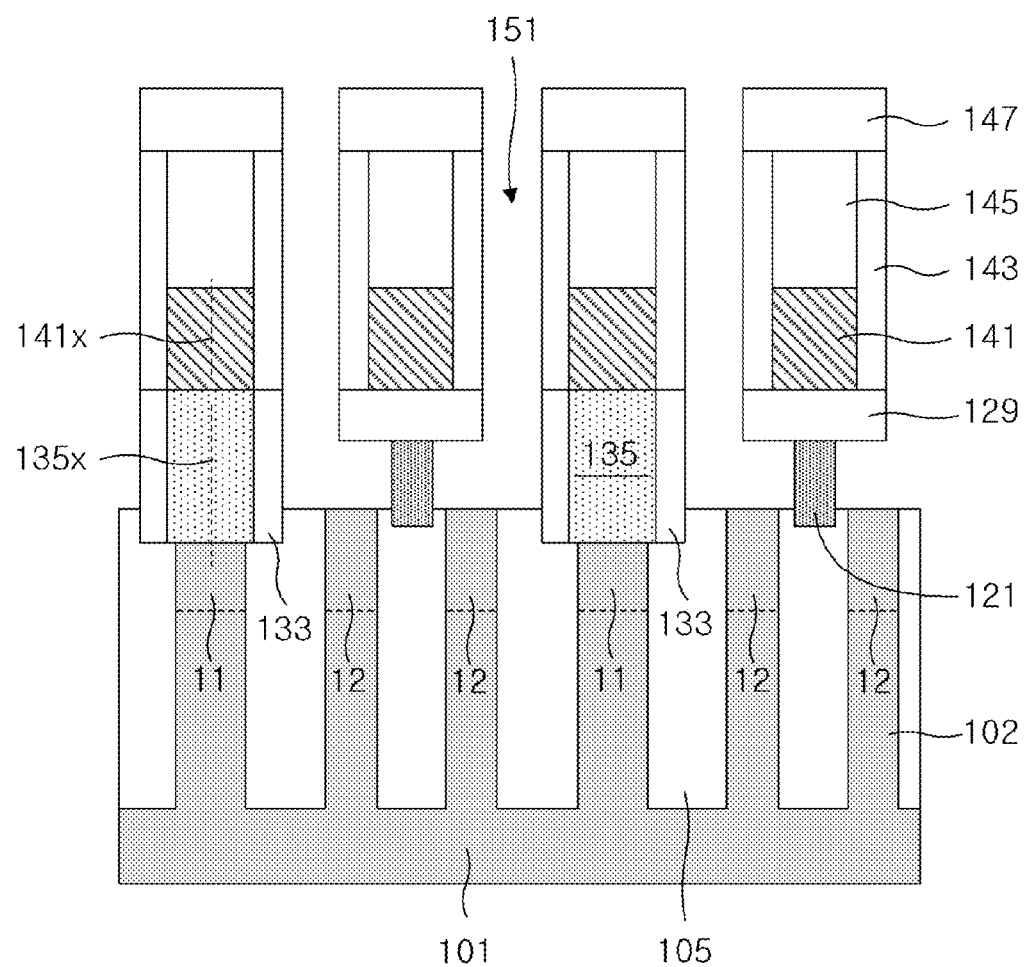

Referring to FIG. 26, if the sacrificial layer 127 is removed during the etching process, the storage node contact hole 151 may include a lower portion expanded to have a width greater than that of an upper portion. During the removal of the sacrificial layer 127, the bit line spacer 143 may protect the bit line 141 against an etching damage. The storage node contact hole 151 may expose the second junction region 12 of the active region 102. Thereafter, a process described with reference to FIGS. 14B and 15B may be identically or similarly performed to form the storage node contact 157 filling the storage node contact hole 151 and to form the landing pad 159 and the capacitor 160 provided thereon, thereby forming the semiconductor device 1 of FIG. 15B. In other example embodiments, as shown in FIG. 21B, the semiconductor device 3 may be fabricated not to have a landing pad. In still other example embodiments, the bit line 141 may have a central vertical axis 141x misaligned to a central vertical axis 135x of the bit line contact 135, similar to the semiconductor device 2 of FIG. 20B or the semiconductor device 4 of FIG. 22B.

[Further Example Embodiments]

Figure 27:
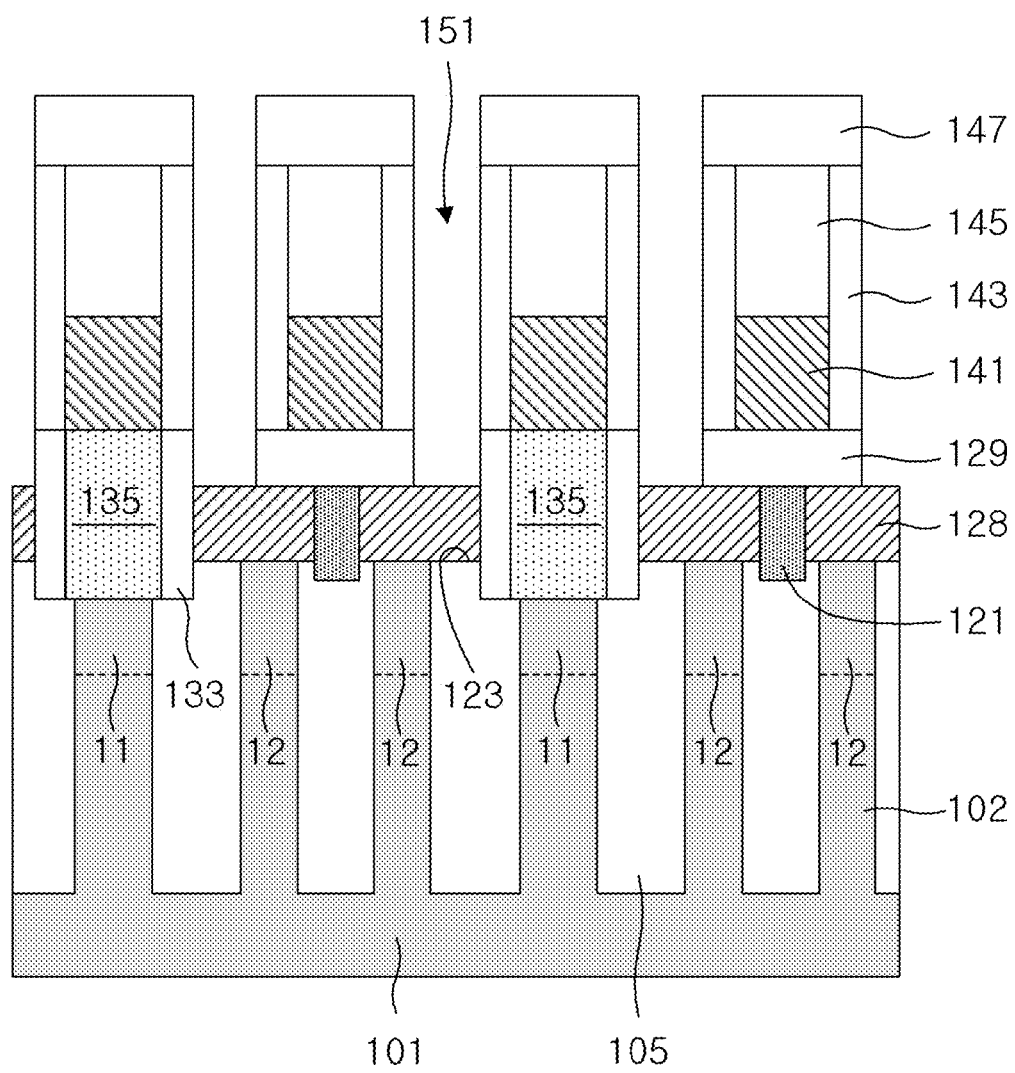
FIGS. 27 through 29 illustrate a method of fabricating a semiconductor device according to further example embodiments of the inventive concept and are cross-sectional views taken along the line A-A of FIG. 15A.
Figure 28:
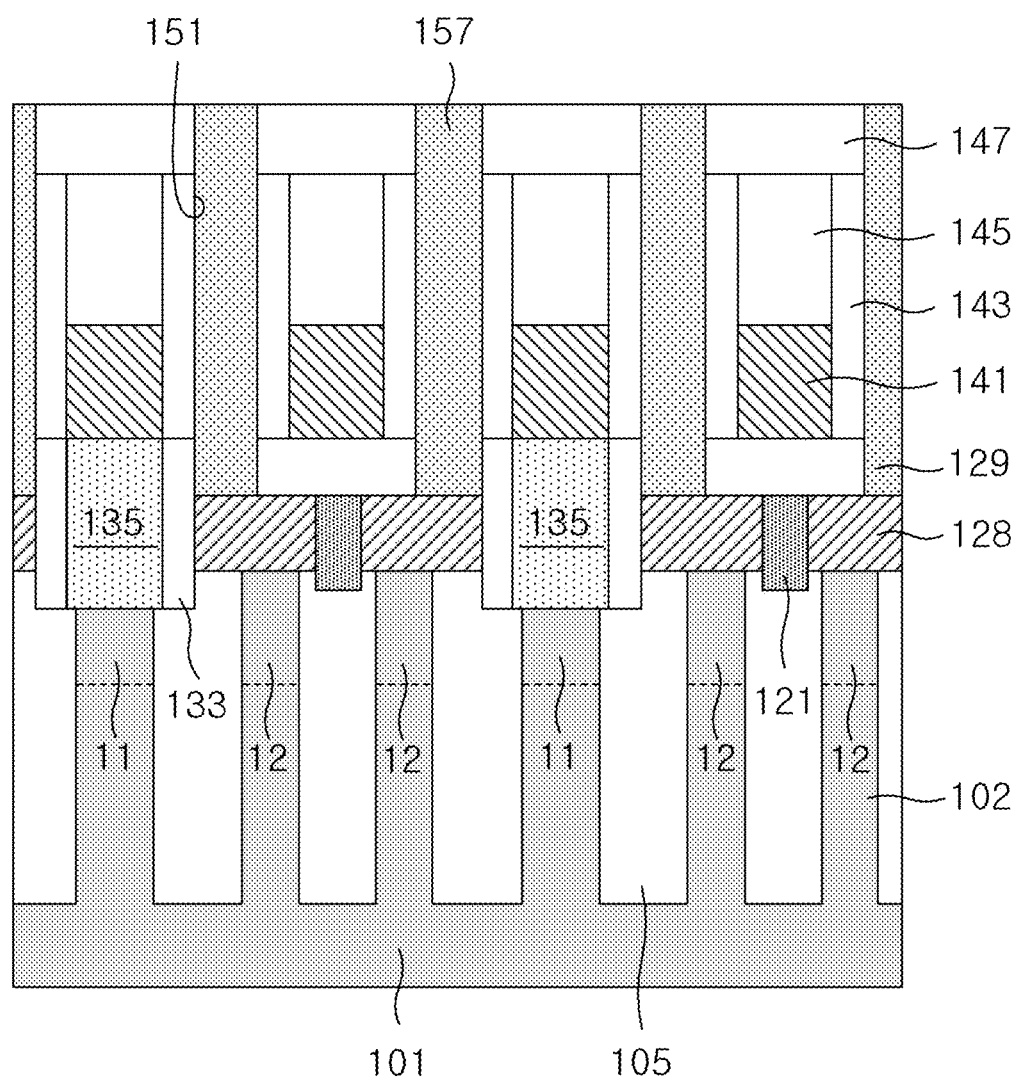
Figure 29:
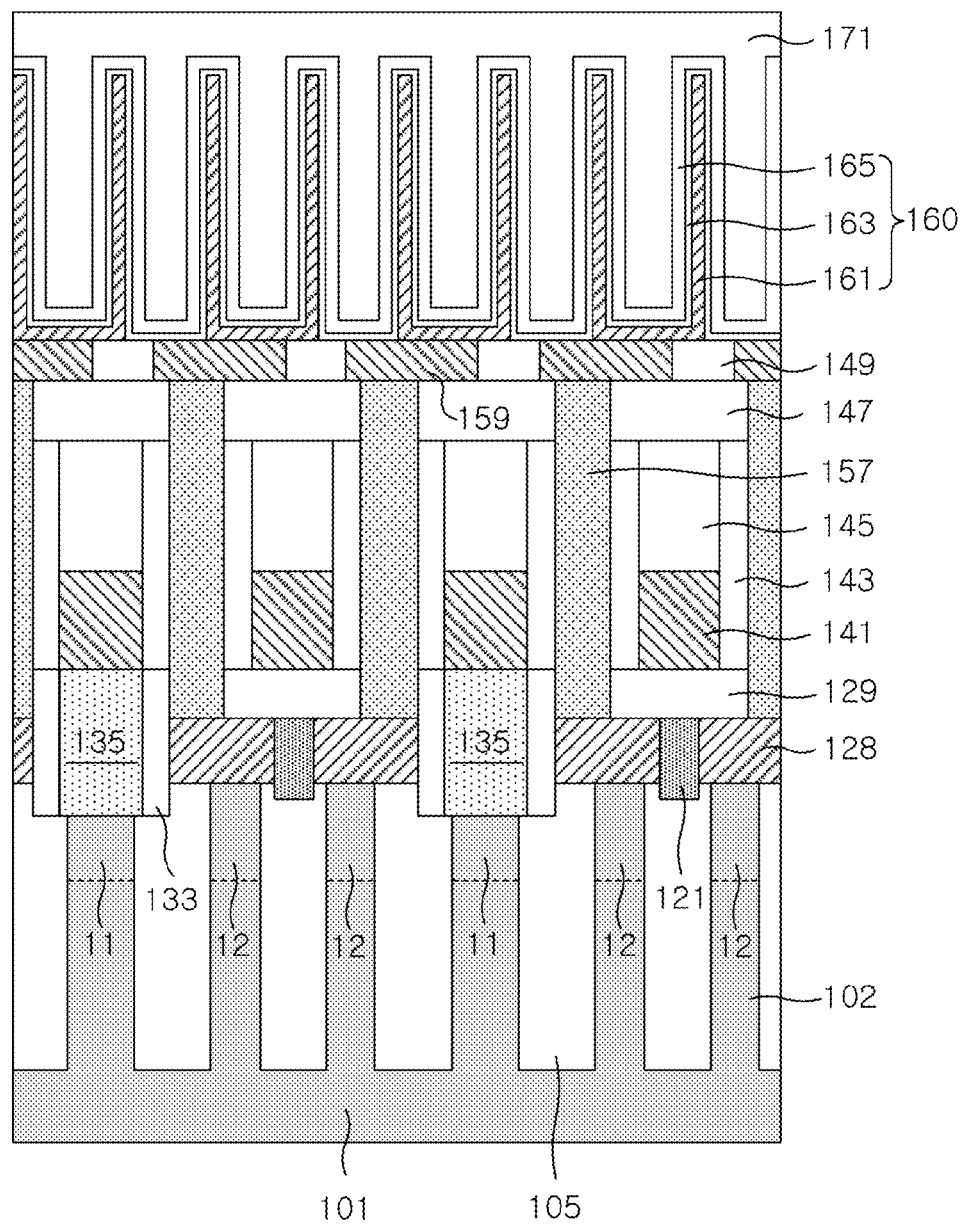

FIGS. 27 through 29 illustrate a method of fabricating a semiconductor device according to further example embodiments of the inventive concept and are cross-sectional views taken along the line A-A of FIG. 15A. In the present embodiments, cross-sectional views corresponding to FIGS. 27 through 29 (e.g., taken along the line B-B of FIG. 15A) may be identical with those of the example embodiments and thus will be omitted.

Referring to FIG. 27, according to a modification of the embodiments described with reference to FIG. 23, a conductive layer 128 may be formed to fill the lattice region 123. For example, the conductive layer 128 may be formed by depositing a conductive material (e.g., polysilicon, silicon-germanium, tungsten titanium nitride, or metals) to fill the lattice region 123 and then planarizing the conductive material. Thereafter, the bit line 141 may be formed to be in contact with the bit line contact 135, and the storage node contact hole 151 may be formed to expose the conductive layer 128 between adjacent ones of the bit lines 141.

Referring to FIG. 28, another conductive layer serving as the storage node contact 157 may be formed to fill the storage node contact hole 151. In example embodiments, the conductive layer 128 may be used as a part of a storage node pad. The contact area of the conductive layer 128 with the second junction region 12 may be greater than that of the storage node contact 157, and this may reduce a contact resistance between the storage node contact 157 and the second junction region 12. In the present embodiment, the storage node contact 157 and the conductive layer 128 may be coupled with each other, thereby serving as a single storage node contact.

Referring to FIG. 29, a process described with reference to FIG. 15B may be identically or similarly performed to form the capacitor lower electrode 161 connected to the storage node contact 157 and form the capacitor 160 including the capacitor dielectric 163 and the capacitor upper electrode 165. In example embodiments, the landing pad 159 may be further formed between the capacitor lower electrode 161 and the storage node contact 157. A semiconductor device 5 may be fabricated by using the afore-described fabricating method. In other example embodiments, the semiconductor device 5 may be fabricated not to include the landing pad 159. At least one of the bit lines 141 may be misaligned to the bit line contact 135 as shown in FIG. 22B.

[Still Further Example Embodiments]

FIGS. 30A through 39A illustrate a method of fabricating a semiconductor device according to still further example embodiments of the inventive concept. FIGS. 30A through 39A are cross-sectional views taken along line A-A of FIG. 15A, and FIGS. 30B through 39B are cross-sectional views taken along line B-B of FIG. 15A. FIG. 33C is a cross-sectional view taken along line C-C of FIG. 4A, and FIG. 34C is a cross- cross-sectional view taken along line C-C of FIG. 6A.

Figure 30A:
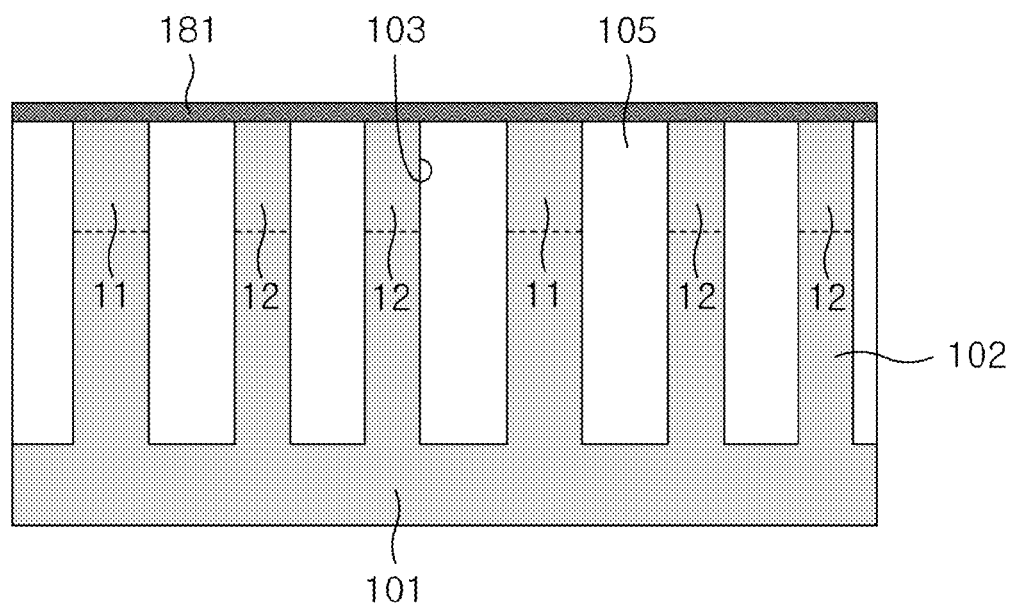
Figure 30B:
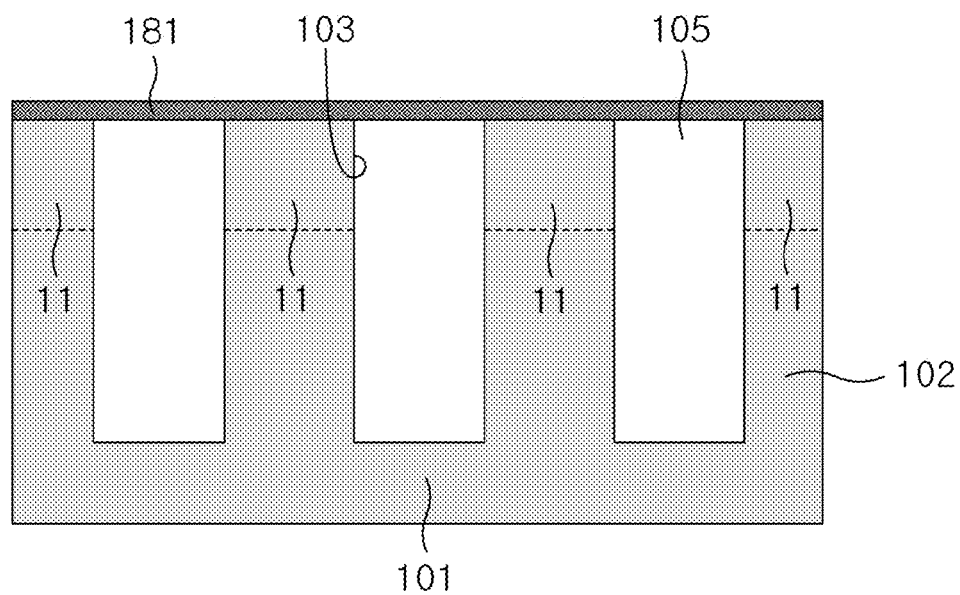

Referring to FIGS. 30A and 30B, the device isolation layer 105 may be formed in the substrate 101 to fill the trench 103 defining the active region 102. Impurities may be injected to the upper portion of the active region 102 to form the first junction region 11 and the second junction region 12. Next, a conductive layer 181 may be formed on the substrate 101 to cover the active region 102 and the device isolation layer 105. The conductive layer 181 may be formed by depositing a conductive material (e.g., doped or undoped polysilicon, silicon-germanium, tungsten titanium nitride, or metals). The conductive layer 181 may be formed to have a thickness of about 5-300 Å. As shown in FIG. 1A, the active region 102 may be formed to have an island shape elongated along the W-direction.

Figure 31A:
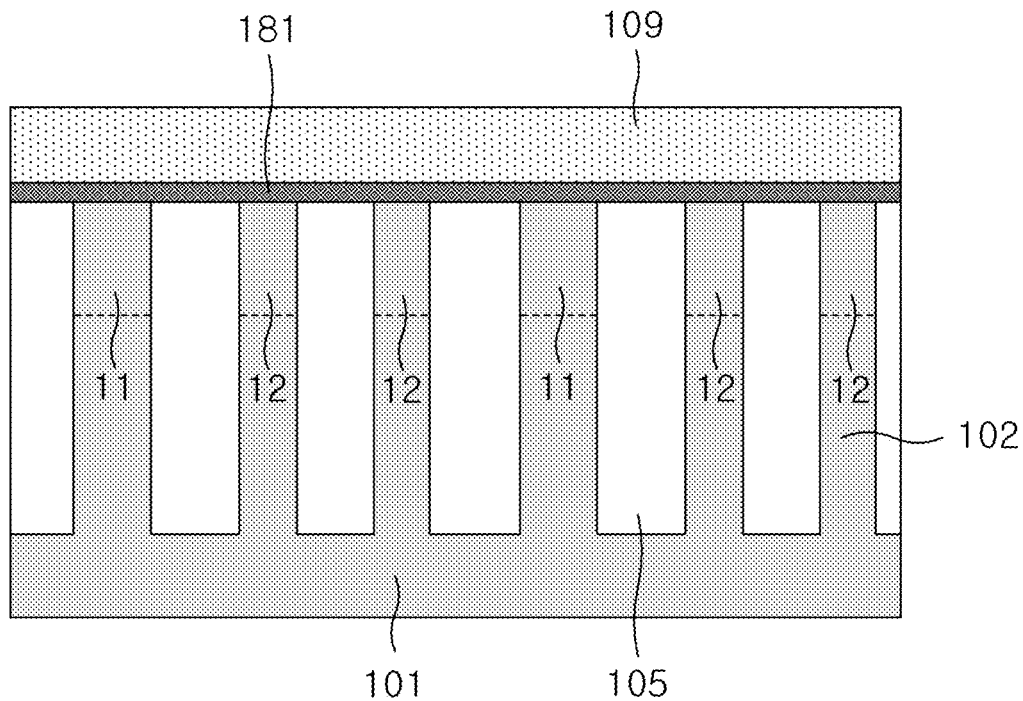
Figure 31B:
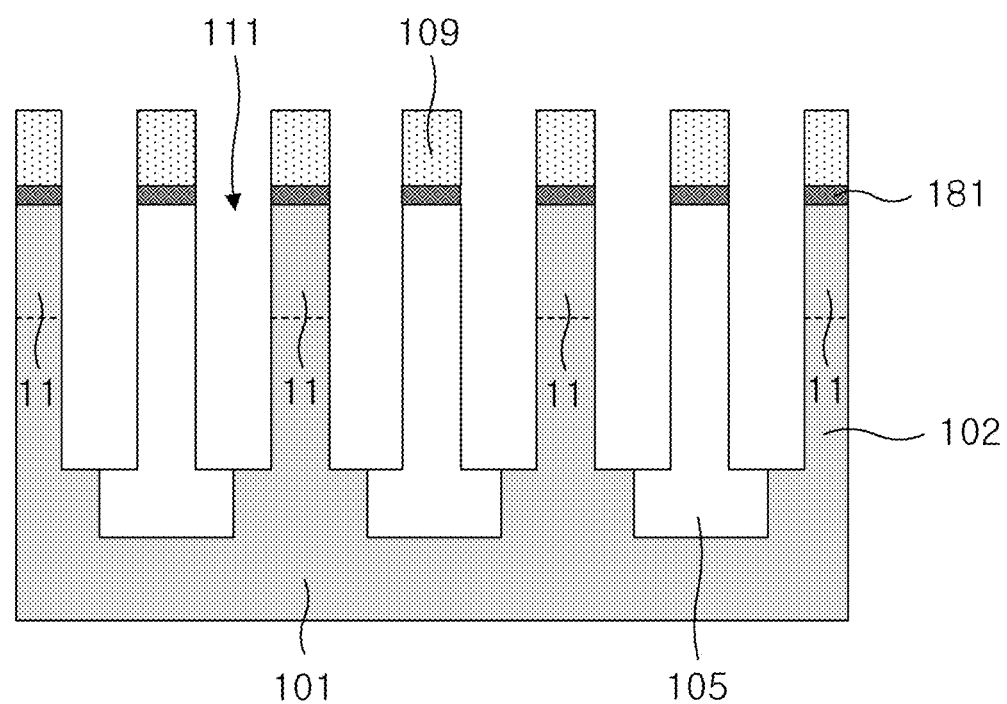

Referring to FIGS. 31A and 31B, the mask pattern 109 having a linear shape may be formed on the conductive layer 181. The mask pattern 109 may be formed by depositing and patterning, for example, a silicon oxide layer or a silicon nitride layer. The mask pattern 109 may be formed to have a height of about 50-1000 Å. The conductive layer 181 and the substrate 101 may be patterned using the mask pattern 109 as an etch mask to form the first groove 111. As shown in FIG. 2A, the mask pattern 109 may extend along the Y-direction, and the first groove 111 may extend along the Y-direction between the mask patterns 109.

Figure 32A:
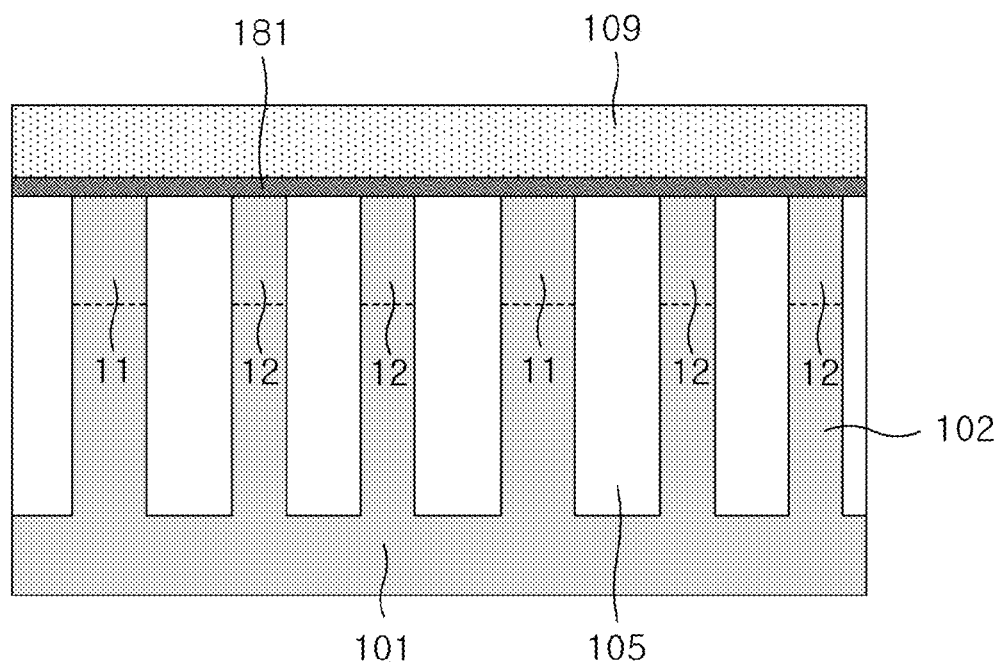
Figure 32B:
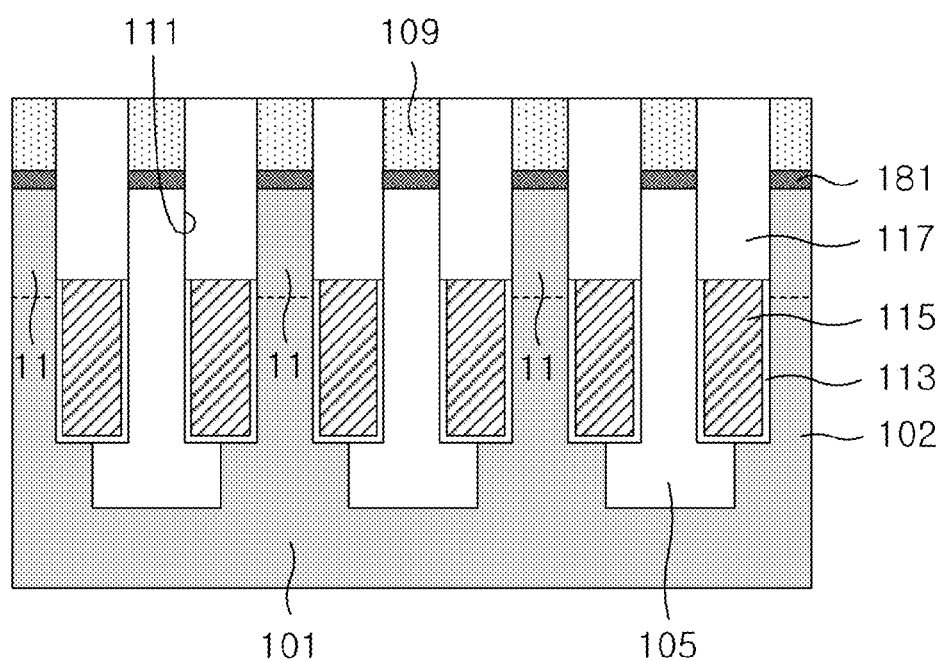

Referring to FIGS. 32A and 32B, the gate insulating layer 113, the word line 115, and the word line capping layer 117 may be formed in the first groove 111. For example, the word line capping layer 117 may be formed by depositing, e.g., a silicon nitride layer, and then, planarizing the silicon nitride layer to expose the mask pattern 109. As a result, the word line capping layer 117 may protrude upward from the top surface of the active region 102, and the top surface of the word line capping layer 117 may be substantially coplanar with the top surface of the mask pattern 109. The word line 115 and the word line capping layer 117 may extend along the Y-direction, as shown in FIG. 3A.

Figure 33A:
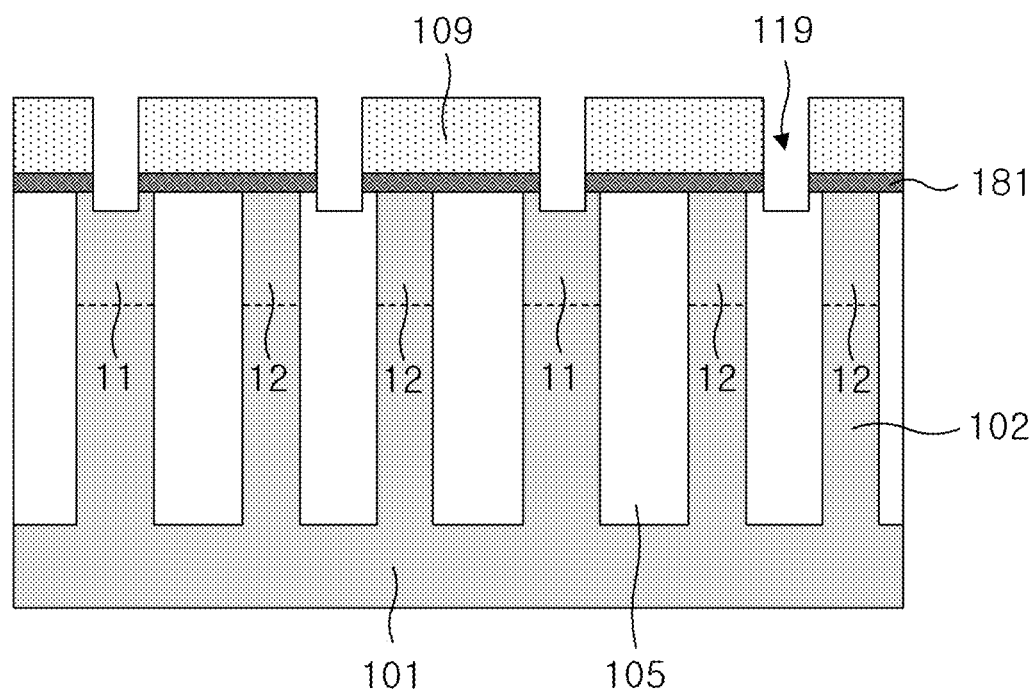
Figure 33B:
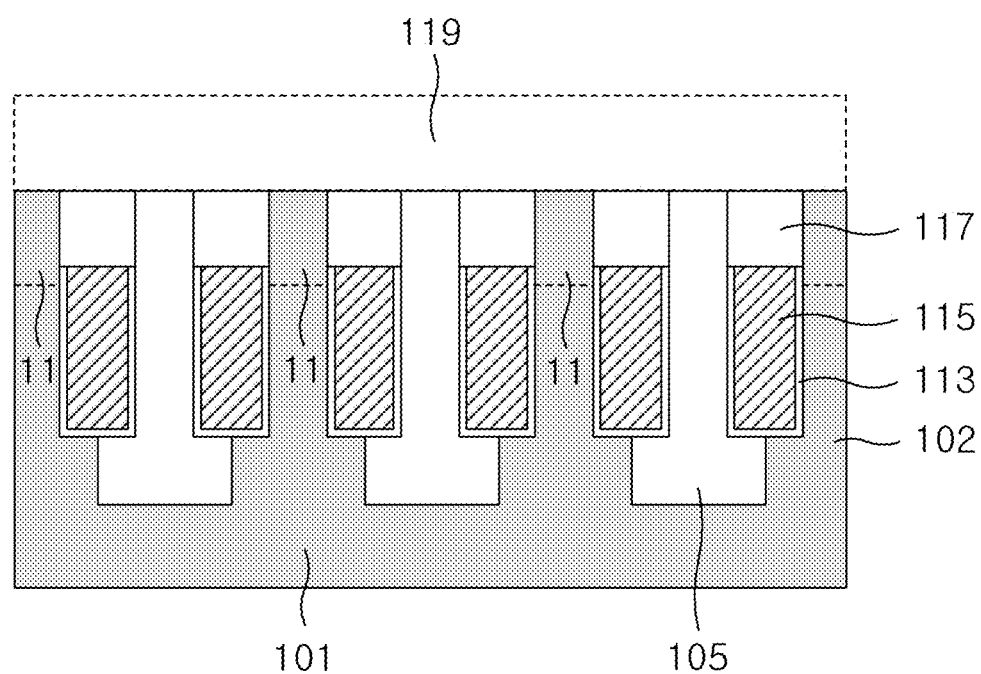
Figure 33C:
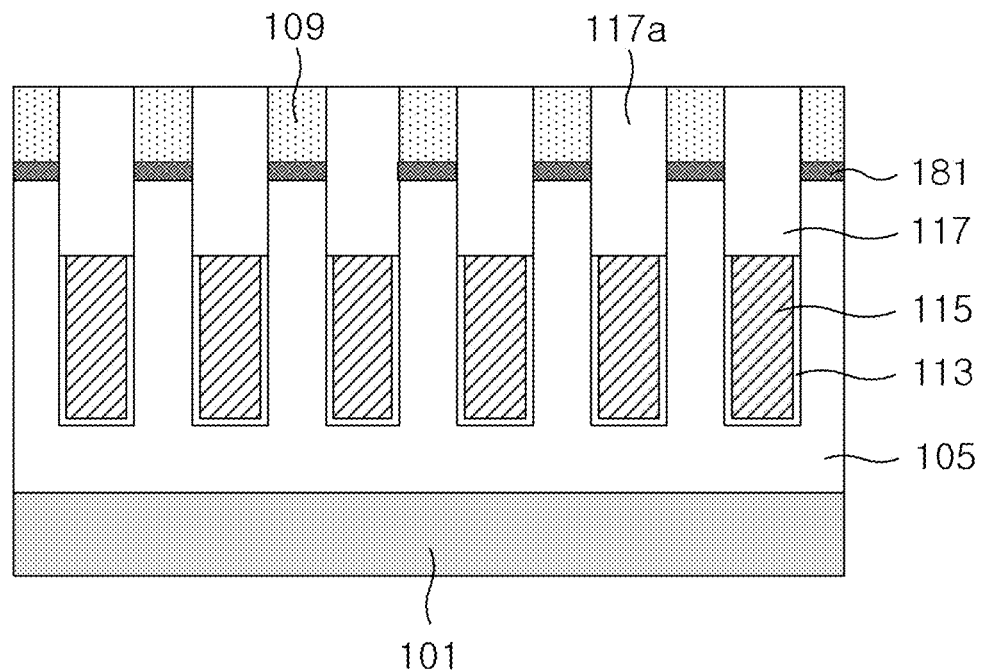
FIG. 33C is a cross-sectional view taken along the line C-C of FIG. 4A.

Referring to FIGS. 33A, 33B and 33C, the mask pattern 109, the word line capping layer 117, and the conductive layer 181 may be patterned to form the second groove 119. The second groove 119 may extend along the X-direction, as shown in FIG. 4A. Due to the formation of the second groove 119, not only the mask pattern 109 and the conductive layer 181 but also the upper portion 117a of the word line capping layer 117 protruding over the active region 102 may be separated into a plurality of portions. The active region 102 and the device isolation layer 105 may be over-etched during the formation of the second groove 119. As a result, a bottom surface of the second groove 119 may be lower than that of the conductive layer 181.

Figure 34A:
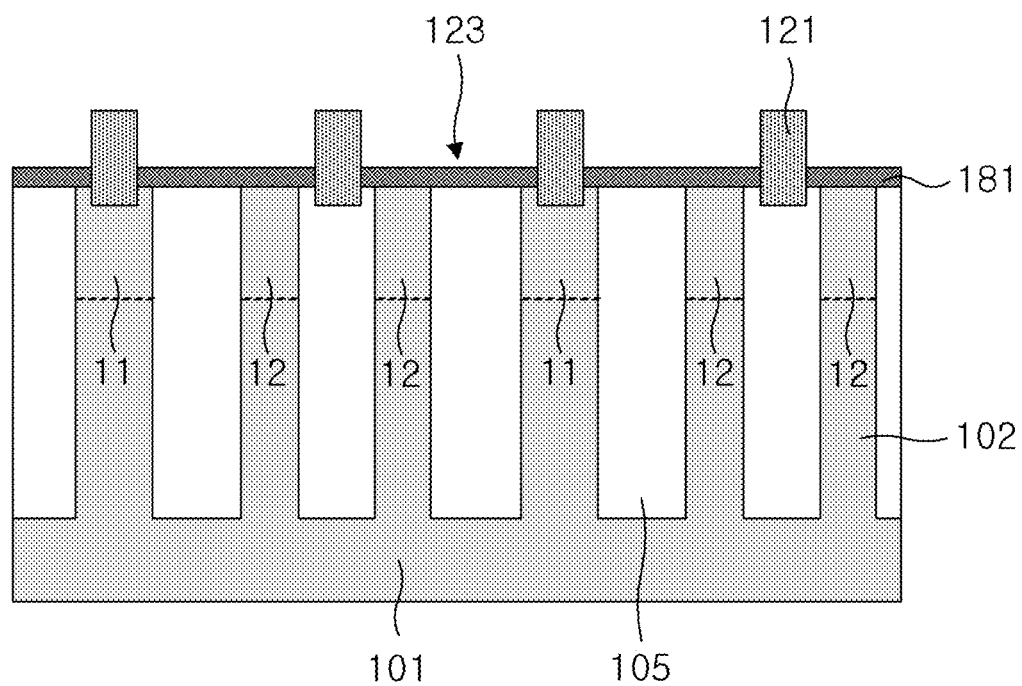
Figure 34B:
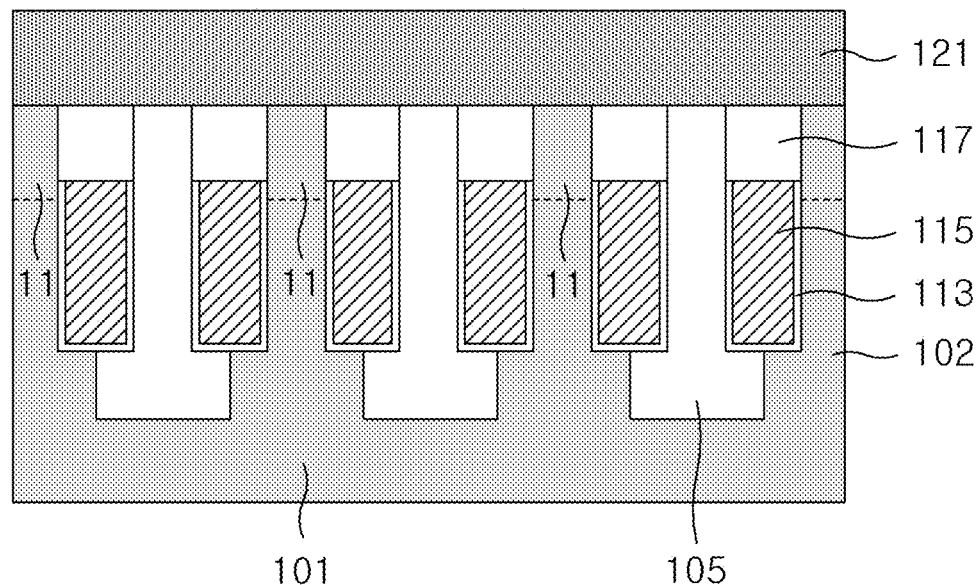
Figure 34C:
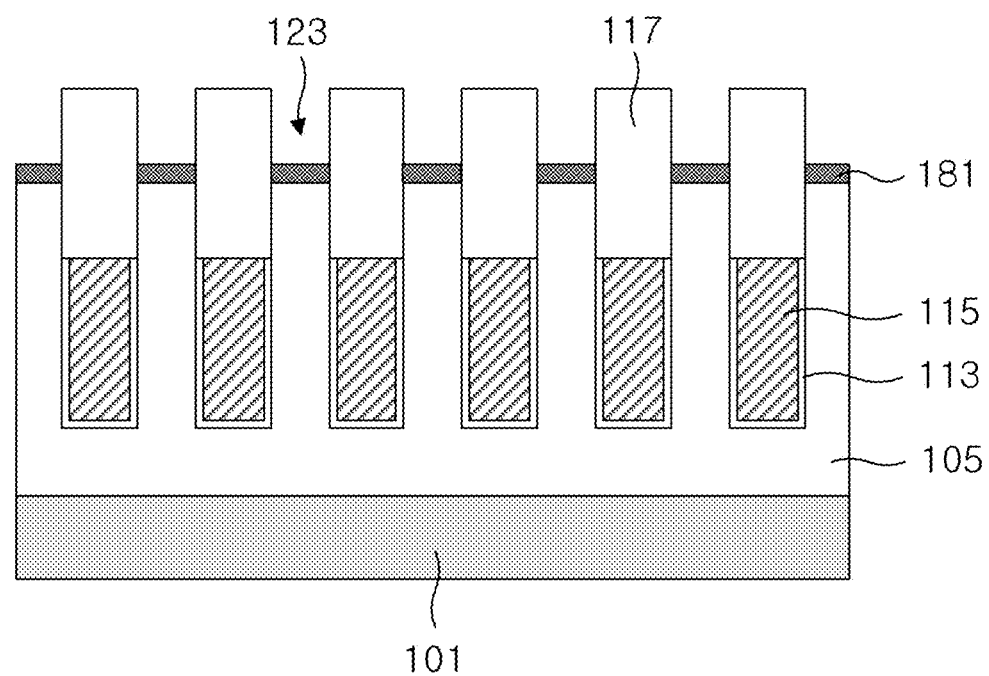
FIG. 34C is a cross-sectional view taken along the line C-C of FIG. 6A.

Referring to FIGS. 34A, 34B and 34C, the one or more separation walls or fences 121 may be formed by filling the second groove 119 with a silicon nitride layer, a silicon oxynitride layer, a silicon oxide layer, or combinations thereof, and the mask pattern 109 may be removed. As a result, as shown in FIG. 6A, the one or more separation walls or fences 121 may be formed to intersect with the upper portions 117a of the word line capping layer 117, thereby defining the lattice region 123 of rectangular or lattice shape. The one or more separation walls or fences 121 may have a height of about 50-1000 Å. The conductive layer 181 may form a bottom of the lattice region 123. The conductive layer 181 provided in the lattice region 123 may be overlapped with the second junction region 12 and the first junction region 11.

Figure 35A:
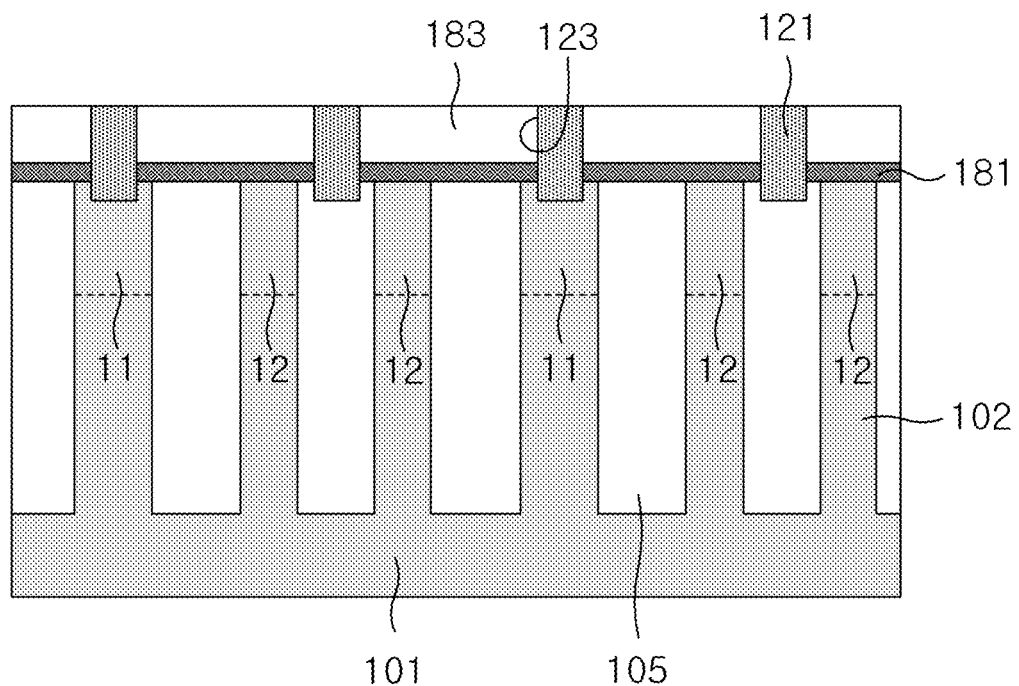
Figure 35B:
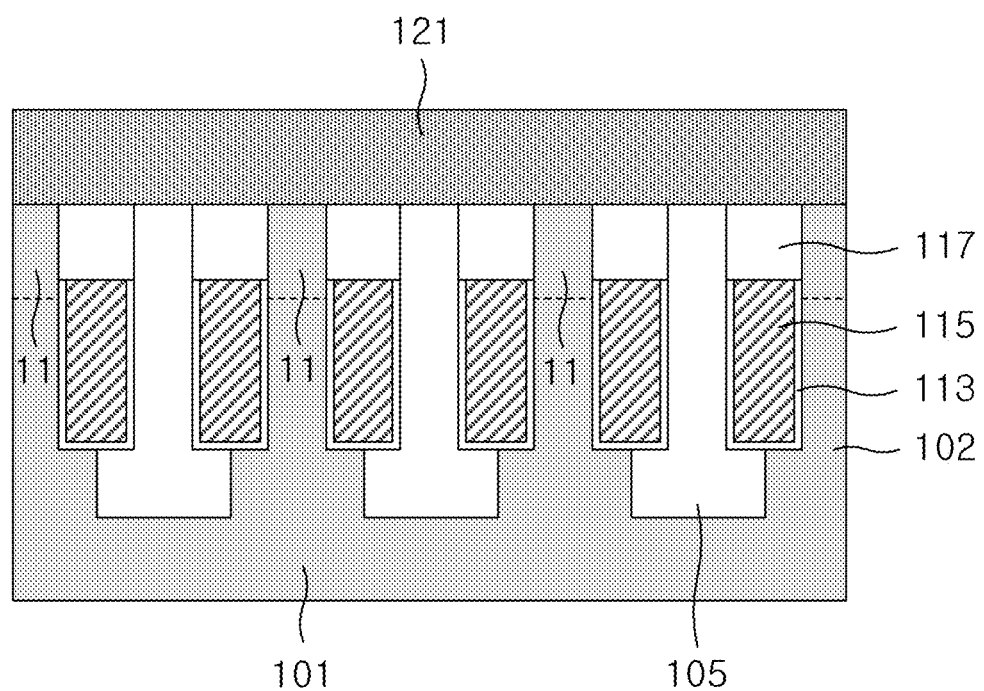

Referring to FIGS. 35A and 35B, an insulating gap-filling layer 183 may be formed by filling the lattice region 123 with an insulating material (e.g., an oxide layer or a nitride layer). For example, the formation of the insulating gap-filling layer 183 may include depositing an insulating layer such as a silicon oxide layer and planarizing the insulating layer.

Figure 36A:
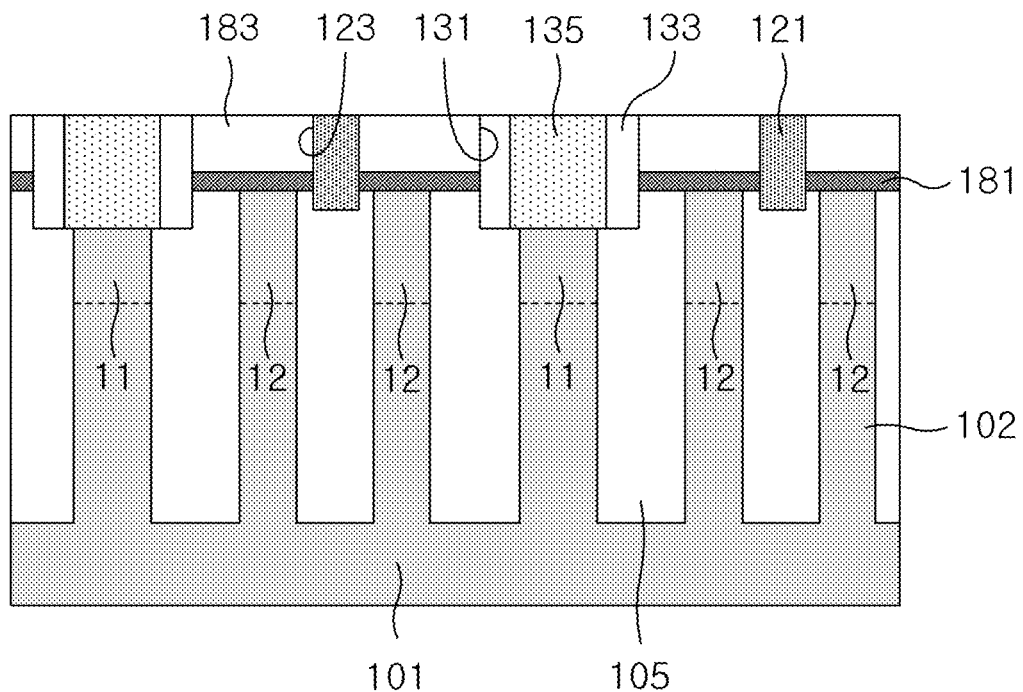
Figure 36B:
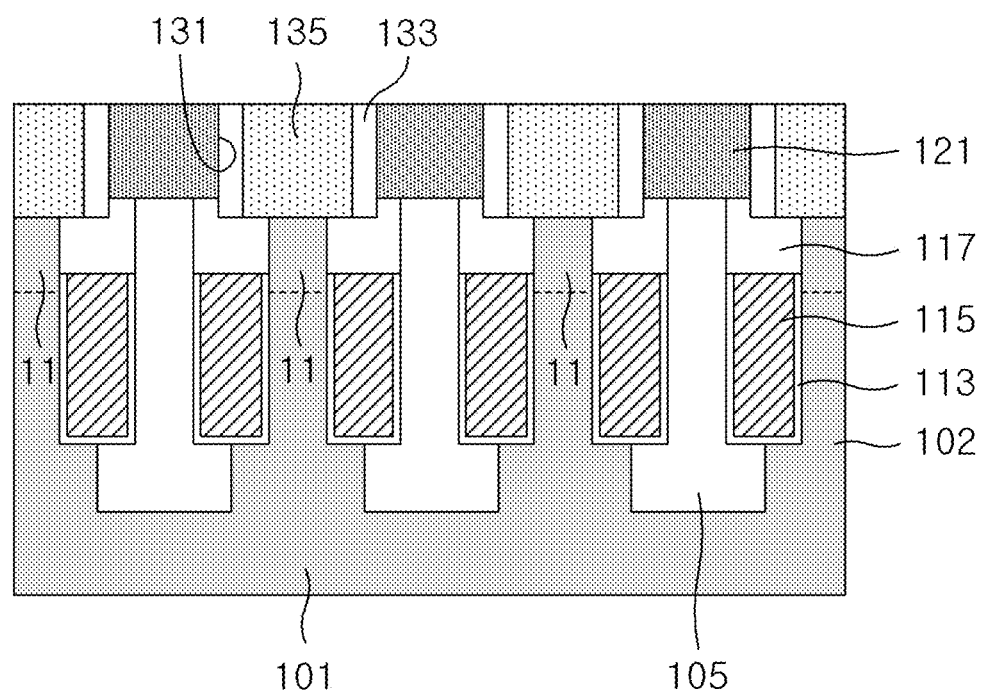

Referring to FIGS. 36A and 36B, the bit line contact hole 131 may be formed to expose the first junction region 11, and the insulating spacer 133 and the bit line contact 135 may be formed in the bit line contact hole 131. The bit line contact 135 may be in contact with the first junction region 11. The formation of the insulating spacer 133 may include depositing an insulating material (e.g., a silicon nitride layer) having an etch selectivity with respect to the insulating gap-filling layer 183 and anisotropically etching the deposited insulating material. A portion of the conductive layer 181 overlapped with the first junction region 11 may be removed during the formation of the bit line contact hole 131. According to the present embodiment, since the insulating gap-filling layer 183 is formed in the lattice region 123, there may be no necessity to form the first interlayer insulating layer 129 of FIG. 7B. In other example embodiments, before the formation of the bit line contact hole 131, a first interlayer insulating layer may be further formed to cover the insulating gap-filling layer 183.

Figure 37A:
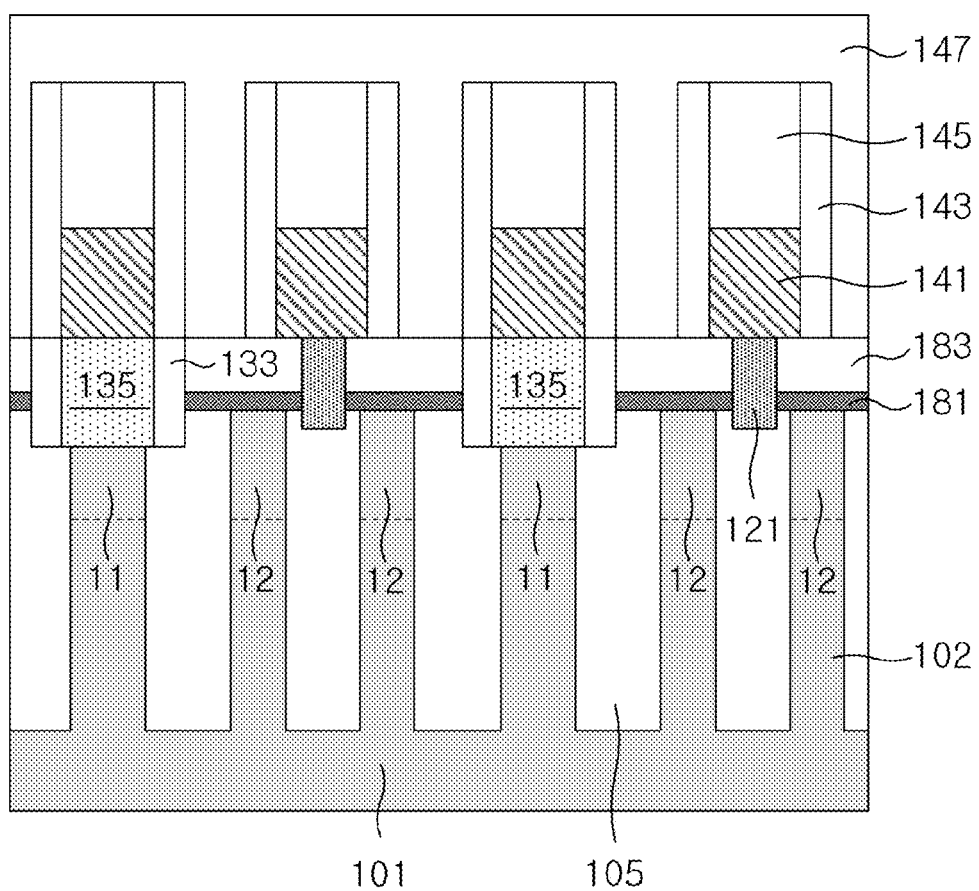
Figure 37B:
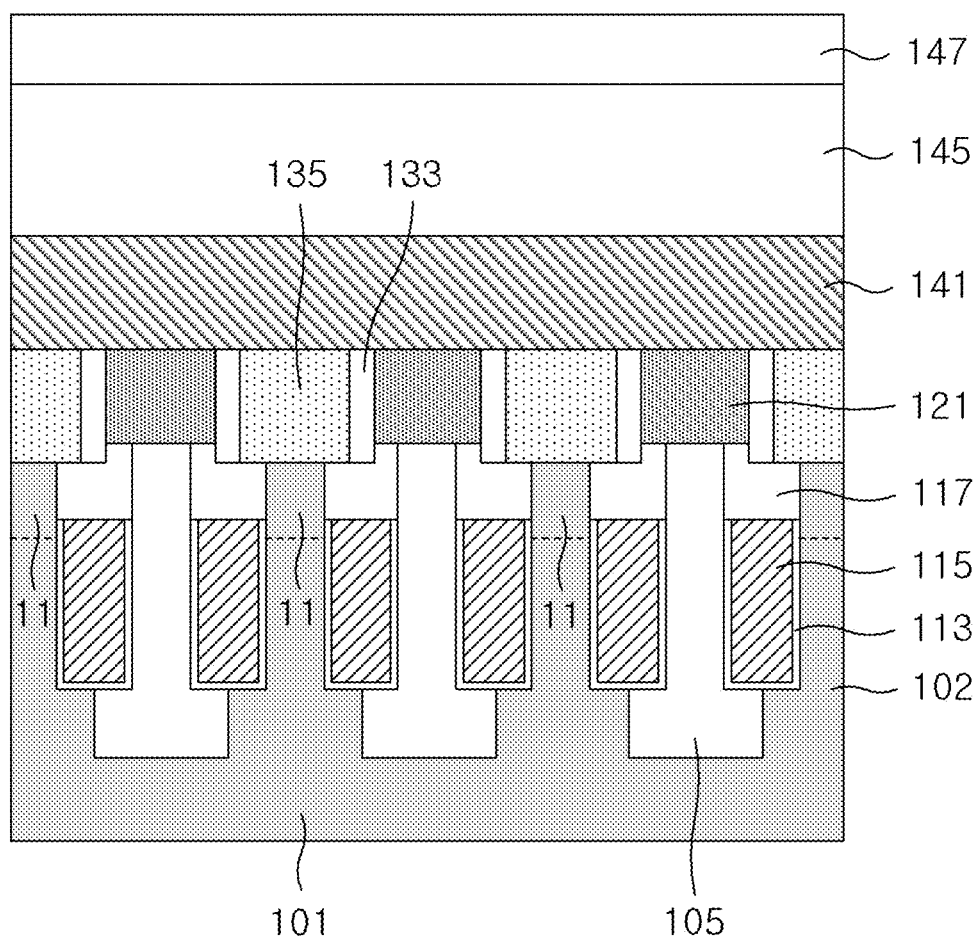

Referring to FIGS. 37A and 37B, the bit line 141 may be formed in contact with the bit line contact 135 and be surrounded by the bit line spacer 143 and the bit line capping layer 145, and thereafter, the second interlayer insulating layer 147 may be formed to cover the bit line 141. In example embodiments, the bit line spacer 143 and the bit line capping layer 145 may be formed of a silicon nitride layer, and the second interlayer insulating layer 147 may be formed of a silicon oxide layer.

Figure 38A:
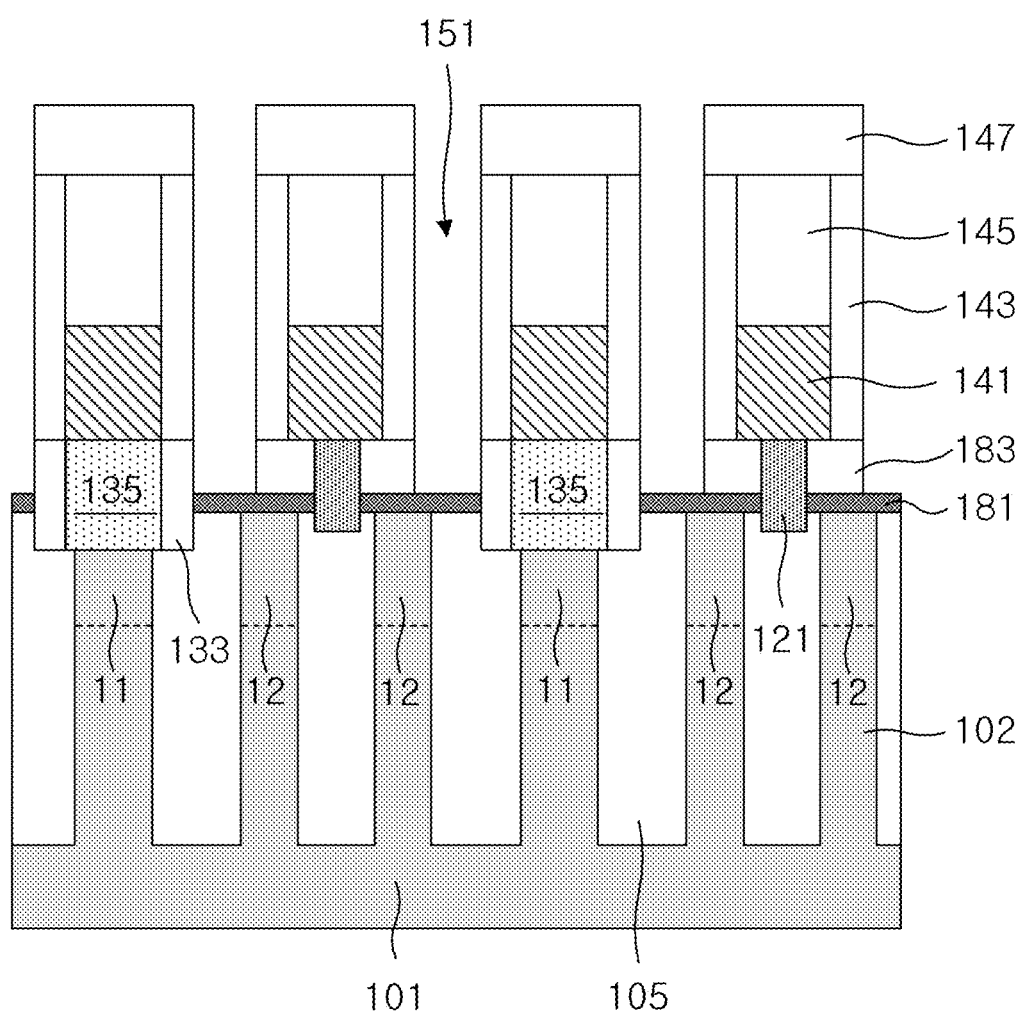
Figure 38B:
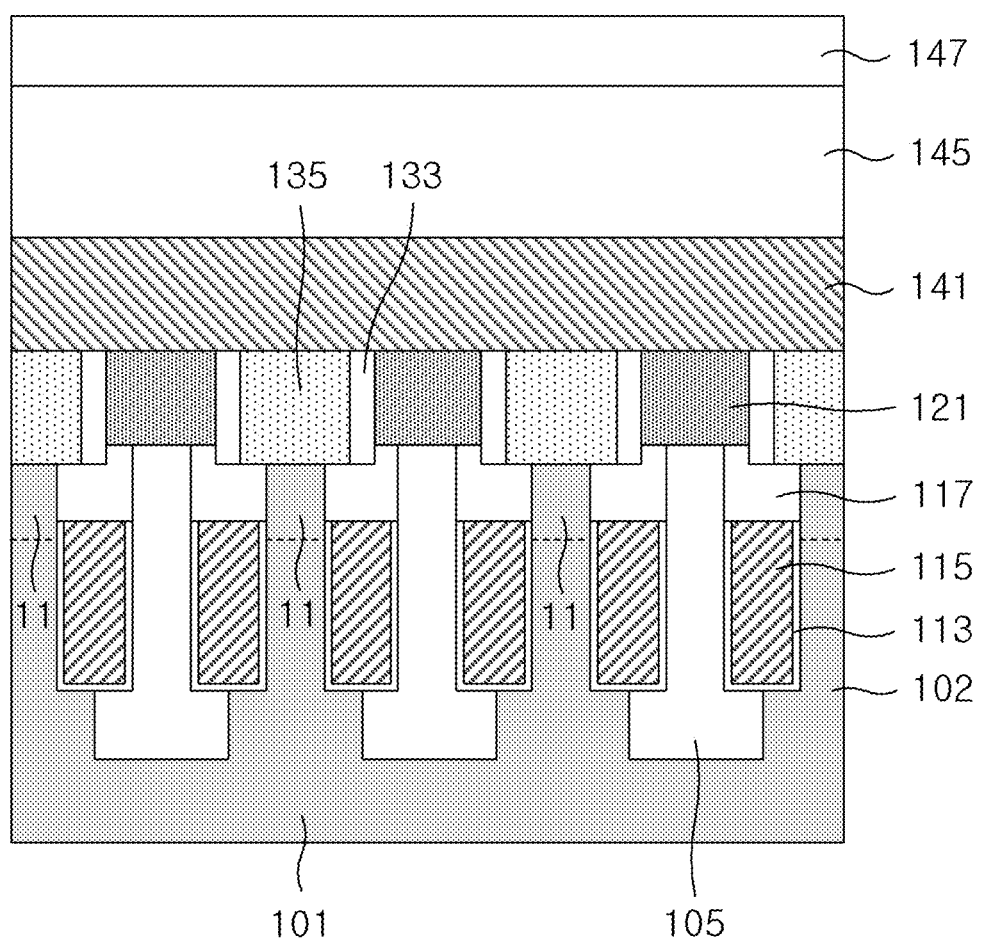

Referring to FIGS. 38A and 38B, the storage node contact hole 151 may be formed. For example, the second interlayer insulating layer 147 and the insulating gap-filling layer 183 may be patterned using a dry or wet etching process to form the storage node contact hole 151 exposing the conductive layer 181. The bit line spacer 143 and the bit line capping layer 145 may protect the bit line 141 from being damaged by the etching process. The conductive layer 181 may serve as an etch stop layer in the etching process for forming the storage node contact hole 151 and as a storage node contact pad being in contact with the second junction region 12. In example embodiments, a top surface of the conductive layer 181 may be lower than the top surface of the one or more separation walls or fences 121.

Figure 39A:
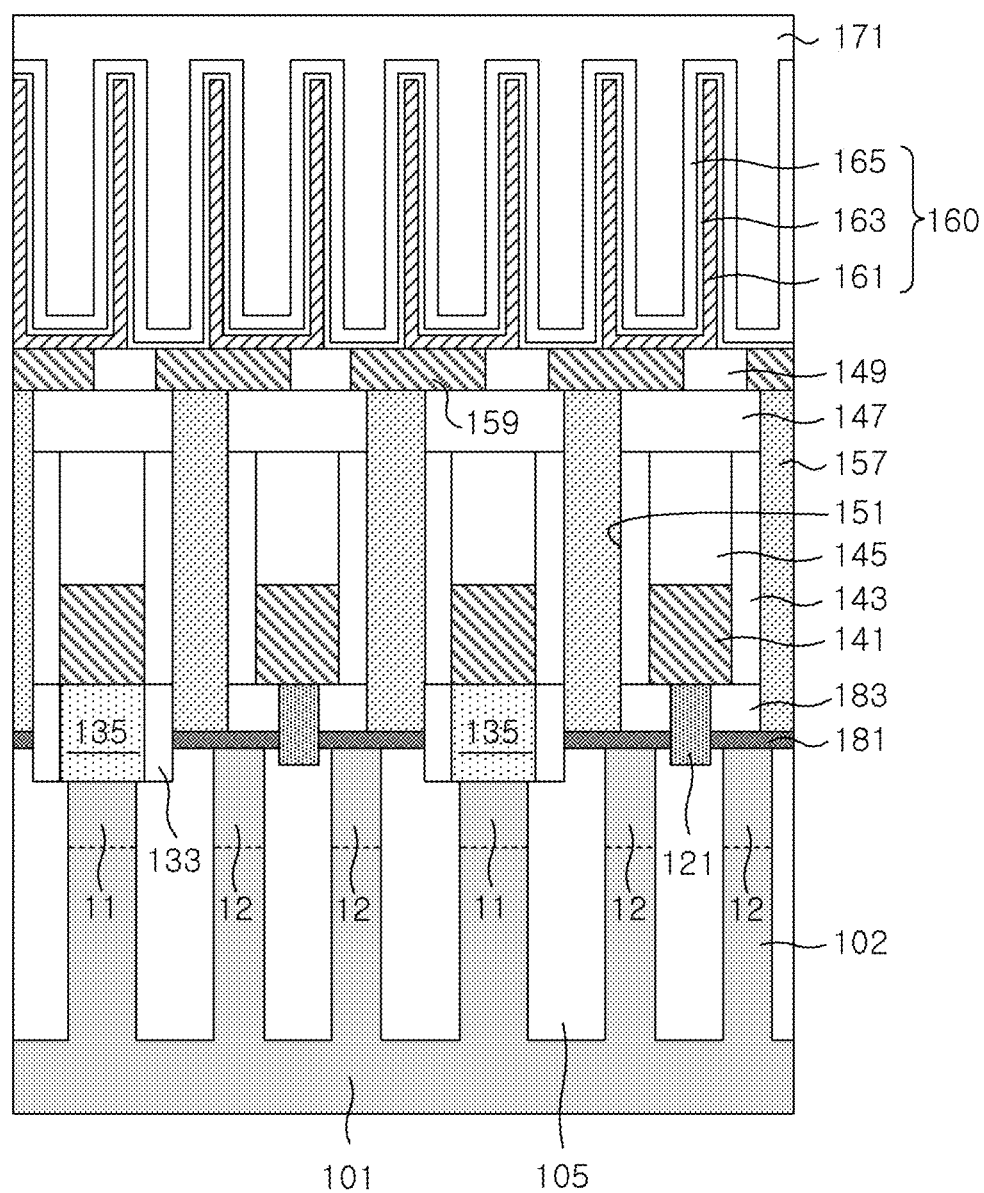
Figure 39B:
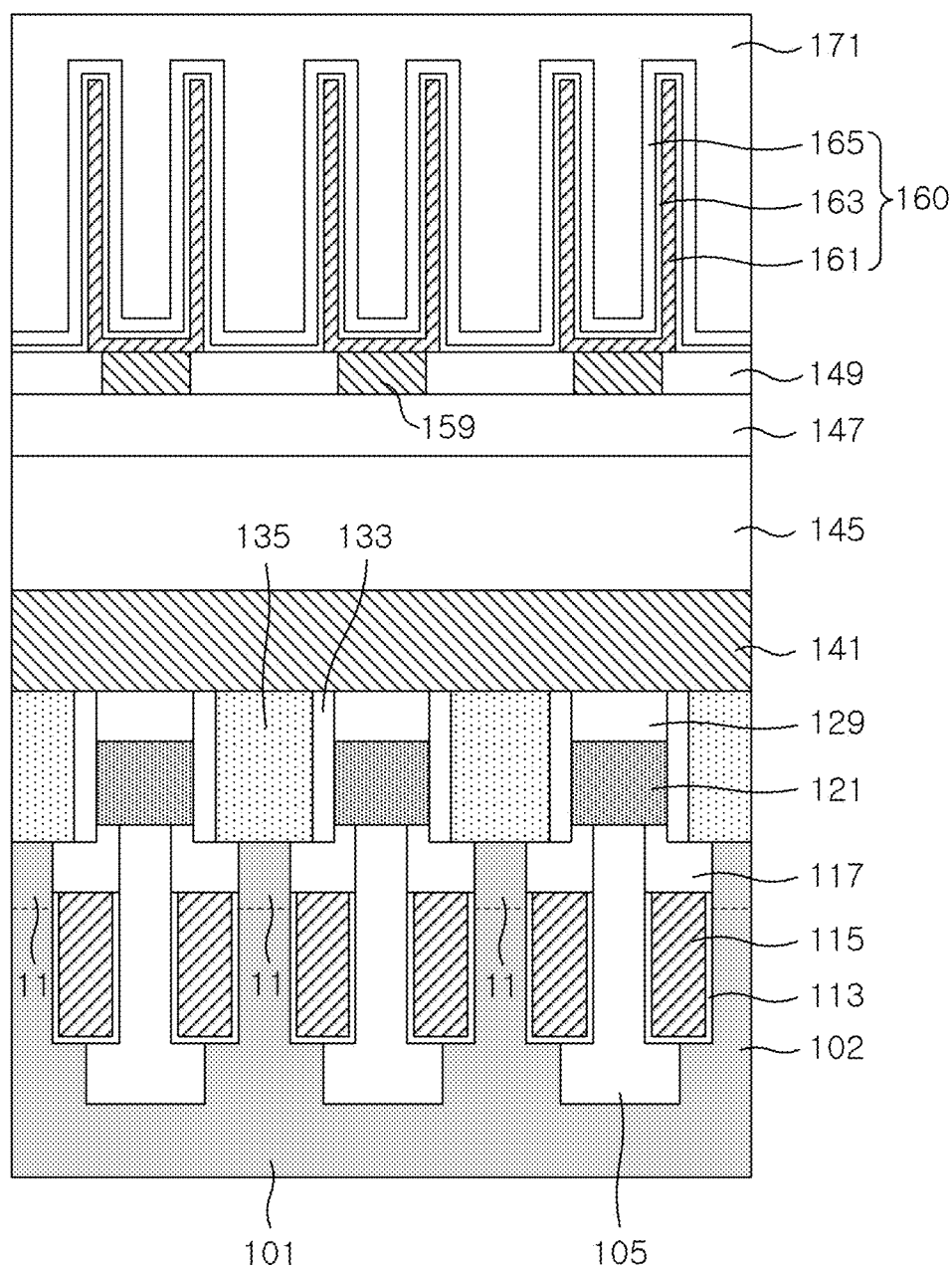

Referring to FIGS. 39A and 39B, the storage node contact hole 151 may be filled with a conductive material, thereby forming the storage node contact 157 connected to the conductive layer 181. Even if the storage node contact 157 has a small width and consequently a small overlap area with the second junction region 12, a contact area between the second junction region 12 and the conductive layer 181 may be greater than would be between the storage node contact 157 and the second junction region 12. This may mean that the conductive layer 181 can help reduce a contact resistance between the storage node contact 157 and the second junction region 12, even when an overlap area between the storage node contact 157 and the second junction region 12 is small. According to the present embodiment, the storage node contact 157 may be jointed with the conductive layer 181 and be used as a single storage node contact. Thereafter, the landing pad 159 may be formed to be in contact with the storage node contact 157, the third interlayer insulating layer 149 may be formed to electrically isolate the landing pads 159 from each other, and then, the capacitor 160 may be formed to include the capacitor lower electrode 161, the capacitor dielectric 163, and the capacitor upper electrode 165. The fourth interlayer insulating layer 171 may be formed to cover the capacitor 160, thereby forming a semiconductor device 6. In other example embodiments, the semiconductor device 6 may be formed not to include the landing pad 159. At least one of the bit lines 141 may be misaligned to the bit line contact 135 as shown in FIG. 22B.

[Even Further Example Embodiments]

Figure 40:
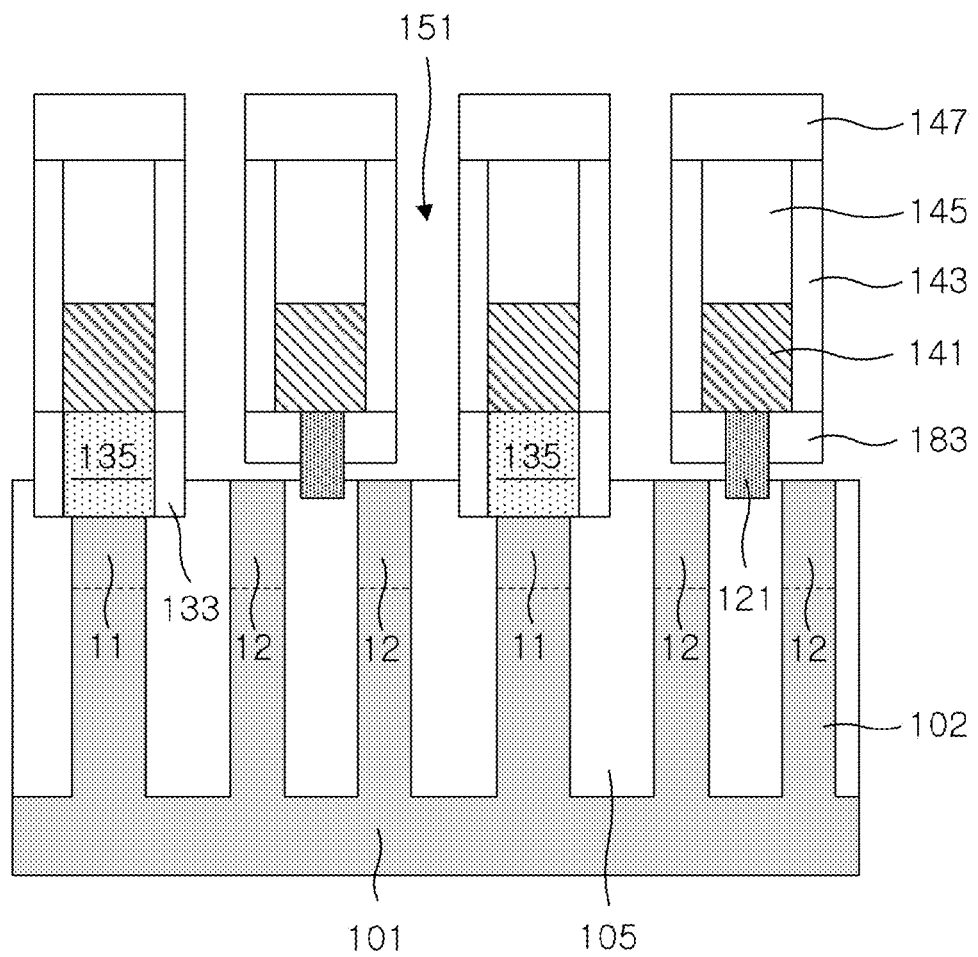
FIGS. 40 and 41 illustrate a method of fabricating a semiconductor device according to even further example embodiments of the inventive concept and are cross-sectional views taken along the line A-A of FIG. 15A.
Figure 41:
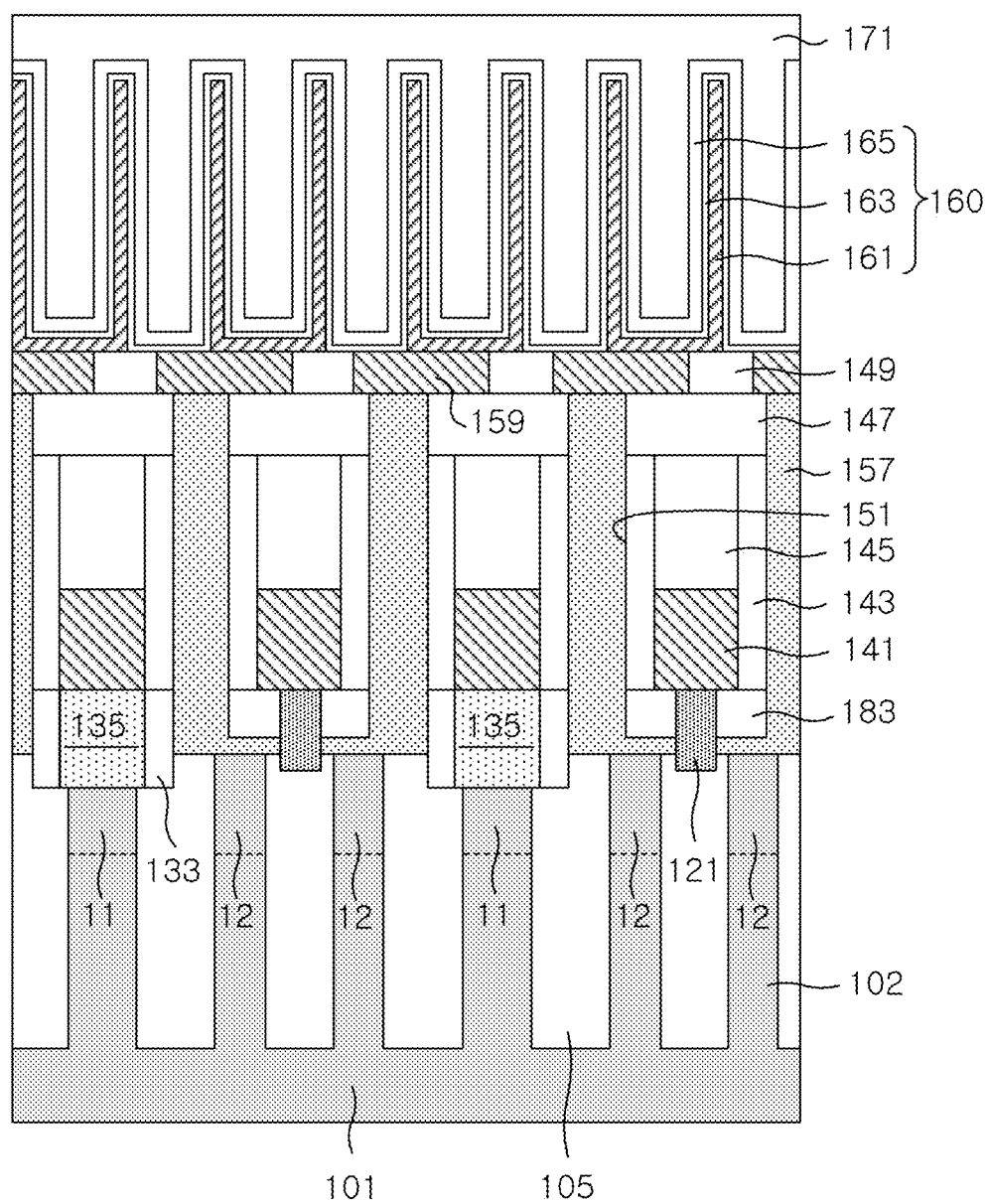

FIGS. 40 and 41 illustrate a method of fabricating a semiconductor device according to even further example embodiments of the inventive concept and are cross-sectional views taken along line A-A of FIG. 15A. In the present embodiments, cross-sectional views corresponding to FIGS. 40 and 41 (e.g., taken along the line B-B of FIG. 15A) may be identical with those of the example embodiments and thus will be omitted.

Referring to FIG. 40, the conductive layer 181 may be removed after the formation of the storage node contact hole 151. For example, a cleaning process may be performed to remove the conductive layer 181, before the formation of the storage node contact 157 of FIG. 41. Accordingly, the storage node contact hole 151 may be expanded to expose the second junction region 12.

Referring to FIG. 41, the storage node contact hole 151 may be filled with a conductive material, thereby forming the storage node contact 157 being in contact with the second junction region 12. Some of the storage node contacts 157 may be formed to have a lower portion that is wider than an upper portion thereof. The other storage node contacts 157 may partially overlap with the second junction region 12 between adjacent ones of the bit lines 141 or be shaped to have a bent or non-linear structure allowing an overlap with the second junction region 12. Thereafter, the landing pad 159 may be formed to be in contact with the storage node contact 157, the third interlayer insulating layer 149 may be formed to electrically isolate the landing pads 159 from each other, the capacitor 160 may be formed to include the capacitor lower electrode 161, the capacitor dielectric 163, and the capacitor upper electrode 165, and the fourth interlayer insulating layer 171 may be formed to cover the capacitor 160, thereby forming a semiconductor device 7. In other example embodiments, the semiconductor device 7 may be formed not to include the landing pad 159. At least one of the bit lines 141 may be misaligned with the bit line contact 135. Although not shown, a horizontally extending portion of the storage node contact 157 may be positioned at a level lower than that of the one or more separation walls or fences 121.

[Yet Further Example Embodiments]

Figure 42:
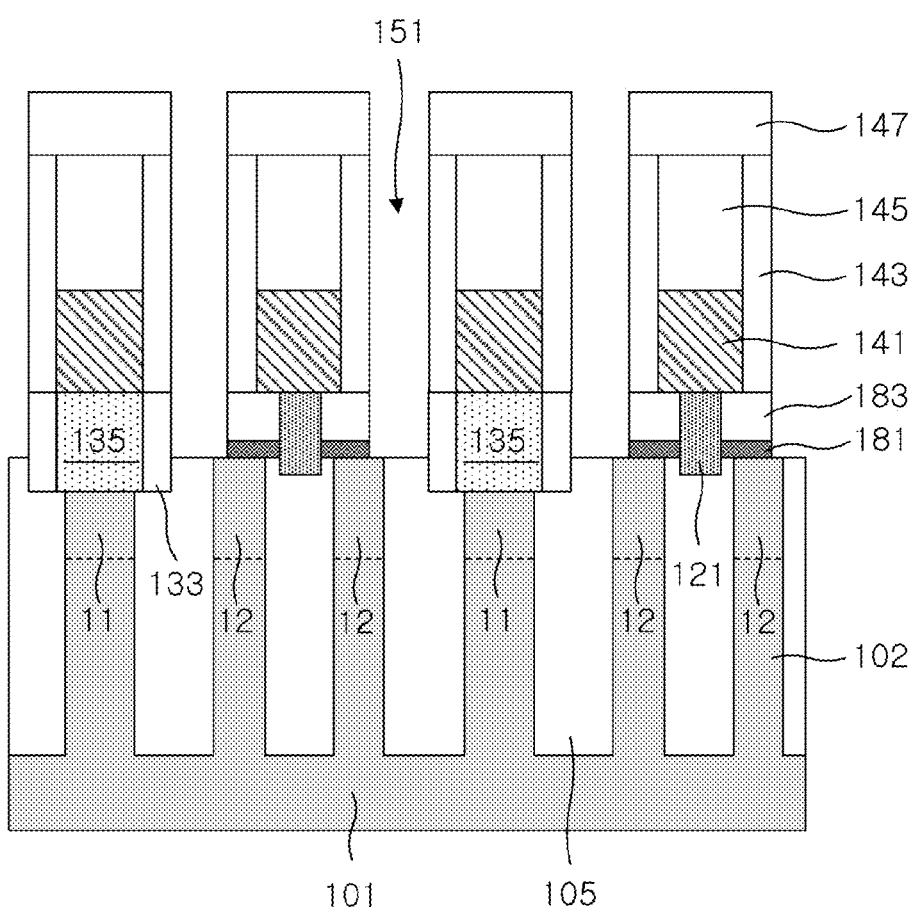
FIGS. 42 and 43 illustrate a method of fabricating a semiconductor device according to yet further example embodiments of the inventive concept and are cross-sectional views taken along the line A-A of FIG. 15A.
Figure 43:
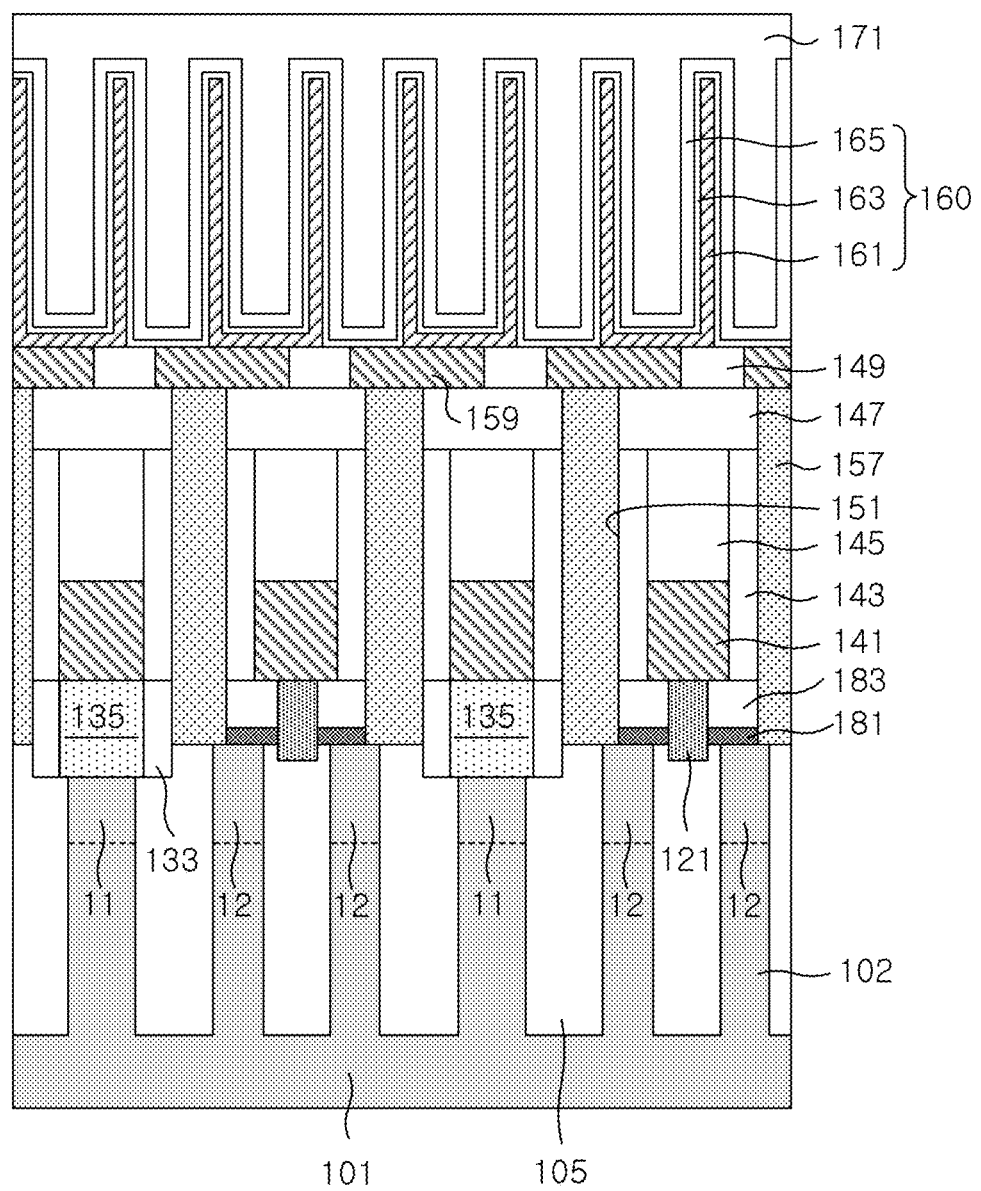

FIGS. 42 and 43 illustrate a method of fabricating a semiconductor device according to yet further example embodiments of the inventive concept and are cross-sectional views taken along line A-A of FIG. 15A. In the present embodiment, cross-sectional views corresponding to FIGS. 42 and 43 (e.g., taken along line B-B of FIG. 15A) may be identical with those of the example embodiments and thus will be omitted.

Referring to FIG. 42, similar to the embodiments described with reference to FIG. 38A, the conductive layer 181 may be partially removed after the formation of the storage node contact hole 151 exposing the conductive layer 181. For example, a dry etching process may be performed to selectively remove a portion of the conductive layer 181 exposed by the storage node contact hole 151. Other portions of the conductive layer 181 overlapped with (and below) the insulating gap-filling layer 183 may remain after the dry etching process.

Referring to FIG. 43, the storage node contact 157 may be formed to fill the storage node contact hole 151. Thus, the storage node contact 157 may extend to the top surface of the device isolation layer and to the top surface of the second junction region 12 to be coupled to a remaining portion of the conductive layer 181. In addition the landing pad 159 may be formed to be in contact with the storage node contact 157, the third interlayer insulating layer 149 may be formed to electrically isolate the landing pads 159 from each other, the capacitor 160 may be formed to be electrically connected to the storage node contact 157 via the landing pad 159, and the fourth interlayer insulating layer 171 may be formed, thereby forming a semiconductor device 8. According to the present embodiment, even if the storage node contact 157 has a small contact area with the second junction region 12, it may be possible to increase a contact area between the conductive layer 181 and the second junction region 12, due to the presence of the remaining portion of the conductive layer 181. In other example embodiments, the semiconductor device 8 may be formed not to include the landing pad 159. At least one of the bit lines 141 may be misaligned with the bit line contact 135 as shown in FIG. 22B. The top surface of the conductive layer 181 may be formed at a level lower than that of the one or more separation walls or fences 121.

In the present application, in some instances, "the separation wall or fence" has been described in connection with bit line contact spacers. However, the separation wall or fence may mean any suitable insulating structure extending between adjacent word line capping layers to define a storage node contact hole with the word line capping layers and help isolate adjacent storage node contacts.

[Applications of Embodiments]

Figure 44A:
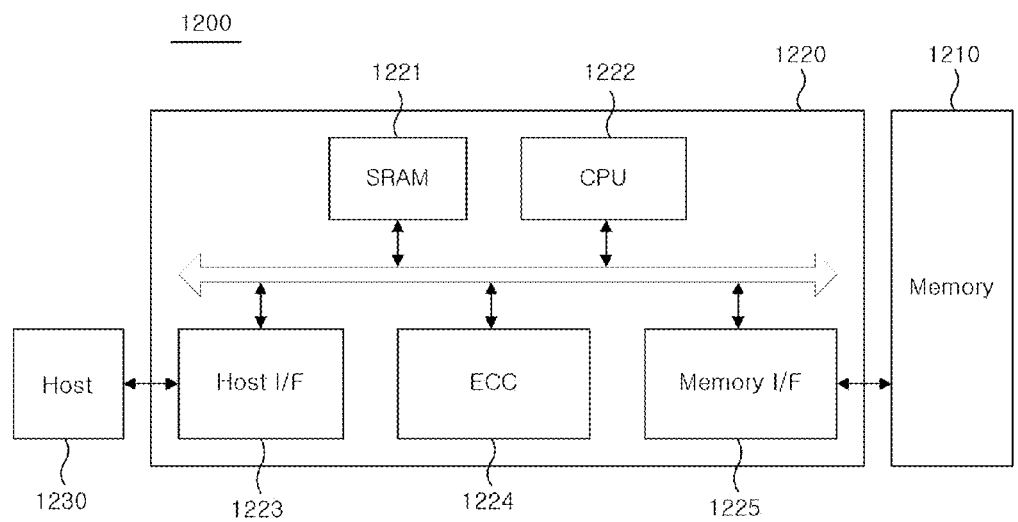
FIG. 44A is a block diagram of a memory card including a semiconductor device according to example embodiments of the inventive concept.
Figure 44B:
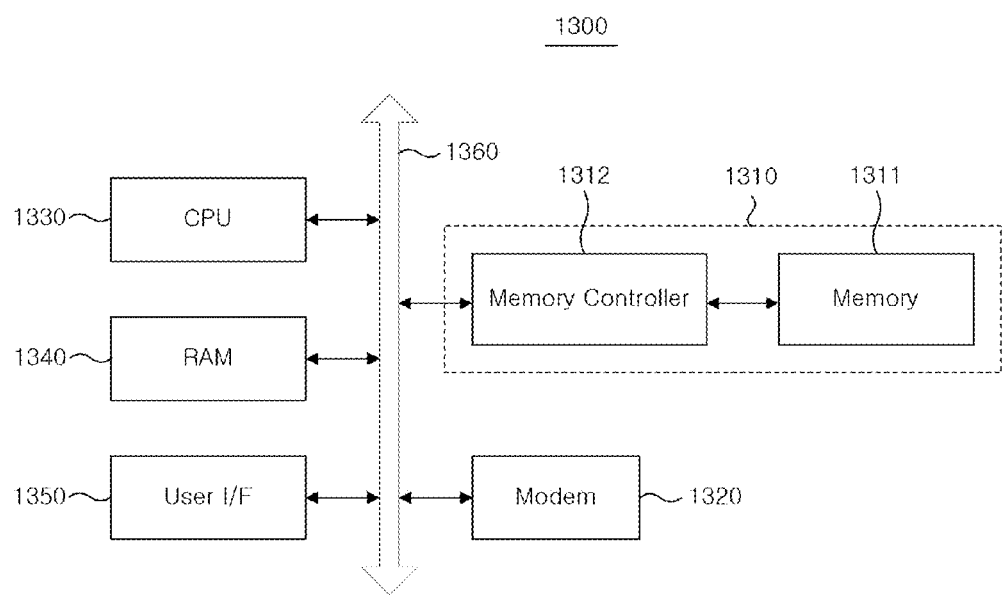
FIG. 44B is a block diagram of an information processing system including a semiconductor device according to example embodiments of the inventive concept.

FIG. 44A is a block diagram of a memory card including a semiconductor device according to example embodiments of the inventive concept. FIG. 44B is a block diagram of an information processing system including a semiconductor device according to example embodiments of the inventive concept.

Referring to FIG. 44A, a memory card 1200 may include a memory controller 1220 controlling general data exchanges between a host and a memory device 1210. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processing unit 1222 may perform general control operations for data exchange of the memory controller 1220. The memory device 1210 may include at least one of the semiconductor devices 1 to 8 according to example embodiments of the inventive concept.

Referring to FIG. 44B, information processing system 1300 may be realized using a memory system 1310 including at least one of the semiconductor devices 1 to 8 according to example embodiments of the inventive concept. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 44A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concept.

According to example embodiments of the inventive concept, it is possible to increase a contact area between a contact and an active region. As a result, a contact resistance between the contact and the active region can be reduced and electric characteristics of a device can be improved. In addition, the active region can be protected against an etch damage in an etching process for forming a storage node contact hole, and this enables to improve a gate-induced-drain-leakage property, which may be caused by a recess of the active region. Furthermore, even if a bit line is misaligned, the contact can be formed to have an increased contact area with the active region, and this enables to reduce a process failure and increase a production yield of devices.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While example embodiments of the inventive concepts have been particularly shown and described, it will be understood by one of ordinary skill in the art that variations in form and detail may be made therein without departing from the spirit and scope of the attached claims.

The invention claimed is:

1. A semiconductor device comprising:
    a device isolation layer formed in a semiconductor substrate, the device isolation layer defining active regions each including a first junction region and a second junction region,
    at least two adjacent word lines buried in the semiconductor substrate, the at least two adjacent word lines each having a word line capping layer formed thereon and extending above the active regions;
    a plurality of bit lines extending across the at least two adjacent word lines;
    first contacts electrically interconnecting the first junction region and a corresponding one of the plurality of bit lines;
    second contacts, at least one of which is electrically coupled to a corresponding one of the second junction regions; and
    a separation wall extending between at least two adjacent word line capping layers, the separation wall having a width less than a width of a corresponding bit line and located between adjacent second contacts, between adjacent first contacts, isolated from the adjacent first contacts, and under the corresponding bit line in plan view,
    wherein a portion of at least one of the second contacts is disposed between sidewalls of adjacent word line capping layers.

2. The device of claim 1, wherein at least one of the second contacts includes an upper portion and a lower portion, which are formed as a single integral body.

3. The device of claim 2, wherein the device isolation layer has a top surface located lower than a top surface of the second junction region.

4. The device of claim 2, wherein an area of the lower portion of the at least one of the second contacts overlapping with respect to the second junction region is greater than an area of the upper portion of the at least one of the second contacts overlapping with respect to the second junction region.

5. The device of claim 1, wherein the device isolation layer has a top surface substantially planar with a top surface of the second junction region.

6. The device of claim 1, wherein the separation wall extends along a direction crosswise of a direction of the at least two adjacent word lines.

7. The device of claim 1, wherein the separation wall extends substantially parallel to a direction of the plurality of bit lines.

8. The device of claim 1, wherein a material that forms the word line capping layer is substantially the same as a material that forms the separation wall.

9. The device of claim 1, wherein the separation wall has a substantially line shape in plan view.

10. A semiconductor device comprising:
a device isolation layer formed in a semiconductor substrate, the device isolation layer defining an active region including a first junction region and a second junction region;
a plurality of word lines buried in the semiconductor substrate, the plurality of word lines each having a word line capping layer formed thereon and extending above the active region;
a plurality of bit lines extending across the plurality of word lines;
a first contact electrically interconnecting the first junction region and a corresponding one of the plurality of bit lines; and
a second contact electrically coupled to the second junction region,
wherein the second contact includes an upper portion and a lower portion, which are formed as a single integral body, and
wherein the lower portion of the second contact is disposed within a space confined by sidewalls of adjacent word line capping layers and sidewalls of adjacent separation walls extending between the adjacent word line capping layers, at least one of the separation walls having a width less than a width of a corresponding bit line and located isolated from the first contact and under the corresponding bit line in plan view.

11. The semiconductor device of claim 10, wherein one of the adjacent separation walls is a contact spacer disposed adjacent a sidewall of the first contact.

12. The semiconductor device of claim 11, wherein a height of the contact spacer is higher than a height of the adjacent separation walls.

13. The semiconductor device of claim 10, wherein one of the sidewalls of the adjacent separation walls has a flat surface and another sidewall has a curved surface.

14. A semiconductor device comprising:
a device isolation layer formed in a semiconductor substrate, the device isolation layer defining an active region including a first junction region and a second junction region;
a plurality of word lines extending under a top surface of the semiconductor substrate, the plurality of word lines each having a word line capping layer formed thereon, the word line capping layers protruding above the active region;
a plurality of bit lines extending across the plurality of word lines;
an interlayer insulating layer disposed over the plurality of bit lines;
a first contact electrically interconnecting the first junction region and a corresponding one of the plurality of bit lines, the first contact disposed in a first contact hole defined in the interlayer insulating layer; and
a second contact electrically coupled to the second junction region, the second contact disposed in a second contact hole defined in the interlayer insulating layer,
wherein a lower portion of the second contact hole is confined by sidewalls of adjacent word line capping layers, by a sidewall of a separation wall extending between the adjacent word line capping layers and by a sidewall of a contact spacer disposed on a sidewall of the first contact hole, the separation wall having a width less than a width of a corresponding bit line and located isolated from the first contact and under the corresponding bit line in plan view, and
wherein the second contact includes an upper portion and a lower portion, which are formed as a single integral body.

15. The device of claim 14, wherein a bottom surface of the second contact hole is substantially flat.

16. The device of claim 15, wherein the bottom surface of the second contact hole is formed without a step.

17. The device of claim 14, wherein a central vertical axis of the lower portion of the second contact is aligned with a central vertical axis of the upper portion of the second contact.

18. The device of claim 14, wherein a central vertical axis of the lower portion of the second contact is offset from a central vertical axis of the upper portion of the second contact.

19. The device of claim 14, wherein a top surface of the second junction region in contact with the second contact is substantially coplanar with a top surface of the device isolation layer underneath the separation wall.

20. The device of claim 14, wherein a bottom of the separation wall is higher than a bottom of the contact spacer.

21. The device of claim 14, wherein a height of the contact spacer is higher than a height of the separation wall.

22. The device of claim 14, wherein at least one of the plurality of bit lines has a central vertical axis offset from a central vertical axis of the first contact.

23. The device of claim 14, further comprising a capacitor electrically coupled to the second contact.

24. The device of claim 23, wherein the capacitor includes a capacitor lower electrode coupled to a top surface of the second contact through a landing pad.

25. The device of claim 24, wherein a central vertical axis of the landing pad is offset from a central vertical axis of the upper portion of the second contact.

26. The device of claim 25, wherein the capacitor includes a capacitor lower electrode directly coupled to a top surface of the second contact without a landing pad.

27. The device of claim 25, wherein at least one of the plurality of bit lines has a central vertical axis offset from a central vertical axis of the first contact.

28. The device of claim 14, wherein the separation wall comprises a material having an etch selectivity with respect to the interlayer insulating layer.

29. The device of claim 28, wherein the material is selected from the group consisting of silicon nitride, silicon oxynitride, silicon oxide and combinations thereof.

30. The device of claim 14, wherein the second contact hole is offset from the second junction region.

31. The device of claim 14, wherein the second contact has a non-linear vertical profile.

32. The device of claim 31, wherein the upper portion of the second contact extends substantially vertically from the top surface of the substrate, and wherein the lower portion of the second contact extends substantially horizontally along the top surface of the substrate.

33. The device of claim 1, wherein each of the second contacts has a substantially flat bottom surface.

34. The device of claim 10, wherein the second contact has a substantially flat bottom surface.

* * * * *